US 12,225,781 B2

(12) United States Patent
Feng et al.

(10) Patent No.: US 12,225,781 B2
(45) Date of Patent: Feb. 11, 2025

(54) ARRAY SUBSTRATE AND DISPLAY APPARATUS

(71) Applicant: BOE Technology Group Co., Ltd., Beijing (CN)

(72) Inventors: Yu Feng, Beijing (CN); Libin Liu, Beijing (CN); Jiangnan Lu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/788,605

(22) PCT Filed: Aug. 30, 2021

(86) PCT No.: PCT/CN2021/115249
§ 371 (c)(1),
(2) Date: Jun. 23, 2022

(87) PCT Pub. No.: WO2022/188374
PCT Pub. Date: Sep. 15, 2022

(65) Prior Publication Data
US 2024/0215344 A1 Jun. 27, 2024

(30) Foreign Application Priority Data
Mar. 11, 2021 (WO) ................ PCT/CN2021/080326

(51) Int. Cl.
G09G 3/3233 (2016.01)
G09G 3/32 (2016.01)
(Continued)

(52) U.S. Cl.
CPC ............. *H10K 59/124* (2023.02); *G09G 3/32* (2013.01); *G09G 3/3233* (2013.01);
(Continued)

(58) Field of Classification Search
None
See application file for complete search history.

(56) References Cited

U.S. PATENT DOCUMENTS 9,276,120 B2    3/2016  Morosawa et al.
10,297,620 B2   5/2019  Chen et al.
(Continued)

FOREIGN PATENT DOCUMENTS

CN    205722744 U    11/2016
CN    108493198 A    9/2018
(Continued)

OTHER PUBLICATIONS

International Search Report & Written Opinion mailed Nov. 25, 2021, regarding PCT/CN2021/115249.
(Continued)

*Primary Examiner* — Brian M Butcher
(74) *Attorney, Agent, or Firm* — Intellectual Valley Law, P.C.

(57) ABSTRACT

An array substrate is provided. A respective pixel driving circuit of the array substrate includes a driving transistor, a storage capacitor, and a transistor having a gate electrode connected to a respective second gate line of a plurality of second gate lines, a first electrode connected to a first capacitor electrode of the storage capacitor, and a second electrode connected to a second electrode of a first reset transistor, the transistor being configured to receive a reset signal through the first reset transistor. An active layer of the driving transistor and an active layer of the transistor are spaced apart from each other by at least an insulating layer. The active layer of the driving transistor comprises a first semiconductor material. The active layer of the transistor comprises a second semiconductor material different from the first semiconductor material.

18 Claims, 55 Drawing Sheets

(51) Int. Cl.
  *H10K 59/124* (2023.01)
  *H10K 59/131* (2023.01)

(52) U.S. Cl.
  CPC ... *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2320/0247* (2013.01)

(56) References Cited

U.S. PATENT DOCUMENTS

| | | |
|---|---|---|
| 2010/0193772 A1 | 8/2010 | Morosawa et al. |
| 2017/0162608 A1 | 6/2017 | Yamazaki et al. |
| 2018/0190730 A1 | 7/2018 | Cho et al. |
| 2018/0268757 A1 | 9/2018 | Chen et al. |
| 2019/0172888 A1* | 6/2019 | Choi .................. H10K 50/818 |
| 2019/0189720 A1 | 6/2019 | Lim et al. |
| 2020/0043963 A1 | 2/2020 | Bu et al. |
| 2020/0075704 A1 | 3/2020 | Liu et al. |
| 2020/0161402 A1 | 5/2020 | Wang et al. |
| 2021/0050469 A1 | 2/2021 | Zhou et al. |
| 2021/0408190 A1 | 12/2021 | Yang |
| 2022/0140043 A1 | 5/2022 | Cao et al. |
| 2022/0157238 A1 | 5/2022 | Wang et al. |

FOREIGN PATENT DOCUMENTS

| | | |
|---|---|---|
| CN | 109148489 A | 1/2019 |
| CN | 110444553 A | 11/2019 |
| CN | 110690265 A | 1/2020 |
| CN | 111640777 A | 9/2020 |
| CN | 111724745 A | 9/2020 |
| CN | 112289813 A | 1/2021 |
| CN | 112289841 A | 1/2021 |
| CN | 112397025 A | 2/2021 |
| WO | 2020209535 A1 | 10/2020 |

OTHER PUBLICATIONS

International Search Report & Written Opinion mailed Nov. 26, 2021, regarding PCT/CN2021/080326.
First Office Action in the Indian Patent Application No. 202217068119, dated Mar. 19, 2024.
Extended European Search Report in the European Patent Application No. 21929594.6, dated Jul. 19, 2023.
First Office Action in the U.S. Appl. No. 17/630,908, dated Aug. 21, 2023.

* cited by examiner

Vint1

GLN_B2

Vint1(n+1)

ARRAY SUBSTRATE AND DISPLAY APPARATUS

CROSS-REFERENCE TO RELATED APPLICATION

This application is a national stage application under 35 U.S.C. § 371 of International Application No. PCT/CN2021/115249, filed Aug. 30, 2021, which is a continuation-in-part of International Application No. PCT/CN2021/080326, filed Mar. 11, 2021. Each of the forgoing applications is herein incorporated by reference in its entirety for all purposes.

TECHNICAL FIELD

The present invention relates to display technology, mere particularly, to an array substrate and a display apparatus.

BACKGROUND

Organic Light Emitting Diode (QLED) display is one of the hotspots in the field of flat panel display research today. Unlike Thin Film Transistor Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel driving circuit includes a driving transistor having s gate terminal connected to one gate line per row and a drain terminal connected to one data line per column. Whew the row in which the pixel sort is gated is formed on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of pixel driving circuits, and a plurality of light emitting elements respectively connected to the plurality of pixel driving circuits; wherein a respective pixel driving circuit comprises a driving transistor, a storage capacitor, and a transistor having a gate electrode connected to a respective second gate line of a plurality of second gate lines, a first electrode connected to a first capacitor electrode of the storage capacitor, and a second electrode connected to a second electrode of a first reset transistor, the transistor being configured to receive a reset signal through the first reset transistor; an active layer of the driving transistor and as active layer of the transistor are spaced apart from each other by at least a insulating layer; the active layer of the driving transistor comprises a first semiconductor material; and the active layer of the transistor comprises a second semiconductor material different from the first semiconductor material.

Optionally, the array substrate further comprises a first connecting pad in a first signal line layer, the first connecting pad connecting the second electrode of the transistor and the second electrode of the first reset transistor.

Optionally, the first connecting pad is connected to the second electrode of the transistor through a first via extending through at least a passivation layer, and is connected to the second electrode of the first reset transistor through a second vis extending through at least the passivation layer and the insulating layer.

Optionally, gate electrodes of the transistor and the first reset transistor are connected to different control signal lines in different layers, respectively.

Optionally, the respective pixel driving circuit further comprises the first reset transistor comprising a gate electrode connected to a respective reset control signal line in a present stage of a plurality of reset control signal lines, a first electrode connected to a respective first reset signal line of a plurality of first reset signal lines, and a second electrode connected to the second electrode of the transistor.

Optionally, the array substrate further comprises a node connecting line in the first signal line layer; wherein the node connecting line connects the first electrode of the transistor to the first capacitor electrode, which functions as a gate electrode of the driving transistor.

Optionally, the code connecting line is connected to the first electrode of the transistor through a third via extending through at least a passivation layer; and the node connecting line is connected to the first capacitor electrode through a fourth vis extending through at least the passivation layer.

Optionally, the storage capacitor comprises the first capacitor electrode and a second capacitor electrode; wherein an orthographic projection of the second capacitor electrode on a base substrate substantially covers an orthographic projection of the first capacitor electrode on the base substrate except for a hole region is which a portion of the second capacitor electrode is absent; and the fourth via extends through at least the passivation layer and the hole region.

Optionally, the array substrate father comprises as auxiliary capacitor electrode; wherein the node connecting line is connected to the auxiliary capacitor electrode through a fifth via extending through at least a passivation layer, and wherein the array substrate further comprises an auxiliary capacitor comprising the auxiliary capacitor electrode and a portion of a respective first gate line of a plurality of first gate lines, the respective first gate line being connected to a gate electrode of a first transistor and a gate electrode of a second transistor.

Optionally, the storage capacitor comprises the first capacitor electrode and a second capacitors electrode; and the auxiliary capacitor electrode and the second capacitor electrode are in a same layer.

Optionally, the node connecting line crosses over the respective second gate line is a present stage.

Optionally, the respective second gate line comprises a first branch and a second branch respectively in two different layers.

Optionally, the first branch is in a same layer as a second capacitor electrode of the storage capacitor; and the second branch is in a same layer as a plurality of first reset signal lines, a respective first reset signal line of the plurality of first reset signal fines is configured to provide a reset signal to the first electrode of the transistor.

Optionally, the array substrate further comprises a node connecting line in a first signal line layer; wherein the node connecting line crosses over the first branch and the second branch in a present stage.

Optionally, the respective pixel driving circuit further comprises a second transistor comprising a gate electrode connected to a respective first gate line of a plurality of first gate lines, a first electrode connected to the second electrode of the transistor and the second electrode of the first reset transistor, and a second electrode connected to a second electrode of a diving transistor:

Optionally, the respective fast gate line is in a layer different from the respective second gate line; and the respective first gate line is in a same layer as a plurality of reset control signal lines, a respective reset control signal line in a present stage of a plurality of reset control signal lines being connected to a gate electrode of the first reset transistor.

Optionally, the respective pixel diving circuit further comprises the first reset transistor comprising a gate electrode connected to a respective reset control signal line in a present stage of a plurality of reset control signal lines, a first electrode connected to a respective first reset signal line of a plurality of first reset signal lines, and a second electrode connected to the second electrode of the transistor; and a second reset transistor comprising a gate electrode connected to s respective reset control signal line in a next stage of a plurality of reset control signal lines, a first electrode connected to a respective second reset signal line of a plurality of second reset signal lines, and a second electrode corrected to an anode of a respective light emitting element of the plurality of light emitting elements.

Optionally, the plurality of first reset signal lines are in a same layer as a second branch of the respective second gate line; and the plurality of second reset signal lines are in a same layer as a first connecting pad is a first signal line layer.

Optionally, the array substrate further comprises a second connecting pad in a first signal line layer, the second connecting pad connecting the first electrode of the first reset transistor and a respective first reset signal line of a plurality of first reset signal lines.

Optionally, the second connecting pad is connected to the respective first reset signal line through a sixth via extending through at least a passivation layer, and is connected to a first electrode of the first reset transistor through a seventh via extending through at least the passivation layer and the insulating layer.

Optionally, the respective pixel driving circuit further comprises a second reset transistor comprising a gate electrode connected to a respective reset control signal line in a next stage of s plurality of reset control signal lines, a first electrode connected to a respective second reset signal lose of a plurality of second reset signal lines, and a second electrode connected to an anode of a respective light emitting element of the plurality of light emitting elements; and wherein the first electrode of the second reset transistor and a first electrode of a second reset transistor in an adjacent pixel driving circuit are connected to each other, forming a unitary structure, the respective pixel driving circuit and the adjacent pixel driving circuit being directly adjacent to each other and in the present stage.

Optionally, the respective second reset signal line is connected to the unitary structure through an eight via extending through at least a passivation layer and the insulating layer.

Optionally, the array substrate further comprises a light shield in a light shield layer; wherein an orthographic projection of the light shield on a base substrate covers at least 50% of aw orthographic projection of an active layer of the driving transistor ow the base substrate.

Optionally, the orthographic projection of the light shield ow the base substrate covers at least 50% of an orthographic projection of the first capacitor electrode on the base substrate.

Optionally, the storage capacitor comprises the first capacitor electrode and a second capacitor electrode; and the orthographic projection of the light shield on the base substrate covers at least 50% of an orthographic projection of the second capacitor electrode on the base substrate.

Optionally, the array substrate further comprises an auxiliary capacitor electrode; wherein the auxiliary capacitor electrode and a portion of a respective first gate line of a plurality of first gate lines are configured to form an auxiliary capacitor, the respective first gate line being connected to a gate electrode of a first transistor and a gate electrode of a second transistor; and the orthographic projection of the light shield on the base substrate covers at least 50% of an orthographic projection of the auxiliary capacitor electrode on the base substrate.

Optionally, the array substrate further comprises a plurality of voltage supply lines; wherein an orthographic projection of a respective voltage supply line of the plurality of voltage supply lines on a base substrate at least partially overlaps with an orthographic projection of the active layer of the transistor on the base substrate.

Optionally, the array substrate further comprises a node connecting line in a first signal line layer; and a plurality of voltage supply lines; wherein the node connecting line connects the first electrode of the transistor to the first capacitor electrode, which function as a gate electrode of the driving transistor, and an orthographic projection of a respective voltage supply line of the plurality of voltage supply lines on a base substrate covers at least 501% of as orthographic projection of the node connecting line on the base substrate.

Optionally, the array substrate further comprises a first connecting pad in a first signal line layer; the first connecting pad connecting the second electrode of the transistor and the second electrode of the first reset transistor; and a plurality of voltage supply lines; wherein an orthographic projection of a respective voltage supply line of the plurality of voltage supply lines on a base substrate covers at least 50% of an orthographic projection of the first connecting pad on the base substrate.

Optionally, the array substrate further comprises as auxiliary capacitor electrode; a node connecting line in a first signal line layer, and a plurality of voltage supply lines; wherein the node connecting line is connected to the auxiliary capacitor electrode through a fifth via extending through at least the passivation layer; the auxiliary capacitor electrode and a portion of a respective first gate line of a plurality of first gate lines are configured to form an auxiliary capacitor, the respective first gate line being connected to's gate electrode of a first transistor and a gate electrode of a second transistor; and aw orthographic projection of a respective voltage supply line of the plurality of voltage supply lines on a base substrate covers at least 50% of as orthographic projection of the auxiliary capacitor electrode ow the base substrate.

Optionally, the array substrate further comprises a plurality of voltage supply lines; wherein a first respective voltage supply line and a second respective voltage supply line respectively connected to a first pixel driving circuit and a second pixel driving circuit ara connected to each other, forming a unitary structure, the first pixel driving circuit and the second pixel driving circuit being directly adjacent to each other and in the present stage.

Optionally, the array substrate further comprises an auxiliary capacitor electrode; a mode connecting line in a first signal line layer, a plurality of voltage supply lines; and a first connecting pad in the first signal line layer; wherein the node connecting line connects the fast electrode of the transistor to the first capacitor electrode, which functions as a gate electrode of the driving transistor; the first connecting pad connects the second electrode of the transistor and the second electrode of the first reset transistor; the node connecting line is connected to the auxiliary capacitor electrode through a fifth vis extending through at least a passivation layer; the auxiliary capacitor electrode and a portion of a respective first gate line of a plurality of first gate lines are configured to form an auxiliary capacitor, the respective first gate line being connected to a gate electrode of a first transistor and a gate electrode of a second transistor; and an orthographic projection of the unitary structure on a base substrate covers at least 50% of an orthographic projection of active layers of transistors respectively of the first pixel driving circuit and the second pixel driving circuit on the base substrate, covers at least 50% of an orthographic projection of node connecting lines respectively of the first pixel driving circuit and the second pixel diving circuit on the base substrate, covers at least 50% of as orthographic projection of first connecting pads respectively of the first pixel driving circuit and the second pixel driving circuit on the base substrate, and covers at least 50% of as orthographic projection of auxiliary capacitor electrodes respectively of the first pixel driving circuit and the second pixel driving circuit on the base substrate.

Optionally, the array substrate further comprises a plurality of data lines; wherein the first respective voltage supply line and the second respective voltage supply line are between a first respective data line and a second respective data line respectively connected to the first pixel driving circuit and the second pixel diving circuit.

Optionally, the respective second gate line comprises a first branch and a second branch respectively in two different layers; the first branch comprises a first portion in a region surrounded by node connecting lines respectively from two directly adjacent pixel driving circuits and in a present stage and first connecting pads respectively from the two directly adjacent pixel driving circuits and in the present stage, and a second portion outside the region; the first portion is a portion of the first branch that crosses over active layers respectively of transistors respectively from the two directly adjacent pixel driving circuits; the first portion has a first average width along a direction perpendicular to an extension direction of the first branch; the second portion has a second average width along the direction perpendicular to the extension direction of the first branch; and the first average width is greater than the second average width.

Optionally, the array substrate further comprises a plurality of voltage supply lines; wherein an orthographic projection of a respective voltage supply line of the plurality of voltage supply lines on a base substrate covers at least 50% of an orthographic projection of the first portion on the base substrate.

Optionally, the respective second gate line comprises a first branch and a second branch respectively in two different layers; the second branch comprises a third portion in a region surrounded by node connecting lines respectively from two directly adjacent pixel driving circuits and is a present stage and first connecting pads respectively from the two directly adjacent pixel driving circuits and in the present stage, and a fourth portion outside the region; the third portion is a portion of the first branch that crosses over active layers respectively of transistors respectively from the two directly adjacent pixel driving circuits; the third portion has a third average width along a direction perpendicular to an extension direction of the second branch; the fourth portion has a fourth average width along the direction perpendicular to the extension direction of the second branch; and the third average width is greater than the fourth average width.

Optionally, the array substrate further comprises a plurality of voltage supply lines; wherein an orthographic projection of a respective voltage supply line of the plurality of voltage supply lines on a base substrate covers at least 50% of an orthographic projection of the third portion ow the base substrate.

Optionally, corresponding layers of a first pixel diving circuit and corresponding layers of a second pixel driving circuit directly adjacent to each other and in the present stage have a substantially mirror symmetry with respect to each other.

Optionally, the first semiconductor material comprises a polycrystalline silicon material; and the second semiconductor material comprises a metal oxide semiconductor material.

In another aspect, the present disclosure provides a display apparatus, comprising the array substrate described herein or fabricated by a method described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of pixel driving circuits, and a plurality of light emitting elements respectively connected to the plurality of pixel driving circuits. In some embodiments, a respective pixel driving circuit comprises a driving transistor, a storage capacitor, and a leakage preventing transistor having a gate electrode connected to a respective second gate line of a plurality of second gate lines, a first electrode connected to a first capacitor electrode of the storage capacitor, and a second electrode converted to a second electrode of a first reset transistor. Optionally, an active layer of the driving transistor and an active layer of the leakage preventing transistor are spaced apart from each offer by at least an insulating layer. Optionally, the active layer of the driving transistor comprises a first semiconductor material. Optionally, the active layer of the leakage preventing transistor comprises a second semiconductor material different from the first semiconductor material.

Various appropriate pixel diving circuits may be used in the present array substrate. Examples of appropriate driving circuits include 3T1C, 2T1C, 4T1C, 4T2C, 5T2C, 6T1, 7T1C, 7T2C, 8T1C, and 8T2C. In some embodiments, the respective one of the plurality of pixel driving circuits is an 8T1C driving circuit. Various appropriate light emitting elements mazy be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
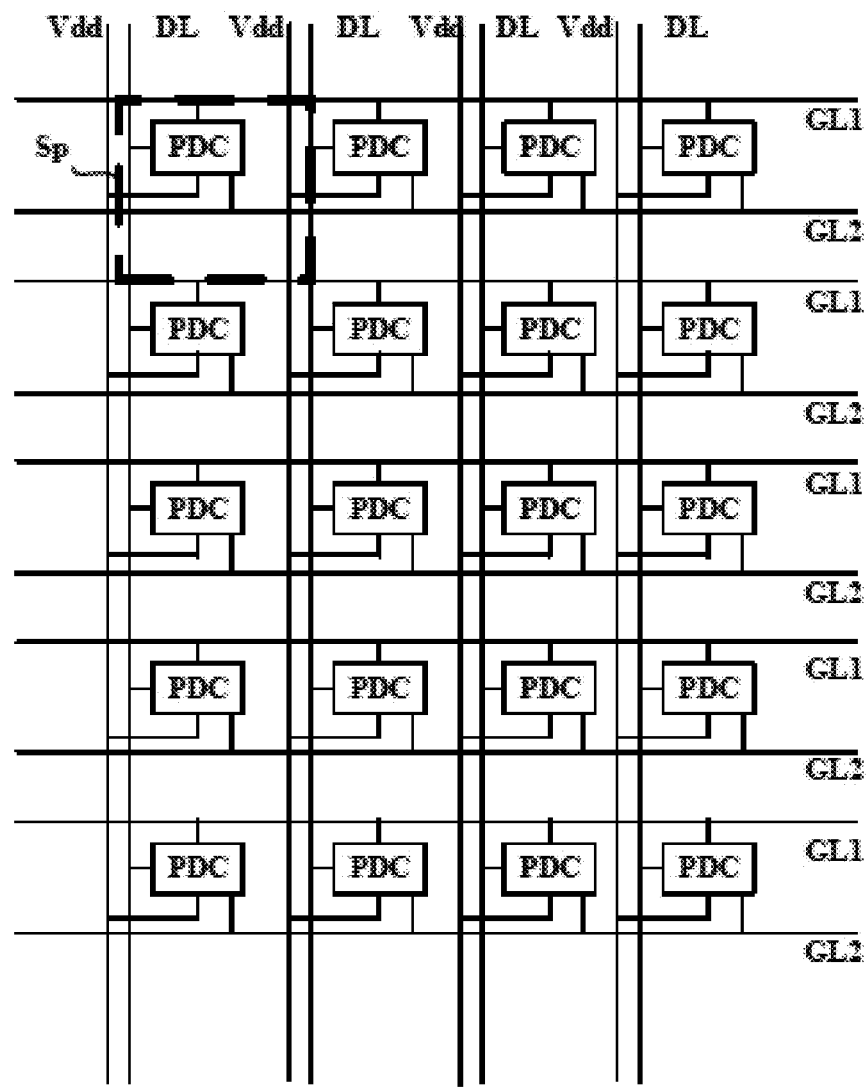
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of first gate lines GL1, a plurality of second gate lines GL2, a plurality of data lines DL, a plurality of voltage supply line Vdd, and a respective second voltage supply line (e.g., a low voltage supply line Vss). Light emission is a respective subpixel sp is drives by a respective pixel driving circuit PDC. In one example, a high voltage signal (e.g., a VDD signal) is input, through the respective high voltage supply line of the plurality of voltage supply line Vdd, to the respective pixel driving circuit PDC connected to an anode of the light emitting element; a low voltage signal (e.g., a VSS signal) is input, through a low voltage supply line Vss, to a cathode of the light emitting element. A voltage difference between the high voltage signal (e.g., the VDD signal) and the low voltage signal (e.g., the VSS signal) is a driving voltage $\Delta V$ that drives light emission is the light emitting element.

Figure 2:
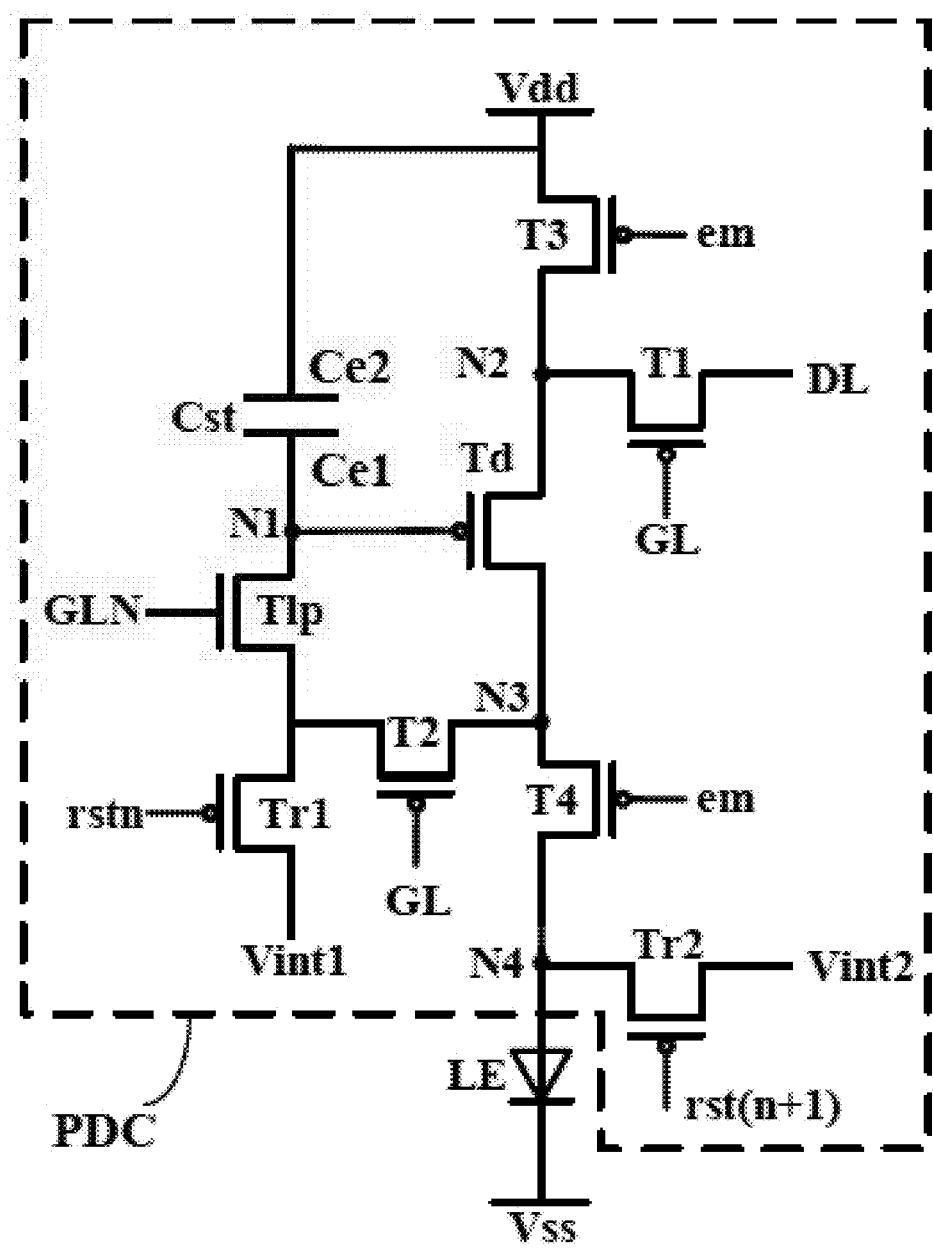
FIG. 2 is a circuit diagram illustrating the structure of a pixel driving circuit in some embodiments according to the present disclosure.

FIG. 2 is a circuit diagram illustrating the structure of a pixel driving circuit a some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a respective first gate lie GL of a plurality of first gate lines, a first electrode connected to a respective data line DL of a plurality of data lines, and a second electrode connected to a first electrode of the driving transistor Td; a second transistor T2 having a gate electrode connected to the respective first gate line GL of a plurality of first gate lines, a first electrode connected to a second electrode of a leakage preventing transistor and a second electrode of a first reset transistor, and a second electrode connected to the second electrode of the driving transistor Td and a first electrode of a fourth transistor T4; a third transistor T3 having a gate electrode connected to a respective light emitting control signal line em of a plurality of light emitting control signal lines, a first electrode connected to a respective voltage supply line Vdd of a plurality of voltage supply lines and a second capacitor electrode Ce2 of the storage capacitor, and a second electrode connected to the first electrode of the driving transistor Td and the second electrode of the first transistor T1; a fourth transistor T4 having a gate electrode connected to the respective light emitting control signal line em, a fast electrode connected to the second electrode of the driving transistor Td and the second electrode of the second transistor T2, and a second electrode connected to an anode of a respective light emitting element LE; a first reset transistor Tr1 having a gate electrode connected to a respective reset control signal line rstn in a present stage of a plurality of reset control signal lines, a first electrode connected to a respective first reset signal line Vint1 of a plurality of first reset signal lines, and a second electrode connected to the first electrode of the second transistor T2 and the second electrode of the leakage preventing transistor T1$p$; a second reset transistor Tr2 having a gate electrode connected to a respective reset control signal line rst(n+1) in a next stage of a plurality of reset control signal lines, a first electrode connected to a respective second reset signal line Vint2 of a plurality of second reset signal lines, and a second electrode connected to the anode of the respective light emitting element LE and she second electrode of the fourth transistor T4. In some embodiments, the present pixel driving circuit father includes a leakage preventing transistor T1$p$ having a gate electrode connected to a respective second gate line GLN of a plurality of second gate lines, a first electrode connected to the first capacitor electrode Ce1 and the gate electrode of the driving transistor Td, and a second electrode connected to the second electrode of the first reset transistor Tr1 and the first electrode of the second transistor T2. The second capacitor electrode Ce2 is connected to the respective voltage supply line and the first electrode of the third transistor T3.

The pixel driving circuit further include a first node N1, a second node N2, a third mode N3, and a fourth node N4. The first node N1 is connected to the gate electrode of the diving transistor Td, the first capacitor electrode Ce1, and the first electrode of the leakage preventing transistor T1p. The second node N2 is connected to the second electrode of the third transistor T3, the second electrode of the first transistor T1, and the fast electrode of the driving transistor Td. The third node N3 is connected to the second electrode of the driving transistor Td, the second electrode of the second transistor T2, and the first electrode of the fourth transistor T4. The fourth node NA is connected to the second electrode of the fourth transistor T4, she second electrode of the second reset transistor Tr2, and the anode of the light emitting element LE.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the away substrate includes the respective first subpixel, the respective second subpixel, the respective third subpixel, and the respective fourth subpixel. The plurality of subpixels in the array substrate are arranged is an array. In one example, the array of the plurality of subpixels includes a S1-S2-S3-S4 format repeating array, in which S1 stands for the respective fest subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color. C2 stands for the respective second subpixel of a second color, C3 stands for the respective third subpixel of a third color, and C4 stands for the respective fourth subpixel of a fourth color. In another example, she S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiment, a minimum repeating unit of the plurality of subpixels of the array substrate includes the respective first subpixel, the respective second subpixel, the respective third subpixel, and the respective fourth subpixel. Optionally, each of the respective first subpixel, the respective second subpixel, the respective third subpixel, and the respective fourth subpixel, includes the first transistor T1, the second transistor 12, the third transistor T3, the fourth transistor T4, the first reset transistor Tr1, the second reset transistor Tr2, the leakage preventing transistor T1p, and the driving transistor Td.

Figure 3A:
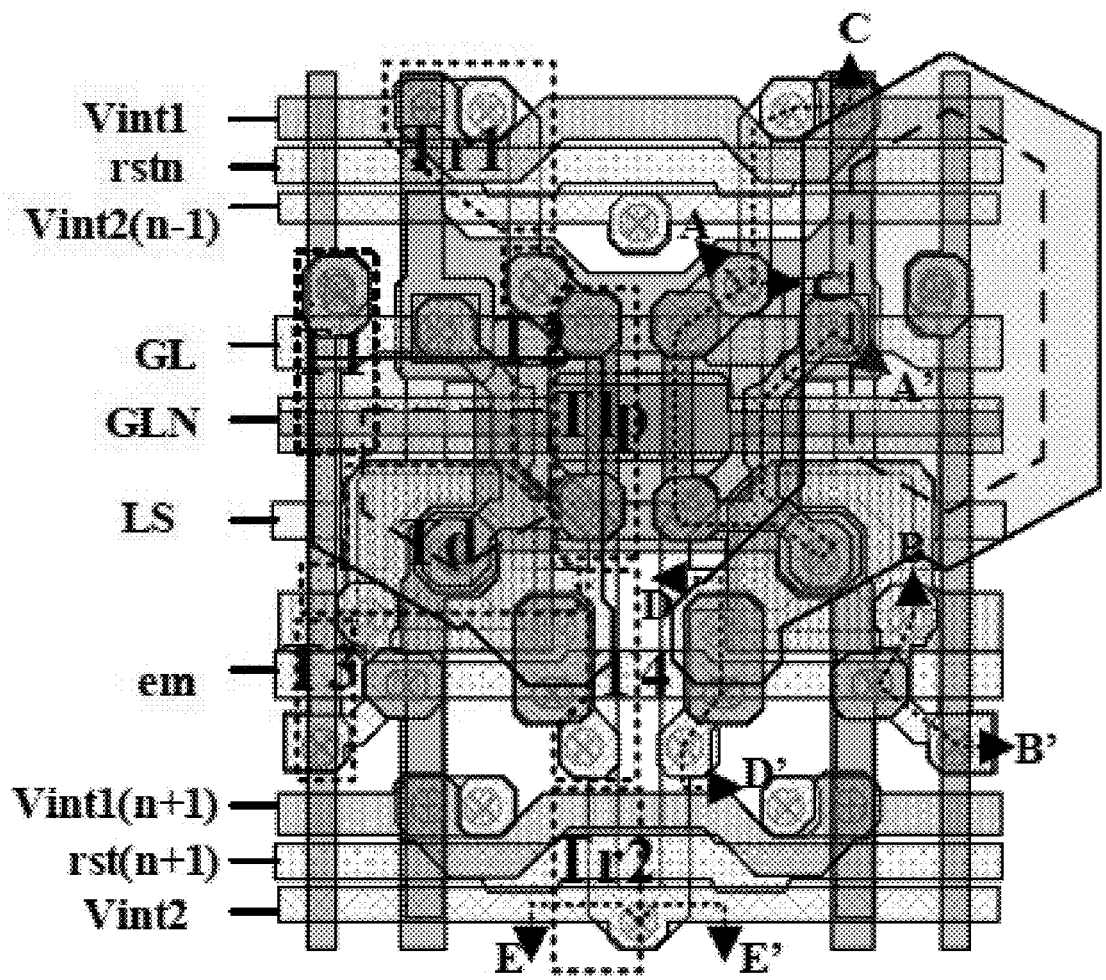
FIG. 3A is a diagram illustrating the structure of two adjacent pixel driving circuits in a same stage is an array substrate in some embodiments according to the present disclosure.
Figure 3B:
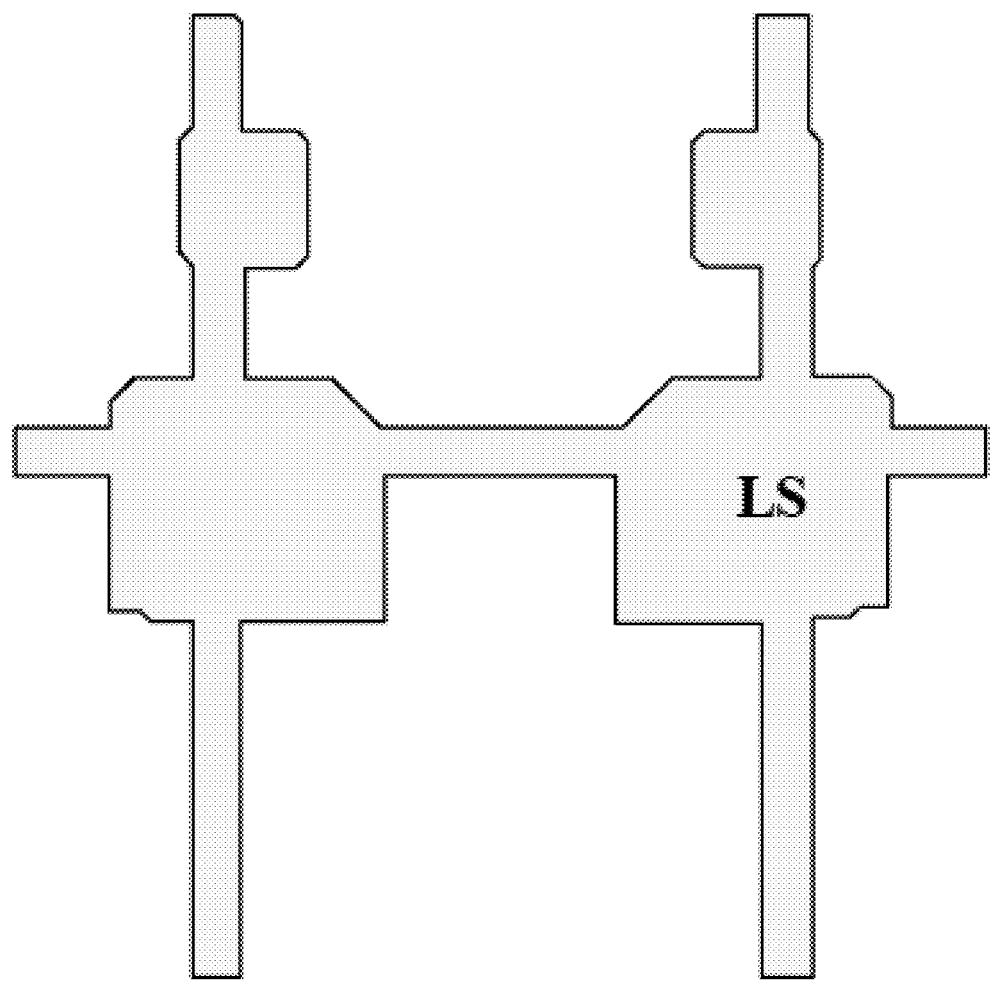
FIG. 3B is a diagram illustrating the structure of a light shield layer of two adjacent pixel driving circuits in an array substrate depicted in FIG. 3A.
Figure 3C:
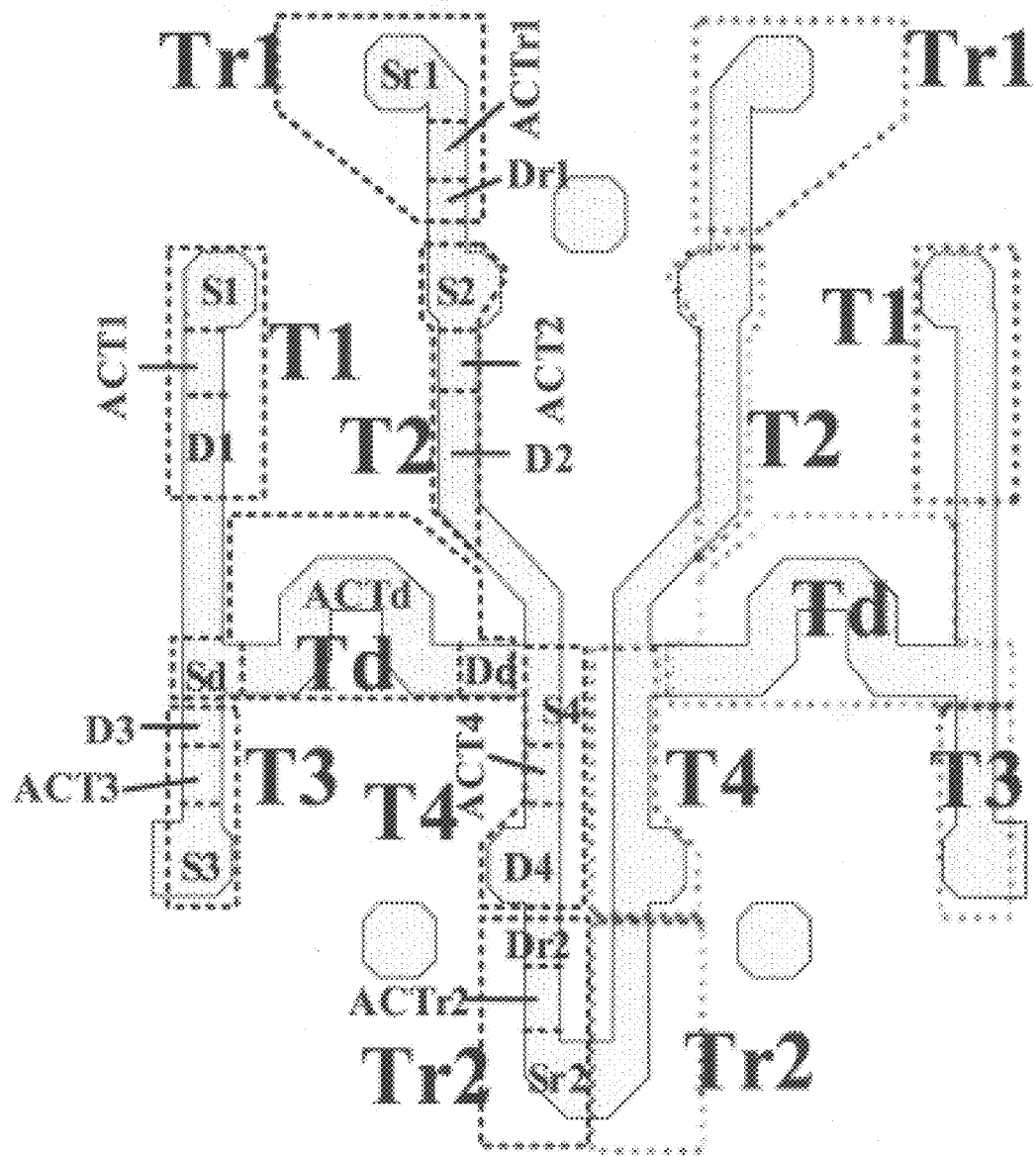
FIG. 3C is a diagram illustrating the structure of a first semiconductor material layer of two adjacent pixel driving circuits in an array substrate depicted in FIG. 3A.
Figure 3D:
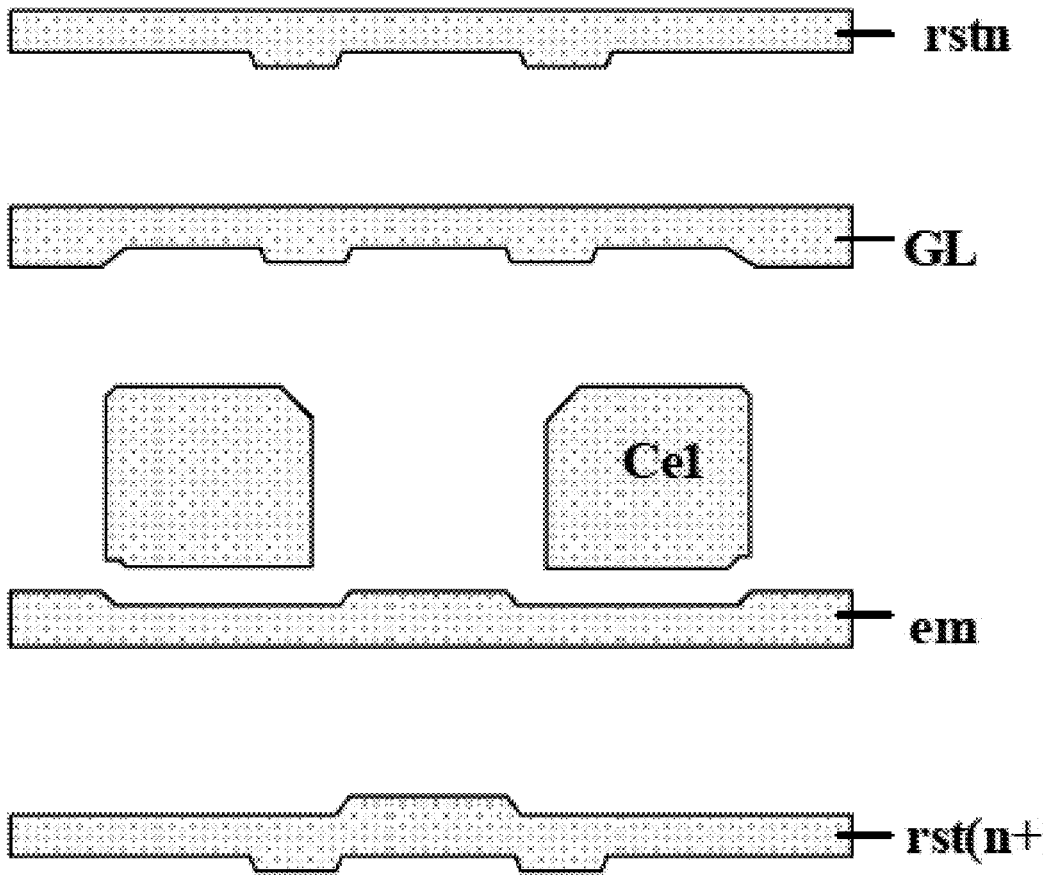
FIG. 3D is s diagram illustrating the structure of a first conductive layer of two adjacent pixel driving circuits is an array substrate depicted in FIG. 3A.
Figure 3E:
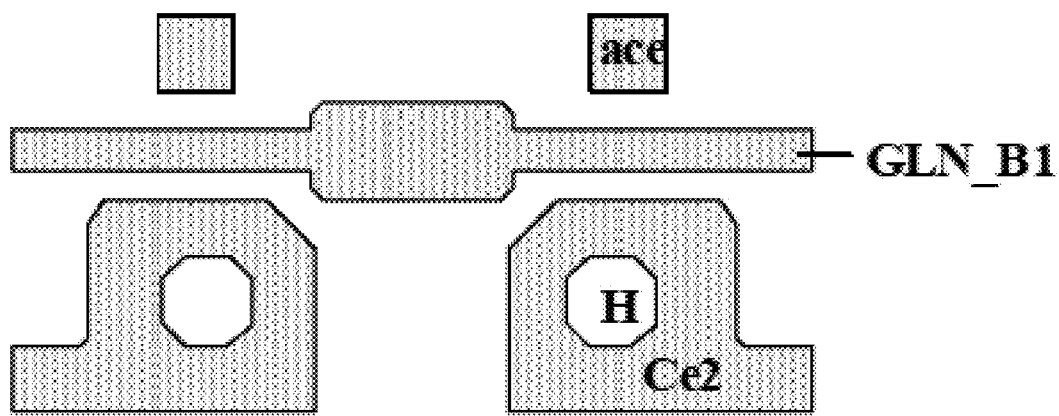
FIG. 3E is a diagram illustrating the structure of a second conductive layer of two adjacent pixel diving circuits in an array substrate depicted in FIG. 3A.
Figure 3F:
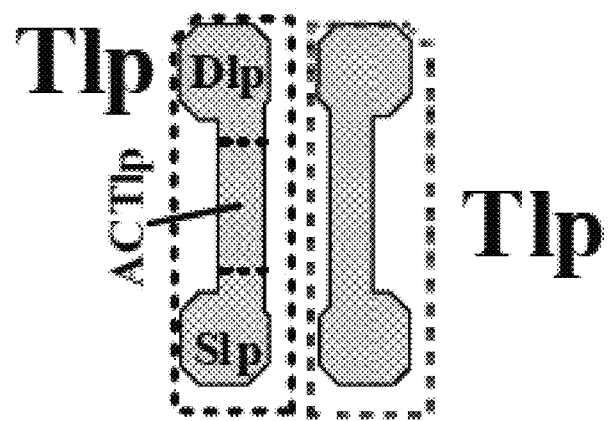
FIG. 3F is a diagram illustrating the structure of a second semiconductor material layer of two adjacent pixel driving circuits in an array substrate depicted in FIG. 3A.
Figure 3G:
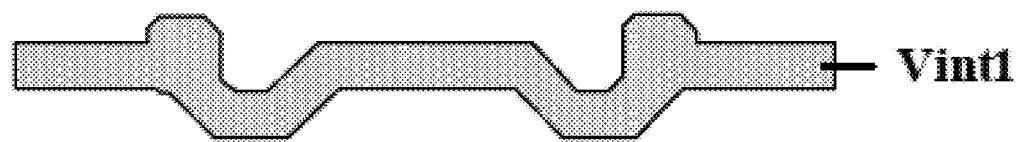
FIG. 3G is s diagram illustrating the structure of a third conductive layer of two adjacent pixel driving circuits in an array substrate depicted in FIG. 3A.
Figure 3G:
Figure 3G:
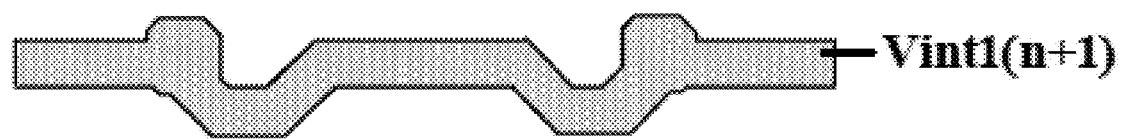
Figure 3H:
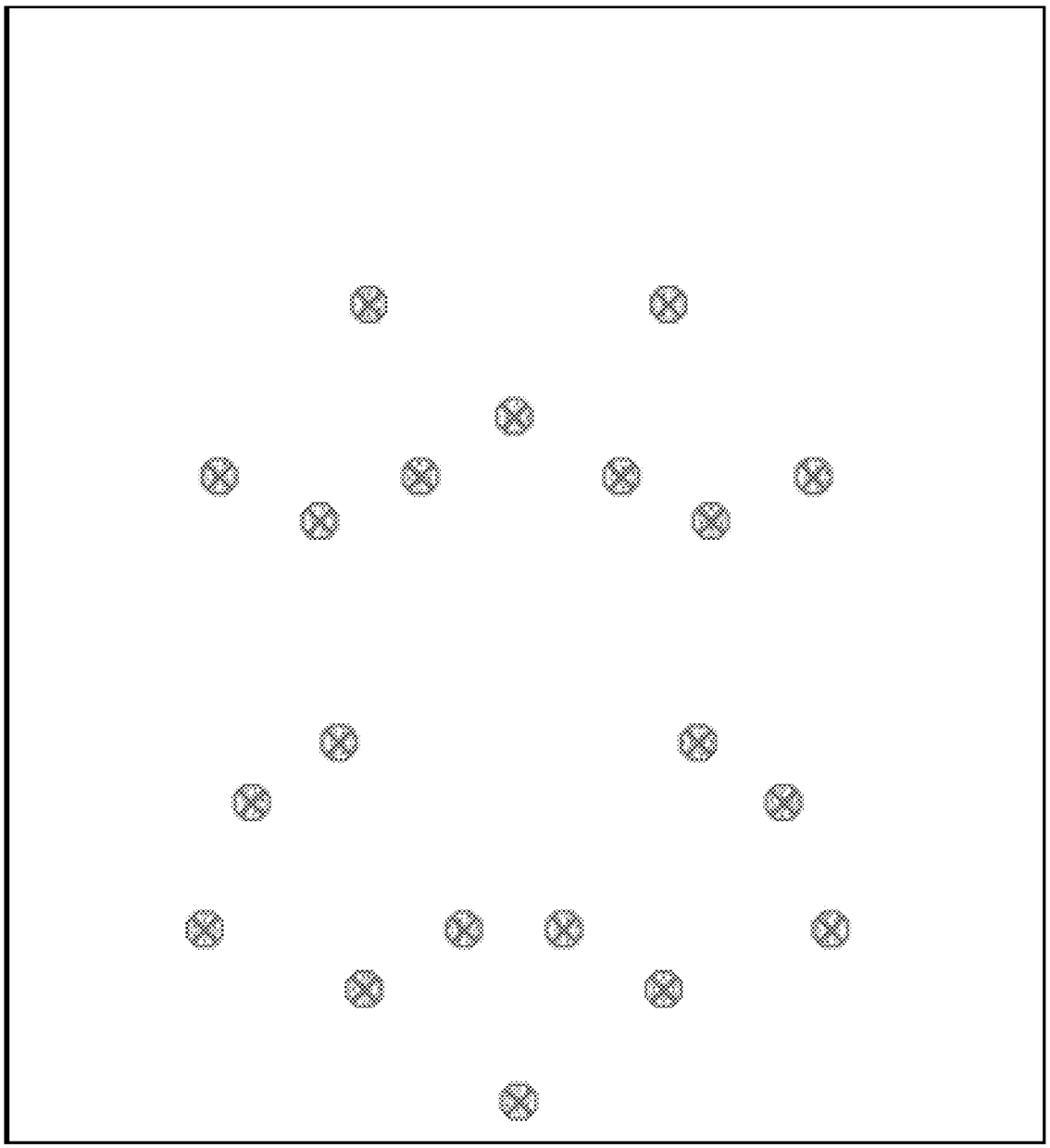
FIG. 3H is a diagram illustrating vias extending through a passivation layer, a second inter-layer dielectric layer, a first inter-layer dielectric layer, an insulating layer and a gate insulating layer in an array substrate depicted in FIG. 3A.
Figure 3I:
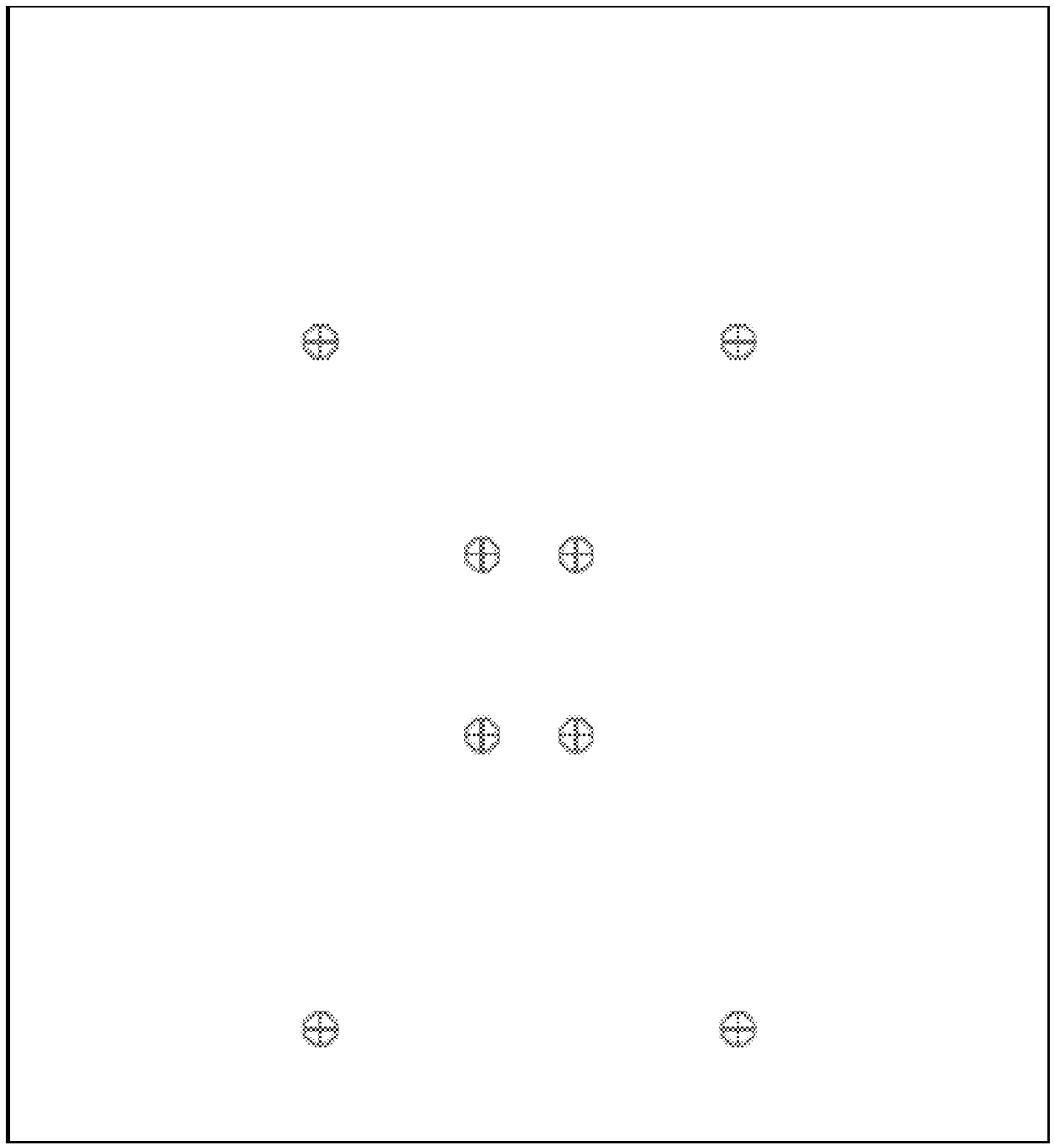
FIG. 3I is a diagram illustrating vias extending through a passivation layer and a second inter-layer dielectric layer in an array substrate depicted in FIG. 3A.
Figure 3J:
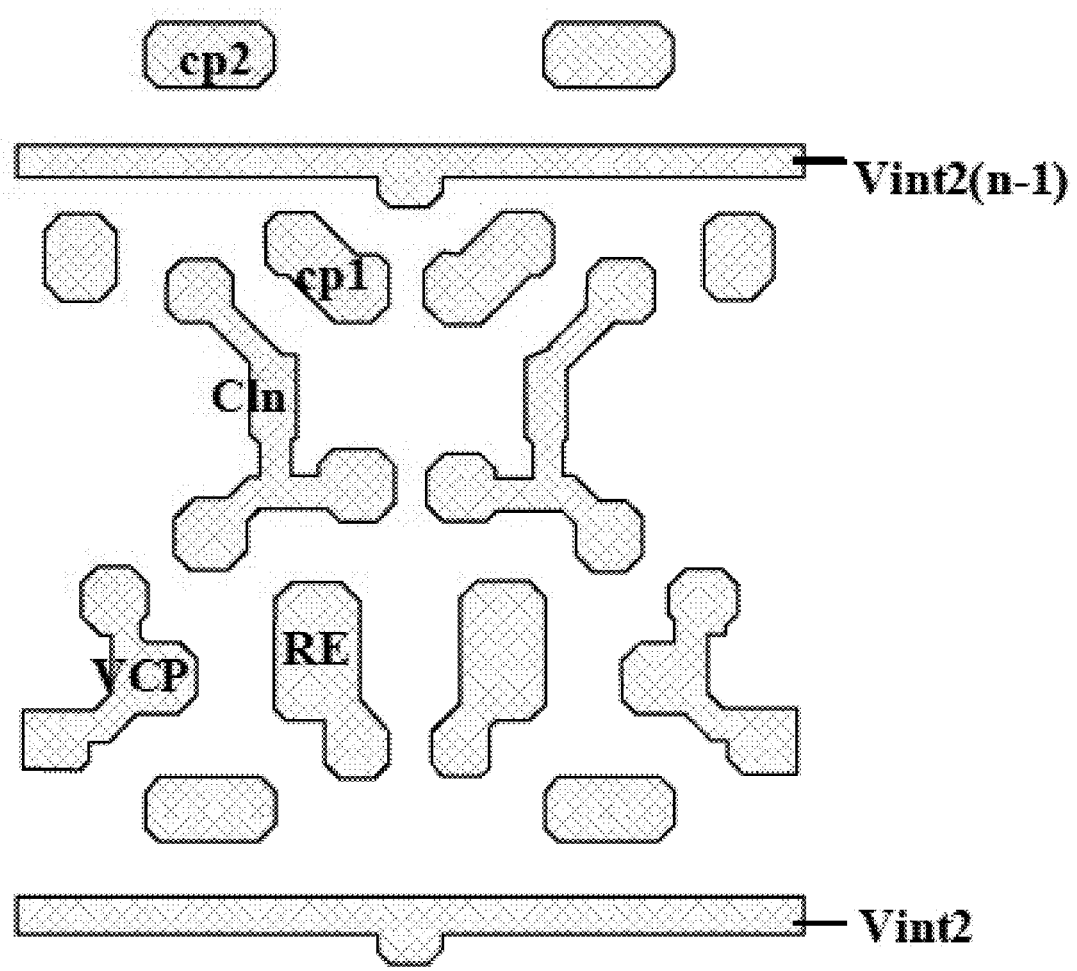
FIG. 3J is a diagram illustrating the structure of a first signal line layer of two adjacent pixel driving circuits is an array substrate depicted in FIG. 3A.
Figure 3K:
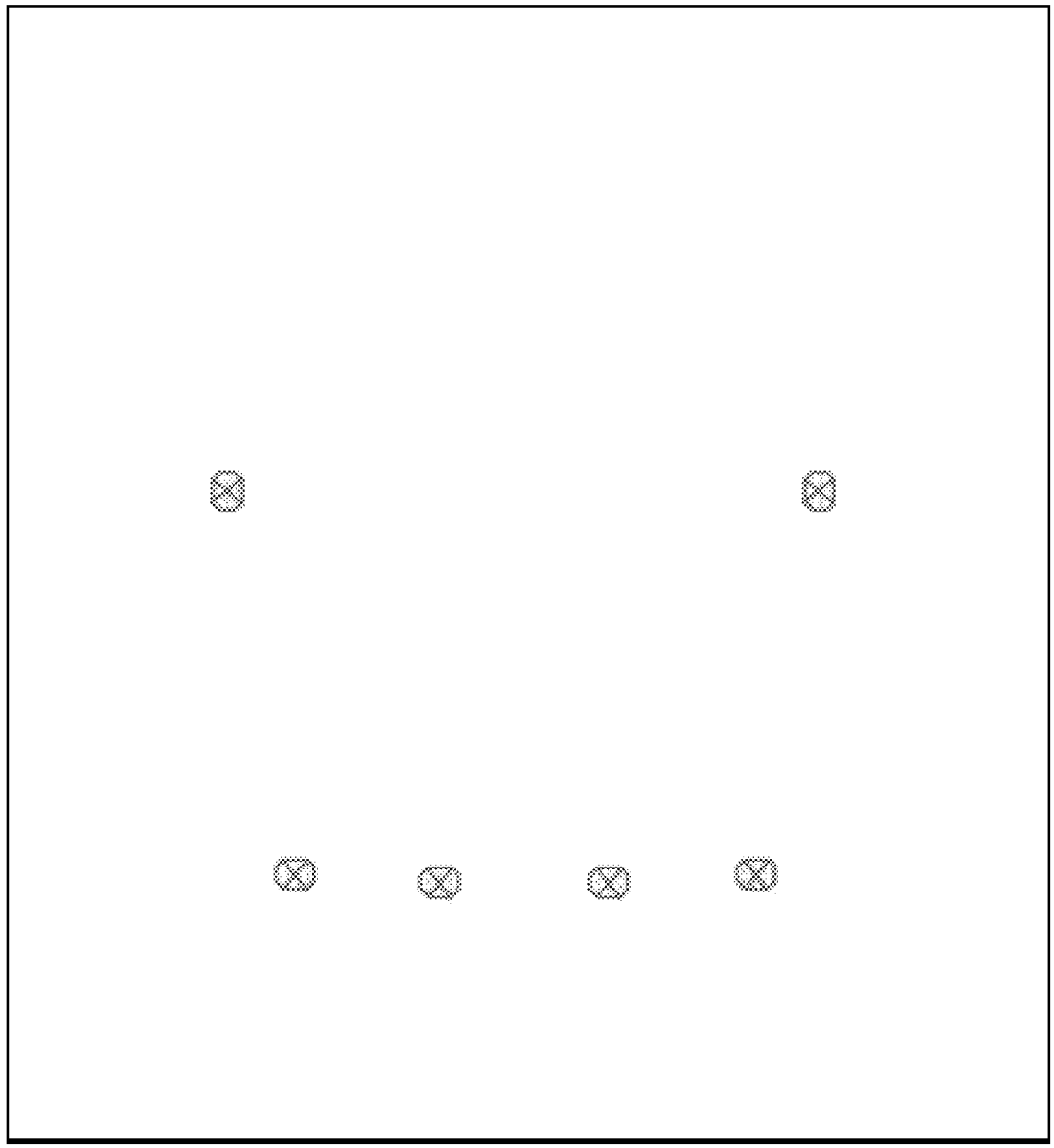
FIG. 3K is a diagram illustrating vias extending through a first planarization layer in an array substrate depicted in FIG. 3A.
Figure 3L:
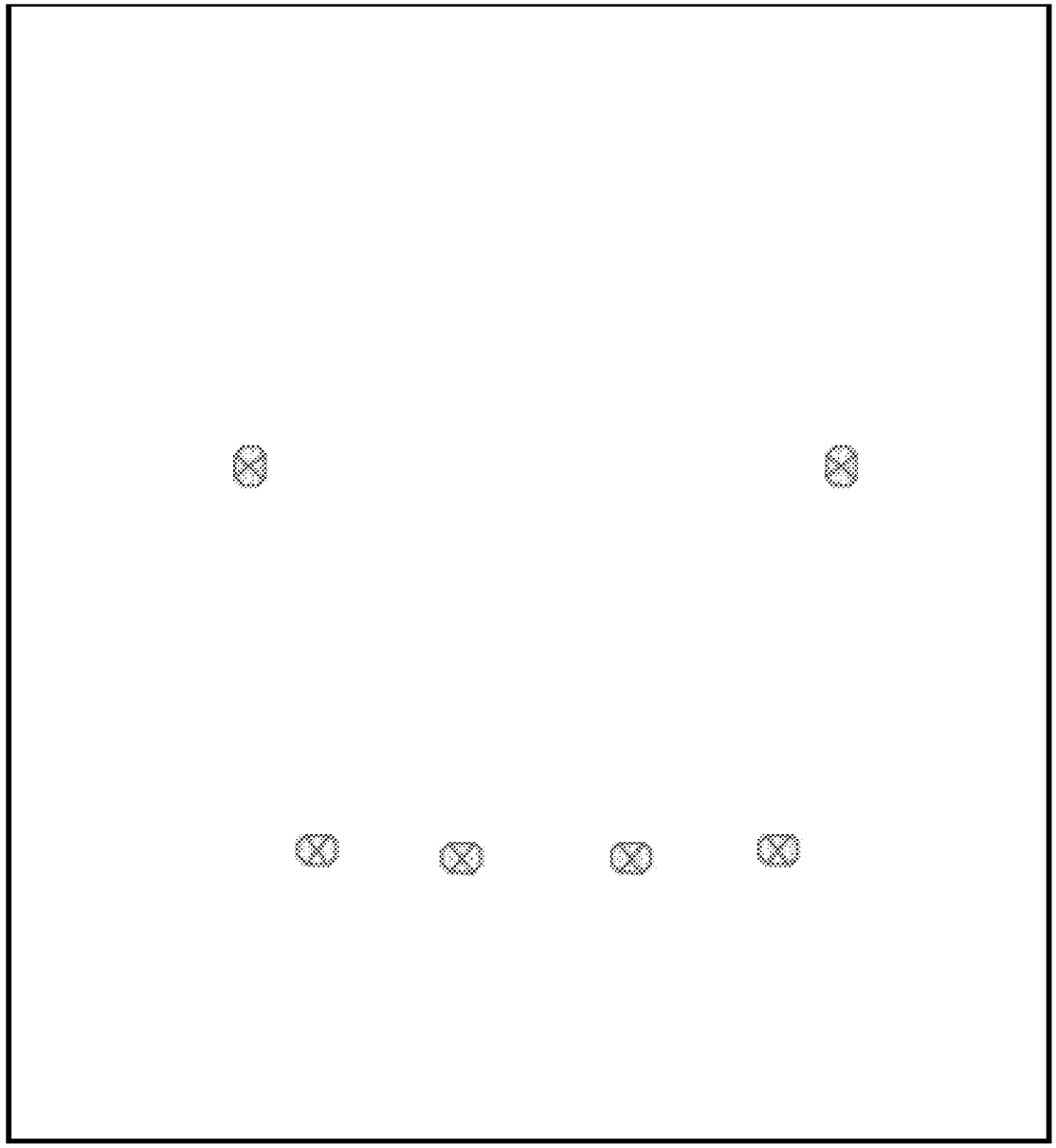
FIG. 3L is a diagram illustrating vias extending through a passivation layer, a second inter-layer dielectric layer, a first inter-layer dielectric layer, an insulating layer and a gate insulating layer in an array substrate depicted is FIG. 3A.
Figure 3M:
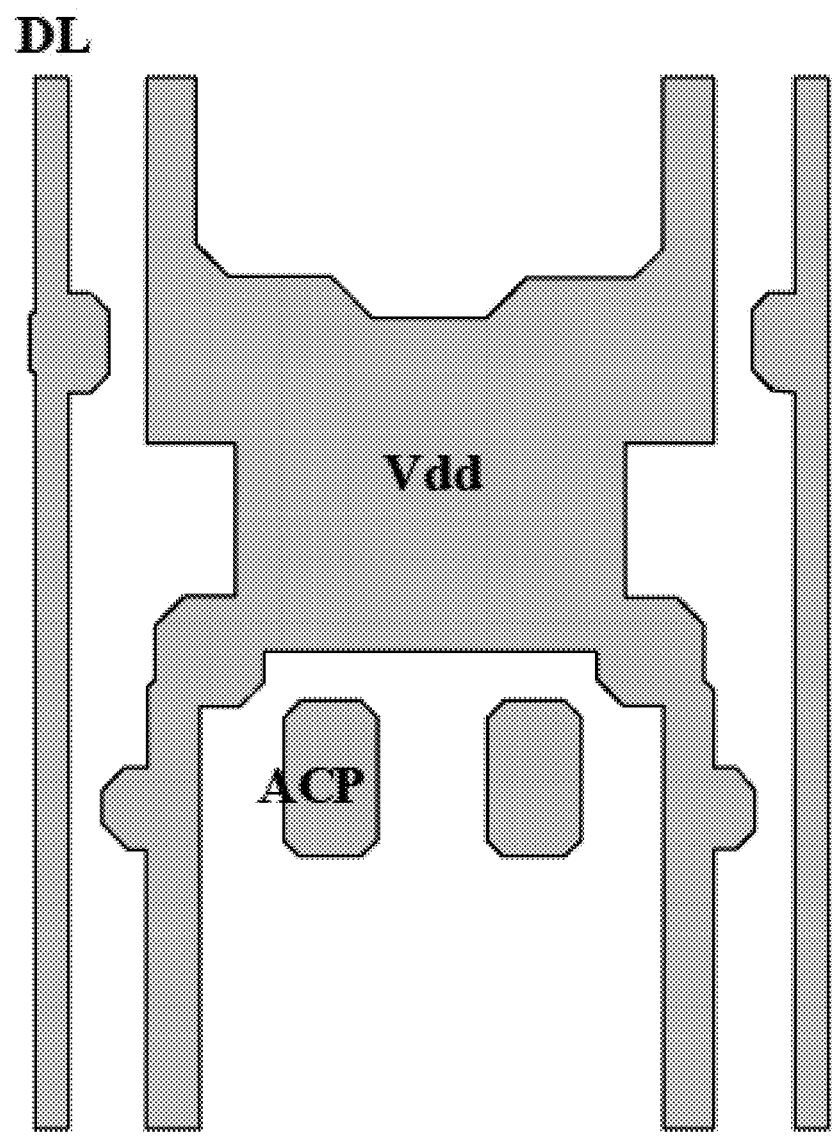
FIG. 3M is a diagram illustrating the structure of a second signal line layer of two adjacent pixel driving circuits in an array substrate depicted in FIG. 3A.
Figure 3N:
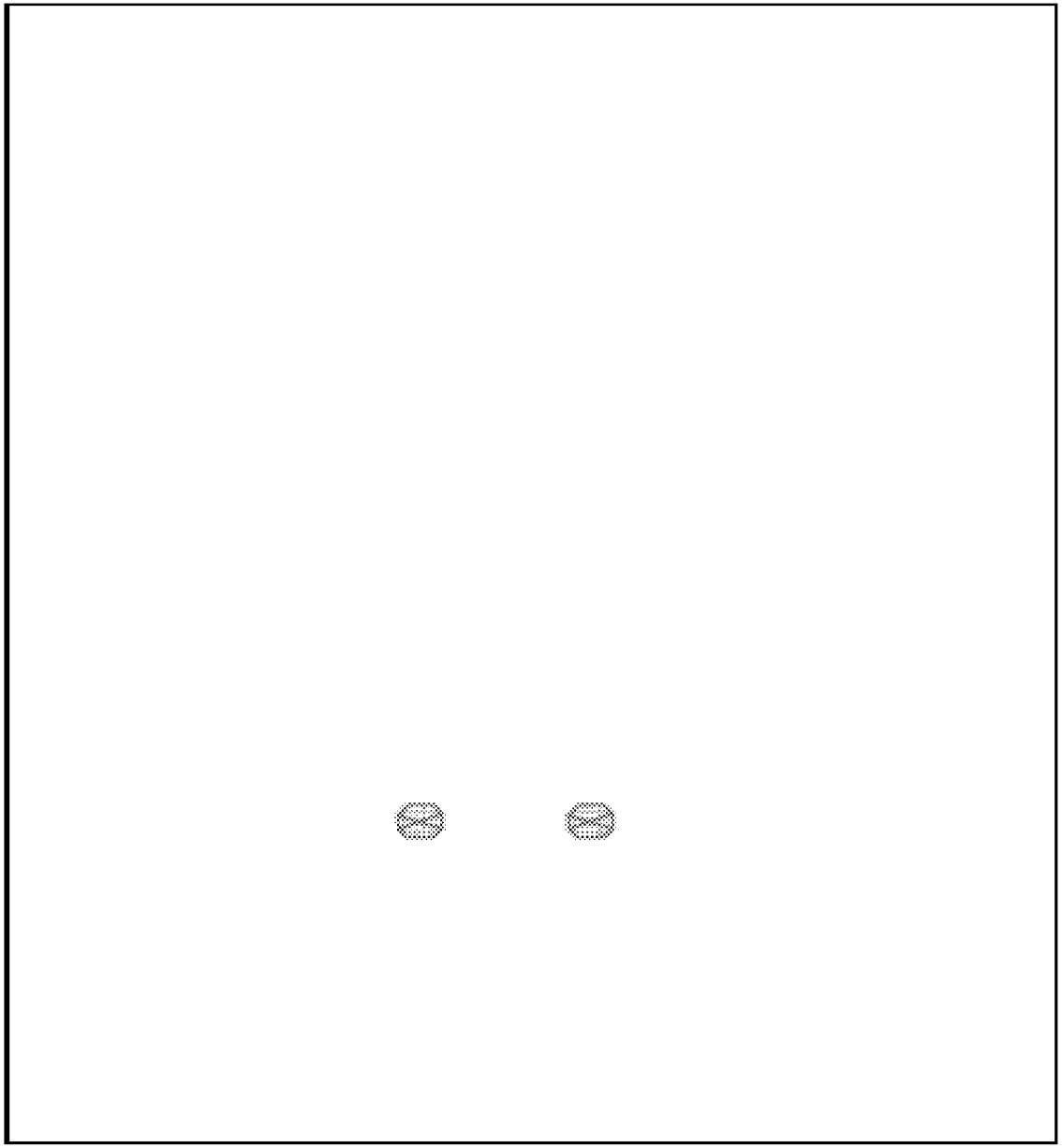
FIG. 3N is a diagram illustrating vias extending through a second planarization layer in an array substrate depicted in FIG. 3A.
Figure 3O:
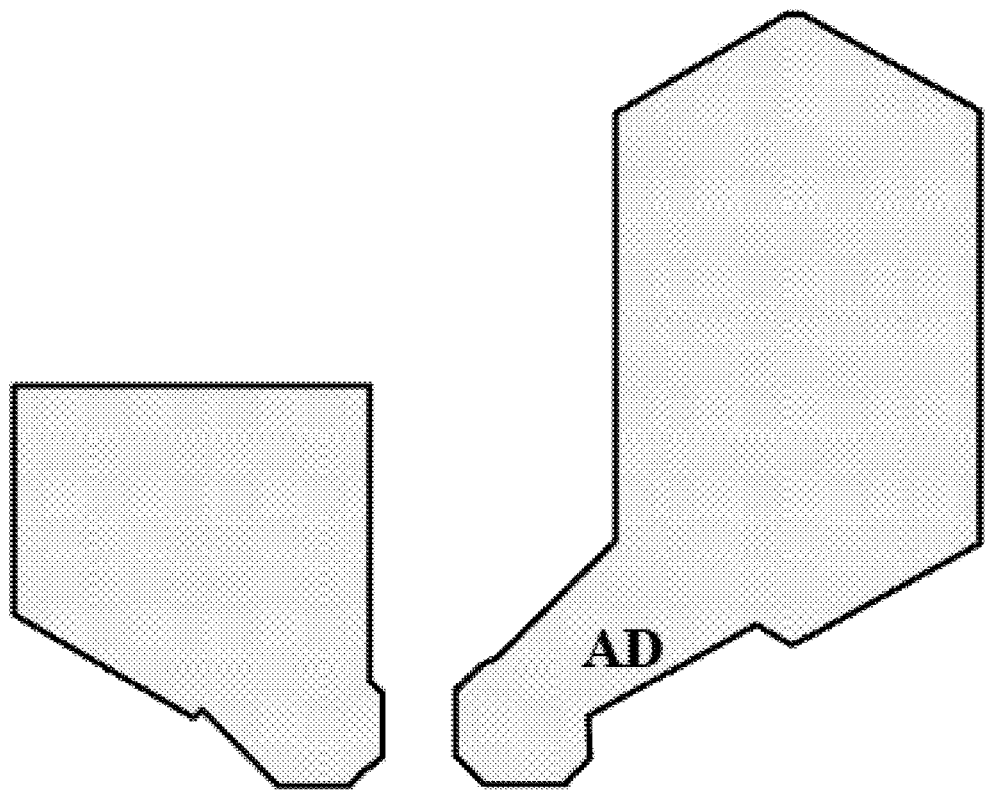
FIG. 3O is a diagram illustrating the structure of an anode layer of two adjacent pixel driving circuits in an array substrate depicted in FIG. 3A.
Figure 3P:
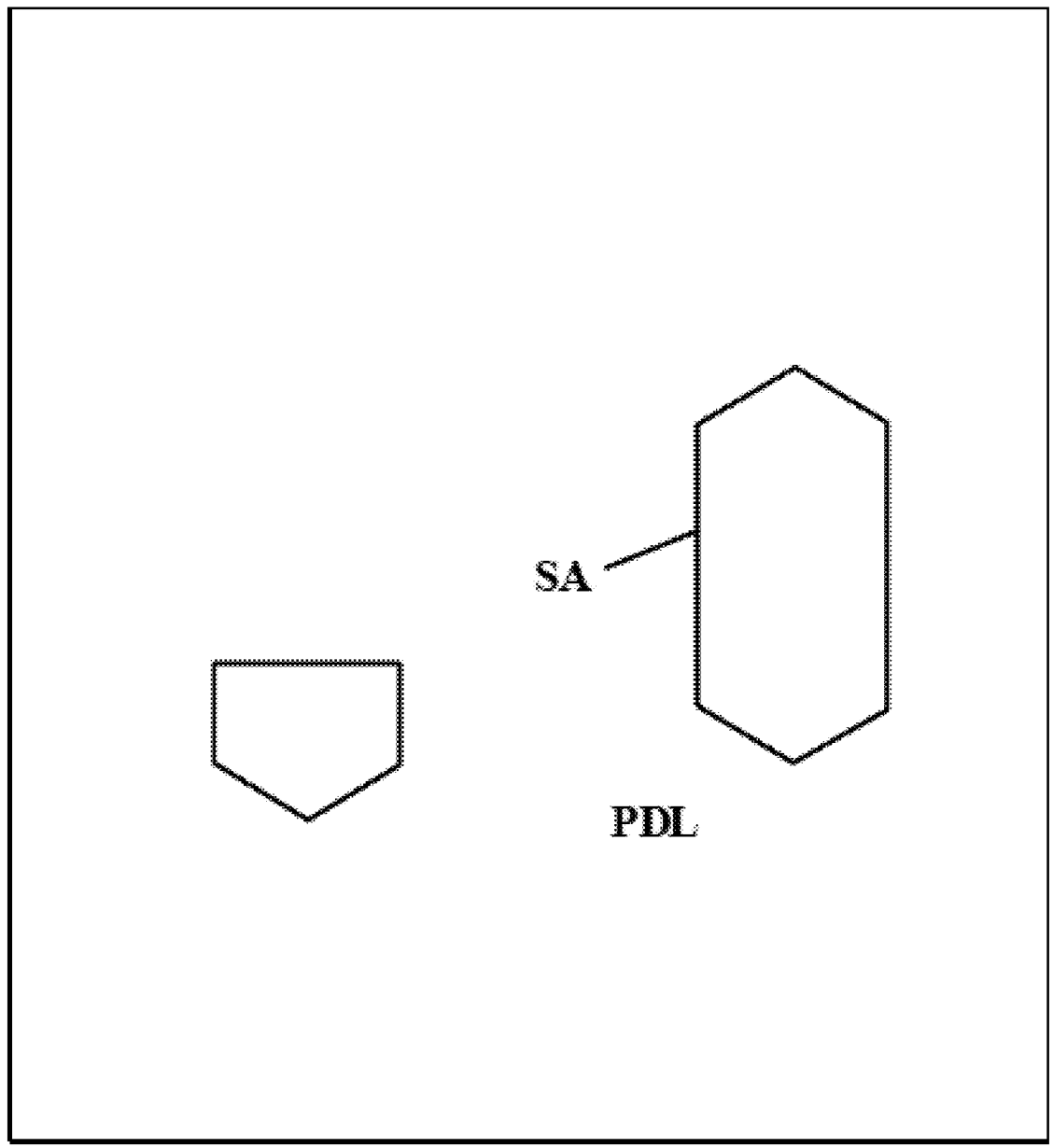
FIG. 3P is a diagram illustrating the structure of a pixel definition layer of two adjacent pixel driving circuits is an array substrate depicted in FIG. 3A.

FIG. 3A is s diagram illustrating the structure of two adjacent pixel driving circuits in a same stage in an array substrate in some embodiments according to the present disclosure. FIG. 3B is a diagram illustrating the structure of a light shield layer of two adjacent pixel diving circuits in an array substrate depicted in FIG. 3A. FIG. 3C is a diagram illustrating the structure of a first semiconductor material layer of two adjacent pixel driving circuits in ax array substrate depicted in FIG. 3A. FIG. 3D is a diagram illustrating the structure of a first conductive layer of two adjacent pixel driving circuits in an array substrate depicted in FIG. 3A. FIG. 3E is a diagram illustrating the structure of a second conductive layers of two adjacent pixel driving circuits in an array substrate depicted in FIG. 3A. FIG. 3F is a diagram illustrating the structure of a second semiconductor material layer of two adjacent pixel driving circuits in an array substrate depicted in FIG. 3A. FIG. 3G is a diagram illustrating the structure of a third conductive layer of two adjacent pixel driving circuits is an array substrate depicted in FIG. 3A. FIG. 3H is a diagram illustrating vias extending through a passivation layer, a second inter-layer dielectric layer, a first inter-layer dielectric layer, aw insulating layer and a gate insulating layer in an array substrate depicted in FIG. 3A. FIG. 3I is a diagram illustrating vias extending though a passivation layer and a second inter-layer dielectric layer in an array substrate depicted in FIG. 3A. FIG. 3J is a diagram illustrating the structure of a first signal line layer of two adjacent pixel driving circuits in an array substrate depicted in FIG. 3A. FIG. 3K is a diagram illustrating vias extending through a first planarization layer in an array substrate depicted in FIG. 3A. FIG. 3L is a diagram illustrating vias extending through a passivation layer, a second inter-layer dielectric layer, a first inter-layer dielectric layer, an insulating layer and a gate insulating layer in an array substrate depicted in FIG. 3A. FIG. 3M is a diagram illustrating the structure of a second signal line layer of two adjacent pixel driving circuits in an array substrate depicted is FIG. 3A. FIG. 3N is a diagram illustrating vias extending through a second planarization layer in an array substrate depicted in FIG. 3A. FIG. 3O is a diagram illustrating the structure of an anode layer of two adjacent pixel driving circuits in an array substrate depicted in FIG. 3A. FIG. 3P is a diagram illustrating the structure of a pixel definition layers of two adjacent pixel driving circuits is an array substrate depicted in FIG. 3A.

Figure 4A:
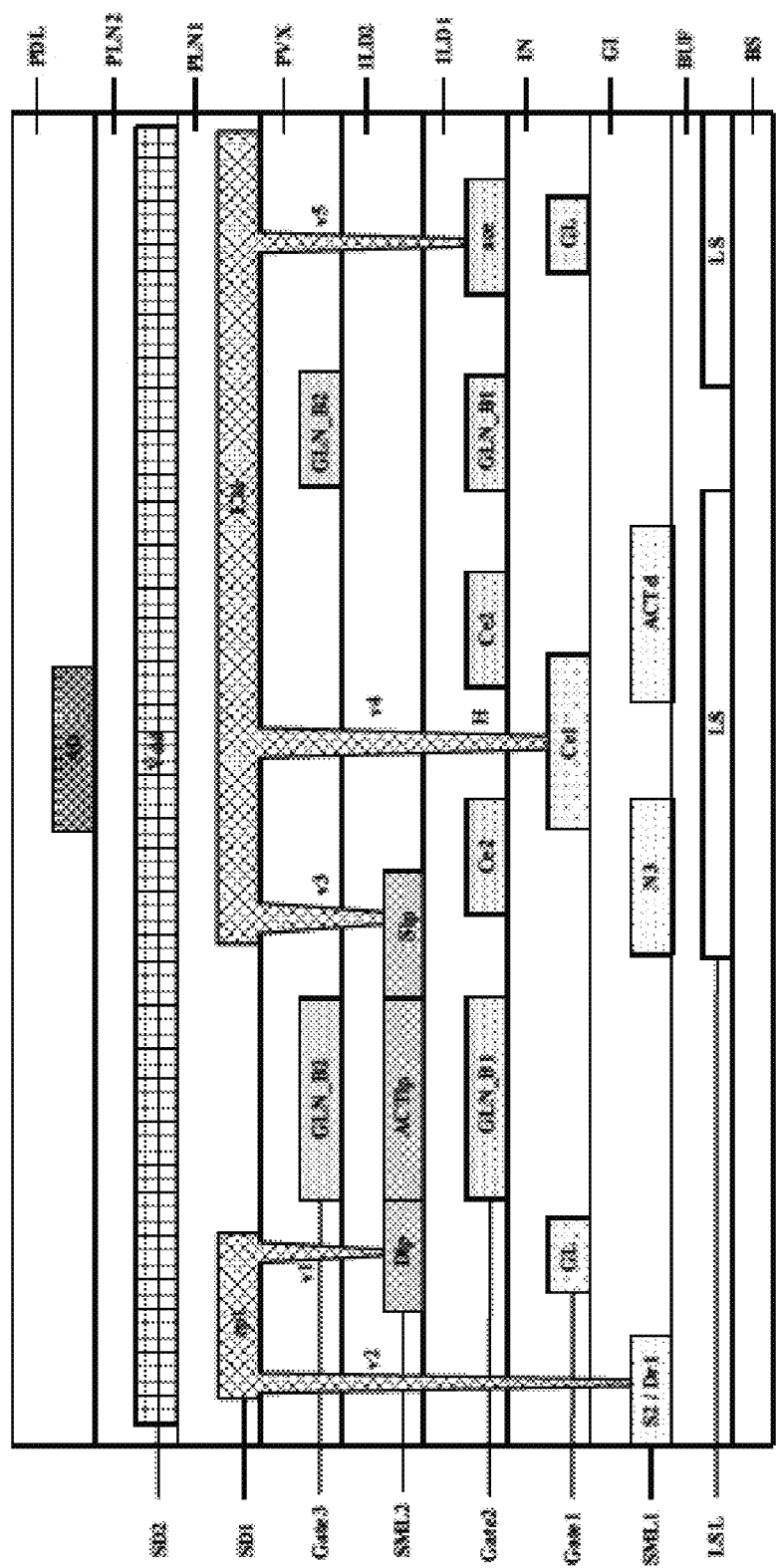
FIG. 4A is a cross-sectional view along an A-A' line in FIG. 3A.
Figure 4B:
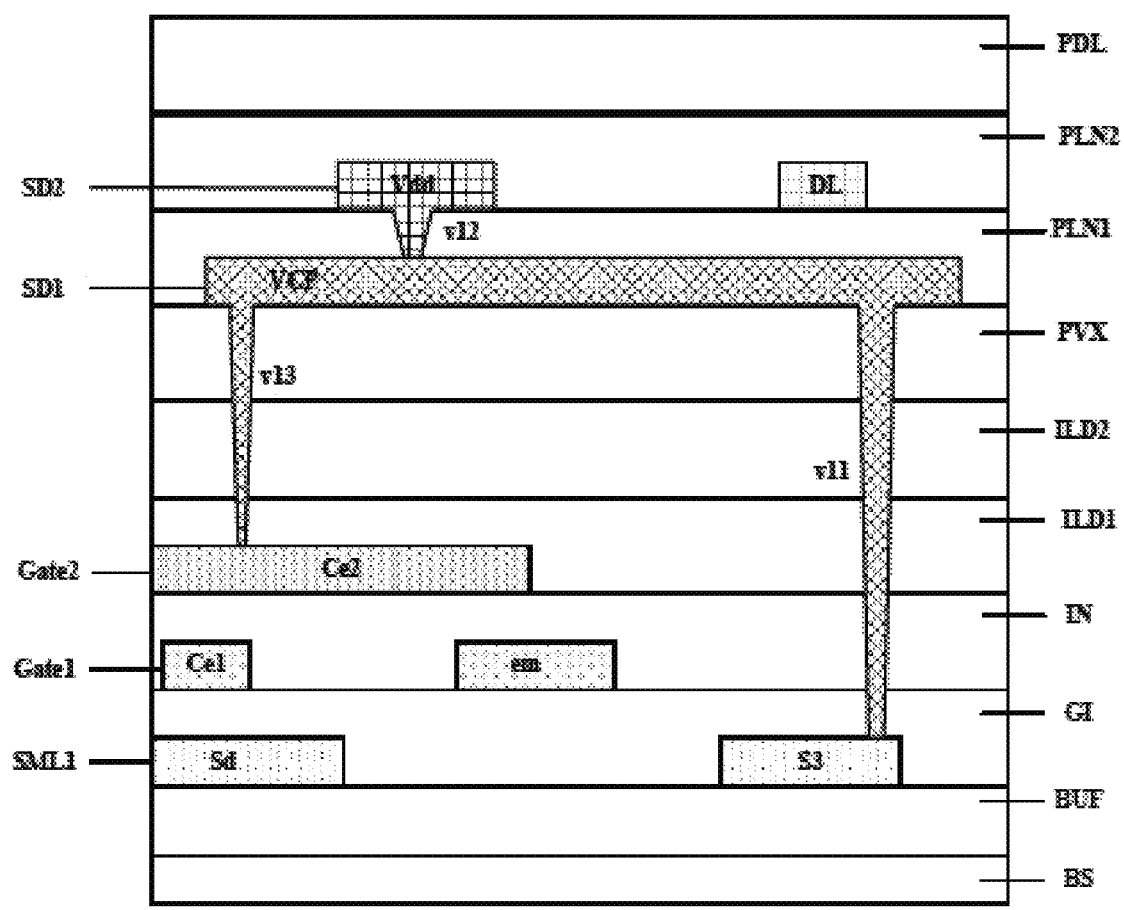
FIG. 4B is a cross-section al view along a B-B' line in FIG. 3A.
Figure 4C:
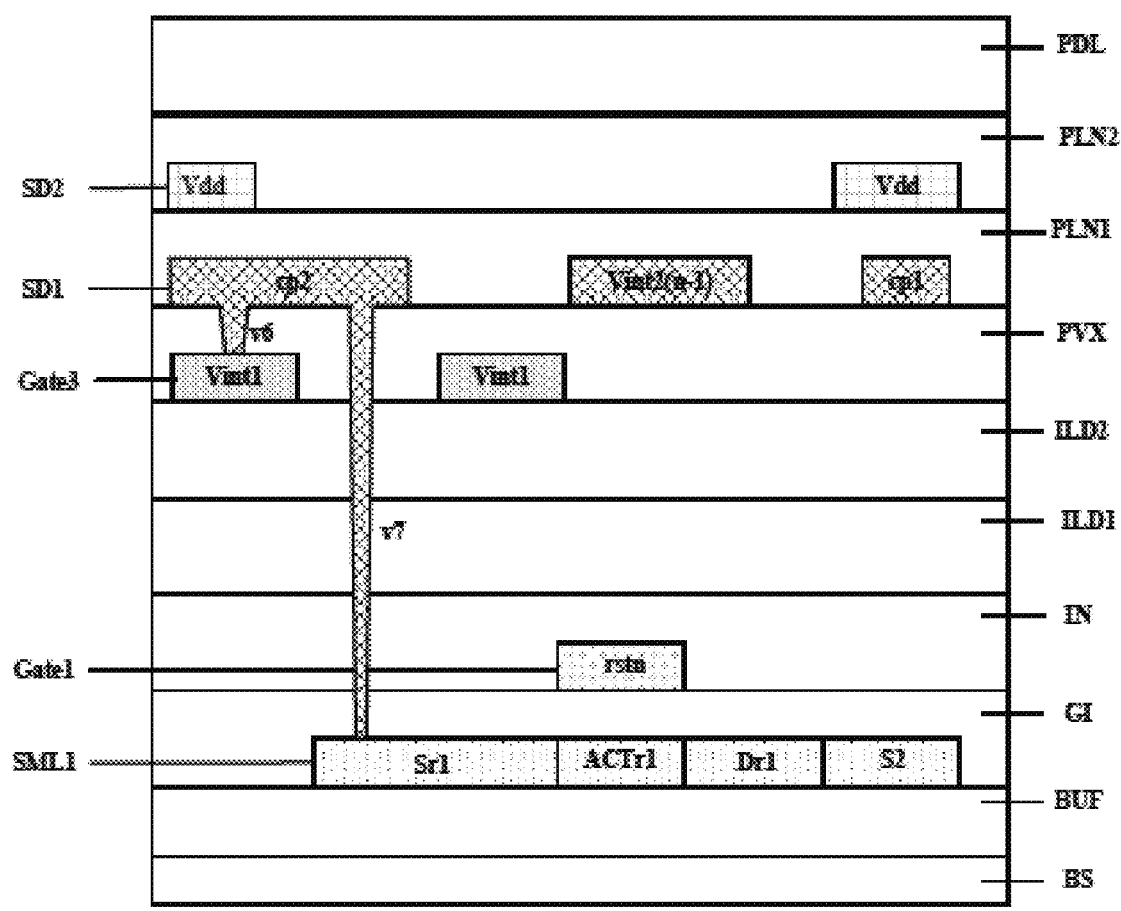
FIG. 4C is a cross-sectional view along a C-C' line in FIG. 3A.
Figure 4D:
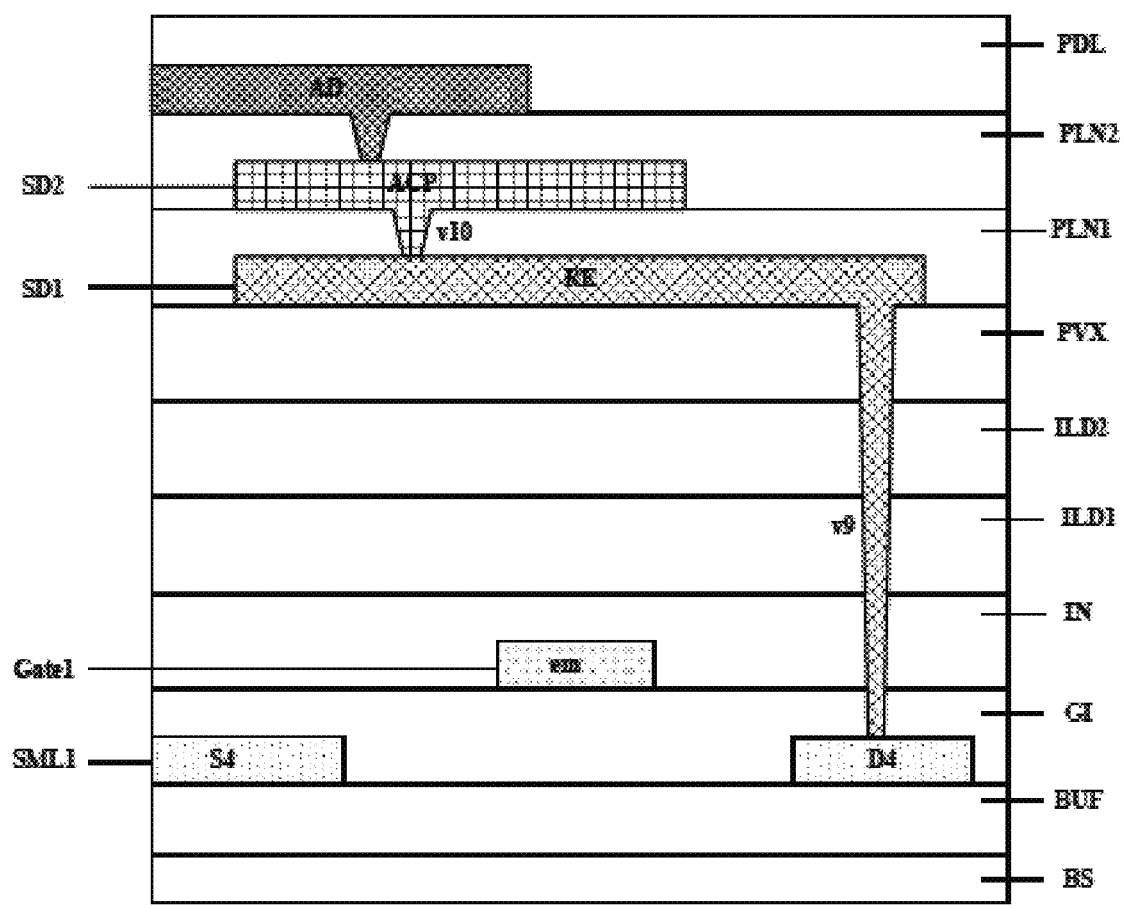
FIG. 4D is a cross-sectional view along a D-D' line in FIG. 3A.
Figure 4E:
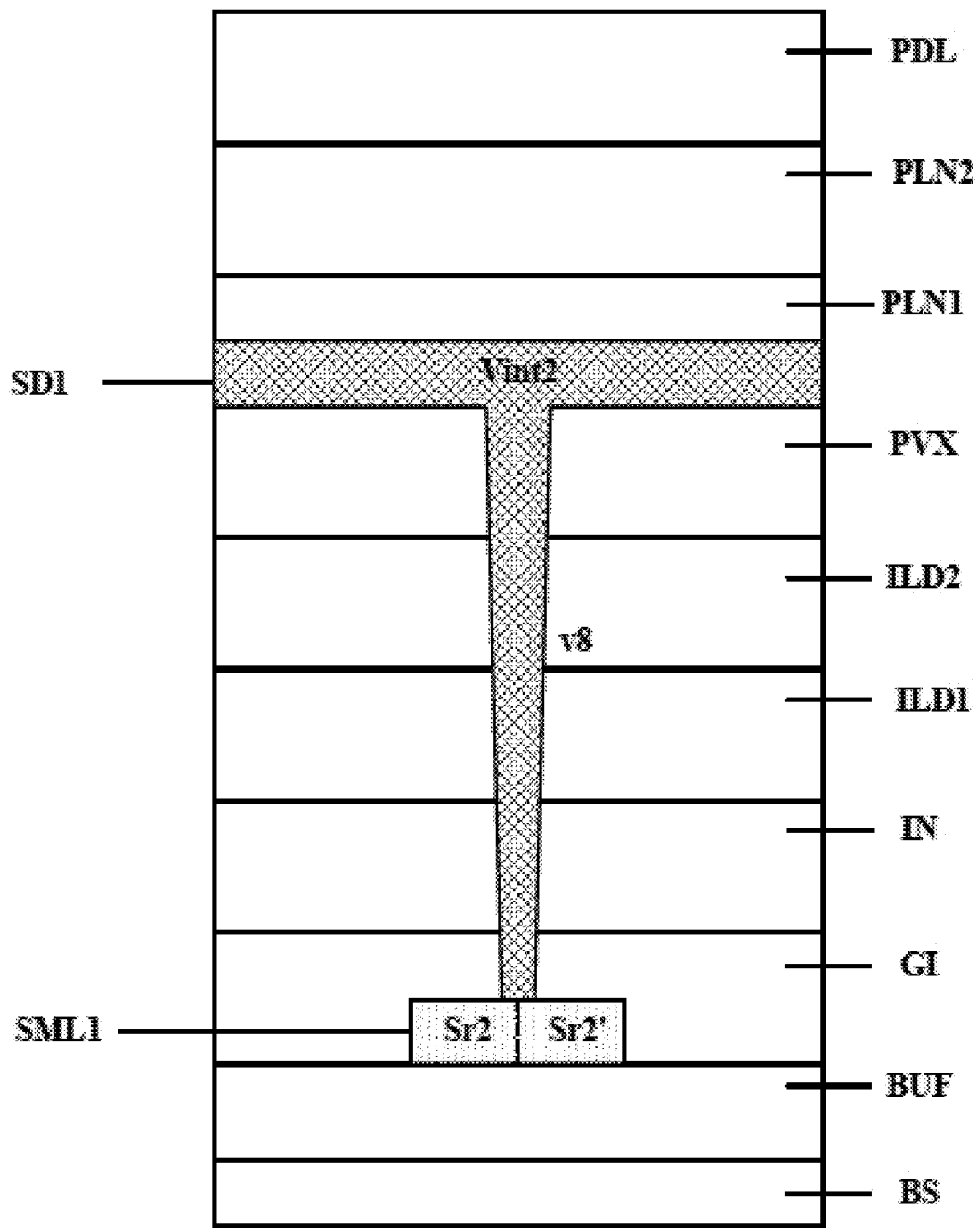
FIG. 4E is a cross-sectional view along a E-E' line in FIG. 34.

FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. FIG. 4E is a cross-sectional view along a E-E' line in FIG. 3A.

Referring to FIG. 3A to FIG. 3P, and FIG. 4A to FIG. 4E, is some embodiments, corresponding layers of a first pixel driving circuit and corresponding layers of a second pixel driving circuit directly adjacent to each other and in the present stage have a substantially mirror symmetry with respect to each other, e.g., shout a plane perpendicular to a main surface of the array substrate and substantially parallel to the data lines in FIG. 3A.

Referring to FIG. 3A to FIG. 3P, and FIG. 4A to FIG. 4E, in some embodiments, the array substrate includes a base substrate BS, a light shield layer LSL on the base substrate BS, a buffer layer BUF on a side of the light shield layer LSL away from the base substrate BS, a first semiconductor material layer SML1 on a side of the buffer layer BUF away from the base substrate BS, a gate insulating layer GI on a side of the first semiconductor material layer SML1 away from the base substrate BS, a first conductive layer Gate1 on a side of the gate insulating layer GI away from the first semiconductor material layer SML1, an insulating layer IN on a side of the first conductive layer Gate1 away how the gate insulating layer GI, a second conductive layer Gate2 on a side of the insulating layer IN away from the first conductive layer Gate1, a first inter-layer dielectric layer ILD1 on a side of the second conductive layer Gate1 away from the insulating layer IN, a second semiconductor material layer SML2 on a side of the first inter-layer dielectric layer ILD1 away from the second conductive layer Gate2, a second inter-layer dielectric layer ILD2 on a side of the second semiconductor material layer SML2 away from the first inter-layer dielectric layer ILD1, a third conductive layer Gate3 on a side of the second inter-layer dielectric layer ILD2 away from the second semiconductor material layer SML2, a passivation layer PVX on a side of the third conductive layer Gate3 away from the second inter-layer dielectric layer ILD2, a first signal line layer SD1 on a side of the passivation layer PVX away from the third conductive layer Gate3, a first planarization layer PLN1 on a side of the first signal line layer SD1 away from the passivation layer PVX, a second signal line layer SD2 on a side of the first planarization layer PLN1 away from the first signal line layer SD1, a second planarization layer PLN2 on a side of the second signal line layer SD2 away from the first planarization layer PLN1, ax anode layer AD on a side of the second planarization layer PLN2 away from the second signal line layer SD2, and a pixel definition layer PDL on a side of the anode layer AD away from the second planarization layer PLN2.

Referring to FIG. 2, FIG. 3A, FIG. 3B, and FIG. 4A to FIG. 4E, is souse embodiments, the light shield layer LSL includes a light shield LS. Various appropriate materials and various appropriate fabricating methods may be used for making the light shield layer LSL. For example, a metallic material may be deposited on the substrate by a plasma-enhanced chemical vapor deposition (PECVD) process. Examples of appropriate metallic materials for making the light shield layer LSL include, but are not limited to, aluminum chromium, tungsten titanium, tantalum, molybdenum, copper, and alloys or laminates containing the same.

Referring to FIG. 2, FIG. 3A, FIG. 3C, and FIG. 4A to FIG. 4E, is some embodiments, the first semiconductor material layer SML1 includes at least active layers of multiple transistors of the pixel driving circuit, including the first transistor T1, the second transistor T2, the third transistor 13, the fourth transistor T4, the first reset transistor Tr1, the second reset transistor Tr2, and the diving transistor Td Optionally, the first semiconductor material layer SML1 further includes at least respective portions of first electrodes of multiple transistors of the pixel driving circuit, including the first transistor T1, the second transistor T2, the third transistor T3, the fourth transistor 14, the first reset transistor Tr1, the second reset transistor Tr2, and the driving transistor Td. Optionally, the first semiconductor material layer SML1 further includes at least respective portions of second electrodes of multiple transistors of the pixel driving circuit, including the first transistor T1, the second transistor T2, the third transistor T3, the fourth transistor T4, the first reset transistor Tr1, she second reset transistor Tr2, and the driving transistor Td. Optionally, the first semiconductor material layer SML1 includes active layers, first electrodes, and second electrodes of multiple transistors of the pixel driving circuit, including the first transistor T1, the second transistor T2, the third transistor T3, the fourth transistor T4, the first reset transistor Tr1, she second reset transistor Tr2, and the driving transistor Td. Various appropriate semiconductor materials may be used for making the first semiconductor material layer SML1. Examples of the semiconductor materials for making the first semiconductor material layer SML1 include silicon-based semiconductor materials such as polycrystalline silicon single-crystal silicon, and amorphous silicon.

In FIG. 3C, the pixel driving circuit on the left is annotated with labels indicating components of each of multiple transistors (T1, T2, T3, T4, Tr1, Tr2, and Td) is the pixel driving circuit. For example, the first transistor T1 includes an active layer ACT1, a first electrode S1, and a second electrode D1. The second transistor T2 includes ax active layer ACT2, a first electrode S2, and a second electrode D2. The third transistor 13 includes am active layer ACT3, a first electrode S3, and a second electrode D3. The fourth transistor T4 includes an active layer ACT4, a first electrode S4, and a second electrode D4. The first reset transistor Tr1 includes an active layer ACTr1, a first electrode Sr1, and a second electrode Dr1. The second reset transistor Tr2 includes an active layer ACTr2, a first electrode Sr1, and a second electrode Dr2. The driving transistor Td includes an active layer ACTd, a first electrode Sd, and a second electrode Dd.

Optionally, the active layers (ACT1, ACT2, ACT3, ACT4, ACTr1, ACTr2, and ACTd), the first electrodes (S1, S2, S3, S4, Sr1, Sr2, and Sd), and the second electrodes (D1, D2, D3, D4, Dr1, Dr2, and Dd) of the respective transistors (T1, T2, 13, 14, Tr1, Tr2, and Td) are in a same layer.

In some embodiment, the active layers (ACT1, ACT2, ACT3, ACT4, ACTr1, ACTr2, and ACTd), the first electrodes (S1, S2, S3, S4, Sr1, Se2, and Sd), and the second electrodes (D1, D2, D3, D4, Dr1, Dr2, and Dd) of the respective transistors (T1, T2, T3, T4, Tr1, Tr2, and Td) in the pixel driving circuit are parts of a unitary structure.

Referring to FIG. 3C, second reset transistors (e.g., Tr2) respectively from a first pixel driving circuit and a second pixel driving circuit directly adjacent to each other and in the present stage form a unitary structure. In owe example, first electrodes (e.g., Sr2) of the second reset transistors (e.g., Tr2) respectively from the first pixel driving circuit and the second pixel driving circuit directly adjacent to each other and is the present stage are directly connected to each other, thereby forming the unitary structure. Referring to FIG. 4E, the respective second reses signal line Vint2 is connected to a unitary structure comprising the first electrode Sr2 of the second reset transistor Tr2 and a first electrode Sr2' of a second reset transistor in an adjacent pixel driving circuit through an eighth via v8 extending through the passivation layer PVX, the second inter-layer dielectric layer ILD2, the first inter-layer dielectric layer ILD1, the insulating layer IN, and the gate insulating layer GI. Referring to FIG. 3C and FIG. 4E, au orthographic projection of the respective second reset signal line Vint2 on the base substrate BS at least partially overlaps with an orthographic projection of the unitary structure on the base substrate BS.

Referring to FIG. 2, FIG. 3A, FIG. 3D, and FIG. 4A to FIG. 4E, in some embodiments, the first conductive layer Gate1 in some embodiments includes a plurality of fast gate lines (e.g., a respective first gate line GL), a plurality of light emitting control signal lines (e.g., a respective light emitting control signal line em), a plurality of reset control signal lines (e.g., a respective reset control signal line rstn in a present stage, a respective reset control signal line rst(n+1) in a next stage), and a first capacitor electrode Ce1 of the storage capacitor Cst. Various appropriate electrode materials and various appropriate fabricating methods may be used to make the first conductive layer Gate1. For example, a conductive material may be deposited on the substrate by a plasma-enhanced chemical vapor deposition (PECVD) process and patterned Examples of appropriate conductive materials for making the first conductive layer Gate1 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first gate lines (e.g., the respective first gate line GL), the plurality of light emitting control signal lines (e.g., the respective light emitting control signal line em), the plurality of reset control signal lines (e.g., the respective reset control signal line rstn in a present stage, the respective reset control signal line rst(n+1) in a next stage), and the first capacitor electrode Ce1 of the storage capacitor Cst are is a same layer.

As used herein, the term "same layer" refers to the relationship between the layers simultaneously formed in the same step. In one example, the plurality of first gate lines and the first capacitor electrode Ce1 are in a same layer when they are formed as a result of one or more steps of a same patterning process perfumed in a same layer of material. In another example, the plurality of first gate lines and the first capacitor electrode Ce1 can be formed in a sane layer by simultaneously performing the step of forming the plurality of first gate lines, and the step of forming the first capacitor electrode Ce1. The term "same layer" does not always mean that the thickness of the layer or the height of the layer in a cross-sectional view is the same.

Referring to FIG. 2, FIG. 3A, FIG. 3E, and FIG. 4A to FIG. 4E, in some embodiments, the second conductive layer Gate2 in some embodiments includes at least portions of a plurality of second gate lines (e.g., a first branch GLN_B1), as auxiliary capacitor electrode ace, and a second capacitor electrode Ce2 of the storage capacitor Cst. Various appropriate electrode materials and various appropriate fabricating methods may be used to make the second conductive layer Gate2. For example, a conductive material may be deposited ow the substrate by a plasma-enhanced chemical vapor deposition (PECVD) process and patterned Examples of appropriate conductive materials for making the second conductive layer Gate2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the at least portions of the plurality of second gate lines (e.g., the first branch GLN_B1), the auxiliary capacitor electrode ace, and the second capacitor electrode Ce2 of the storage capacitor Cst are in a same layer.

Referring to FIG. 2, FIG. 3A, FIG. 3F, and FIG. 4A to FIG. 4E, IN some embodiments, the second semiconductor material layer SML2 includes at least an active layer of the leakage preventing transistor T1$p$. Optionally, the second semiconductor material layer SML2 father includes at least a portion of a first electrode of the leakage preventing transistor T1$p$. Optionally, the second semiconductor material layer SML2 further includes at least a portion of a second electrode of the leakage preventing transistor T1$p$. Optionally, the second semiconductor material layer SML2 includes the active layer, the first electrode, and the second electrode of the leakage preventing transistor T1$p$. In the present array substrate, at least the active layer of the leakage preventing transistor T1$p$ is in a layer different from at least the active layers of other transistors of the pixel driving circuit. Various appropriate semiconductor materials may be used for making the second semiconductor material layer SML2. Examples of the semiconductor materials for making the second semiconductor material layer SML2 include metal oxide-based semiconductor material such as indium gallium zinc oxide and metal oxynitride-based semiconductor materials such as sine oxynitride.

In FIG. 3F, the pixel driving circuit ow the left is annotated with labels indicating components of the leakage preventing transistor T1$p$ in the pixel driving circuit. For example, the leakage preventing transistor T1$p$ includes an active layer ACT1$p$, a first electrode S1$p$, and a second electrode D1$p$. Optionally, the active layer ACT1$p$, the first electrode S1$p$, and the second electrode D1$p$ of the leakage preventing transistor T1$p$ are in a same layer. Referring to FIG. 3A, FIG. 3C, FIG. 3F, and FIG. 4A to FIG. 4E, an active layer ACTd of the driving transistor Td and an active layer ACT1$p$ of the leakage preventing transistor T1$p$ are spaced apart from each other by at least an insulating layer IN; the active layer ACTd of the diving transistor Td includes a first semiconductor material; and the active layer ACT1$p$ of the leakage preventing transistor T1$p$ includes a second semiconductor material different from the first semiconductor material.

Referring to FIG. 2, FIG. 3A, FIG. 3G, and FIG. 4A to FIG. 4E, in some embodiments, the third conductive layer Gate3 is some embodiments includes at least portions of a plurality of second gate lines (e.g., a second branch GLN_B2), and a plurality of first reset signal lines (e.g., a respective first reset signal line Vint1 in a present stage and a respective fast reset signal line Vint1 (n+1) in a next stage). Various appropriate electrode materials and various appropriate fabricating methods may be used to make the third conductive layer Gate3. For example, a conductive material may be deposited on the substrate by a plasma-enhanced chemical vapor deposition (PECVD) process and patterned. Examples of appropriate conductive materials for making the third conductive layer Gate3 prelude, but are not limited to, aluminum, copper, molybdenum, chromium, aluminum copper alloy, copper molybdenum alloy, molybdenum aluminum alloy, aluminum chromium alloy, copper chromium alloy, molybdenum chromium soy, copper molybdenum aluminum alloy, and the like. Optionally, the at least portions of a plurality of second gate lines (e.g., the second branch GLN_B2), and the plurality of first reset signal lines (e.g., the respective first reset signal line Vint1 in the present stage and the respective first reset signal line Vint1 (n+1) in the next stage) are in a same layer.

Figure 9A:
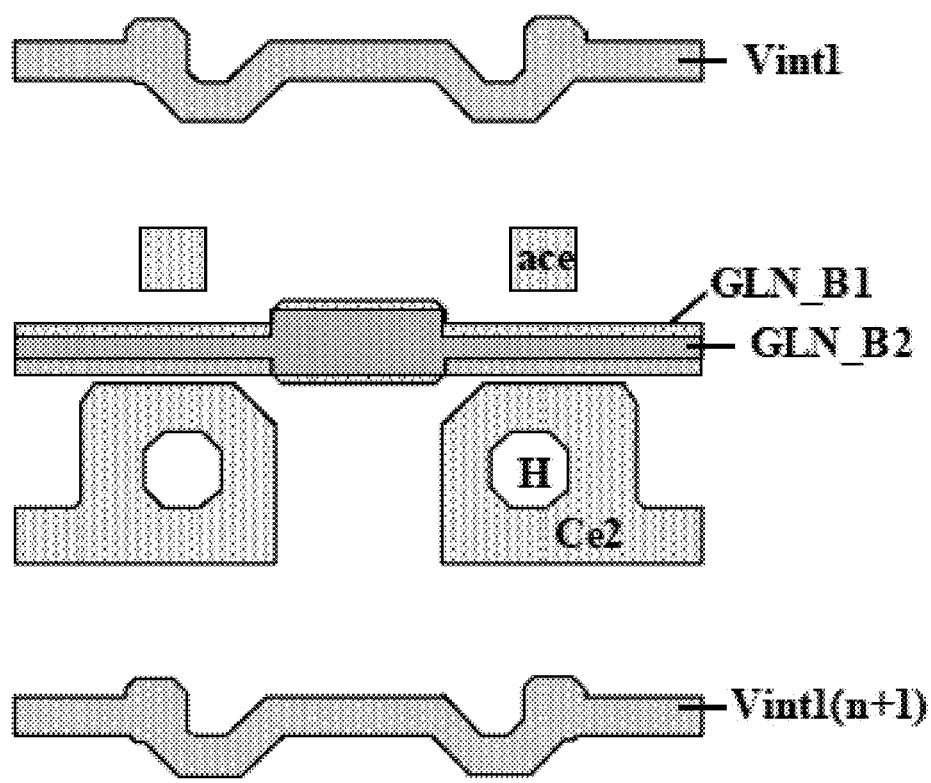
FIG. 9A is s diagram illustrating the structure of a second conductive layer and a third conductive layer of two adjacent pixel driving circuits is an array substrate depicted in FIG. 3A.

FIG. 9A is s diagram illustrating the structure of a second conductive layer and a third conductive layer two adjacent pixel driving circuits in an array substrate depicted in FIG. 3A. In some embodiments, referring to FIG. 9A, the respective second gate line GLN includes the fast branch GLN_B1 and the second branch GLN_B2 in two different layers. Optionally, the fast branch GLN_B1 is in the second conductive layer Gate2, and the second branch GLN_B2 is in the third conductive layer Gate3. As shown in FIG. 3A and FIG. 4A, in some embodiments, an orthographic projection of the first branch GLN_B1 on a base substrate BS at least partially overlaps with an orthographic projection of the second branch GLN_B2 on the base substrate BS.

Referring to FIG. 2, FIG. 3A, FIG. 3J, and FIG. 4A to FIG. 4E, in some embodiments, the first signal line layer SD1 includes a plurality of second reset signal lines (e.g., a respective second reset signal line Vint2 is a present stage and a respective second reset signal line Vint2 (n–1) in s previous stage), a node connecting line Cln, a first connecting pad cp1, a second connecting pad cp2, a voltage connecting pad VCP, and a relay electrode RE. Various appropriate conductive materials and various appropriate fabricating methods may be used to make the first signal line layer SD1. For example, a conductive material may be deposited ow the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of second reset signal lines (e.g., the respective second reset signal line Vint2 in the present stage and the respective second reset signal line Vint2 (n−1) in the previous stage), the node connecting line Cln, the first connecting pad cp1, the second connecting pad cp2, the voltage connecting pad VCP, and the relay electrode RE are in a same layer. By having the plurality of first reset signal line Vint1 and the plurality of second reset signal lines Vint2, the first reset transistor Tr1 and the second reset transistor 712 can be separately connected to different reset signal lines. By having this unique structure, a reference voltage level at the anode of the respective light emitting element can be further stabilized, greatly enhancing brightness uniformity among different periods of a frame of image.

In some embodiments, the node connecting line Cln connects various components of the pixel driving circuit to the node N1. Referring to FIG. 4A, the node connecting line Cln connects the first electrode S1$p$ of the leakage preventing transistor T1$p$ to the first capacitor electrode Ce1, which functions as a gate electrode of the driving transistor Td. The node connecting line Cln is connected to the first electrode S1$p$ of the leakage preventing transistor T1$p$ through a third via v3 extending through the passivation layer PVX and the second inter-layer dielectric layer ILD2. The node connecting line Cln is connected to the first capacitor electrode Ce1 through a fourth via v4 extending through the passivation layer PVX, the second inter-layer dielectric layer ILD2, the first inter-layer dielectric layer ILD1, and the insulating layer IN. The code connecting line Cln is connected to the auxiliary capacitor electrode ace through a fifth via v5 extending through the passivation layer PVX, the second inter-layer dielectric layer ILD2, and the first inter-layer dielectric layer ILD1.

Referring to FIG. 2, FIG. 3A, FIG. 3D, FIG. 44, FIG. 4B, FIG. 4C, and FIG. 6, in some embodiments, in a hole region H, a portion of the second capacitor electrode Ce2 is absent. Optionally, an orthographic projection of the second capacitor electrode Ce2 on a base substrate BS substantially covers an orthographic projection of the first capacitor electrode Ce1 on the base substrate BS except for a hole region H in which a portion of the second capacitor electrode Ce2 is absent. In one example, the orthographic projection of the second capacitor electrode Ce2 on the base substrate BS completely covers, with a margin, the orthographic projection of the first capacitor electrode Ce1 on the base substrate BS except for the hole region H in which a portion of the second capacitor electrode Ce2 is absent. Optionally, the fifth via v5 extends through the passivation layer PVX, the second inter-layer dielectric layer ILD2, the first inter-layer dielectric layer ILD1, the hole region H, and the insulating layer IN.

Figure 5A:
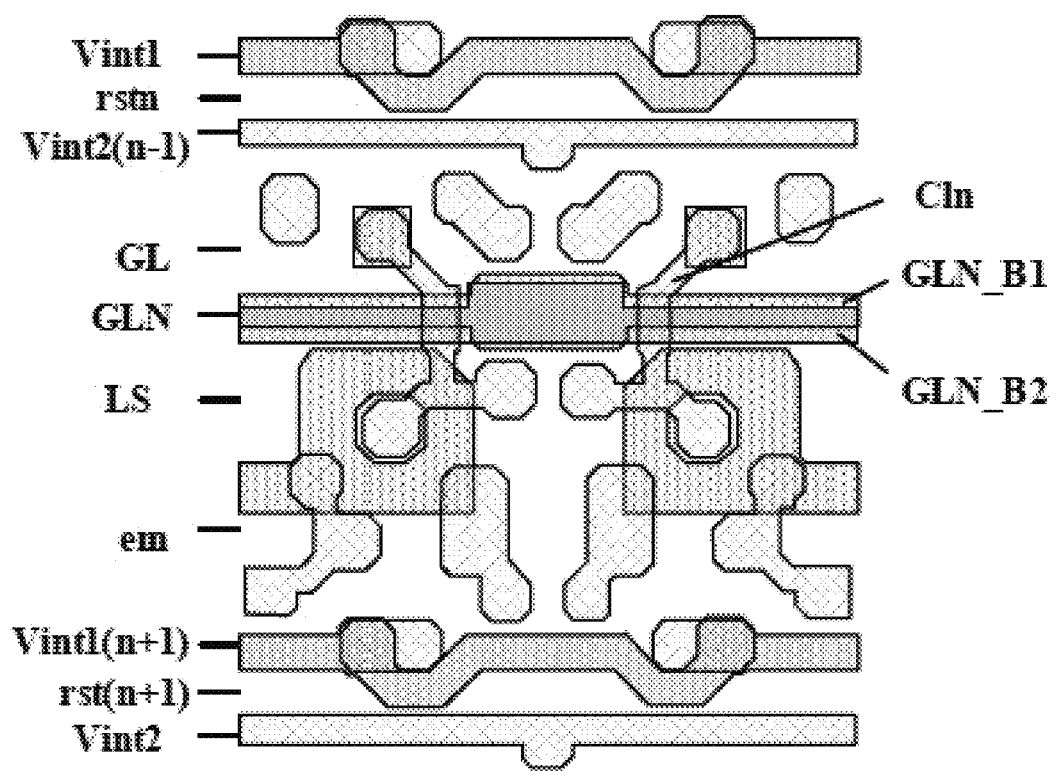
FIG. 5A is a diagram illustrating the structure of a second conductive layer, a third conductive layer, and a fast signal line layer of two adjacent pixel driving circuits in an array substrate depicted in FIG. 3A.

In some embodiments, referring to FIG. 3A, FIG. 3E, FIG. 3G, FIG. 3J, and FIG. 4A, the node connecting line Cln crosses over the respective second gate line GLN in the present stage. FIG. 5A is a diagram illustrating the structure of a second conductive layer, a surd conductive layer, and a first signal line layer of two adjacent pixel driving circuits in an array substrate depicted in FIG. 3A. As shown in FIG. 54, the node connecting line Cln crosses over the first branch GLN_B1 in the second conductive layer Gate2, and the second branch GLN_B2 in the third conductive layer Gate3.

Figure 5B:
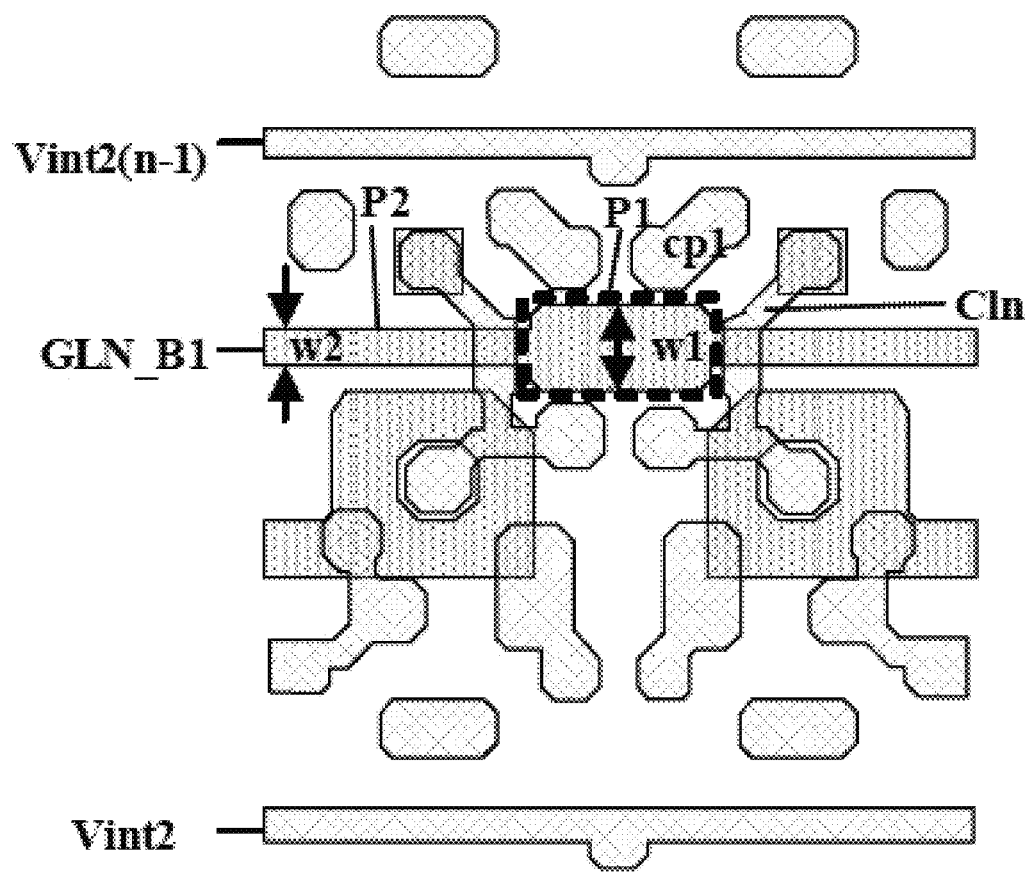
FIG. 5B is a diagram illustrating the structure of a second conductive layer and a first signal line layer of two adjacent pixel driving circuits in an array substrate depleted in FIG. 3A.

FIG. 58 is a diagram illustrating the structure of a second conductive layer and a first signal line layer of two adjacent pixel driving circuits in an array substrate depicted in FIG. 3A. Referring to FIG. 5B, the first branch GLN_B1 includes a first portion P1 in a region surrounded by node connecting lines respectively from two directly adjacent pixel driving circuits and in a same stage (e.g., the present stage) and first connecting pads respectively from the two directly adjacent pixel driving circuits and in the same stage (e.g., the present stage), and a second portion P2 outside the region surrounded by node connecting lines respectively from two directly adjacent pixel diving circuits and in a same stage (e.g., the present stage) and first connecting pads respectively from the two directly adjacent pixel driving circuits and in the same stage (e.g., the present stage). Referring to FIG. 3A, FIG. 3F, FIG. 4A, and FIG. 5B, the first portion P1 is a portion of the first branch GLN_B1 what crosses over active layers respectively of leakage preventing transistors respectively from two directly adjacent pixel driving circuits and is a same stage (e.g., the present stage). In some embodiments, the first portion P1 has a first average width w1 along a direction perpendicular to an extension direction of the first branch GLN_B1; the second portion P2 has a second average width w2 along the direction perpendicular to the extension direction of the first branch GLN_B1; and the first average width w1 is greater than the second average width w2.

Figure 5C:
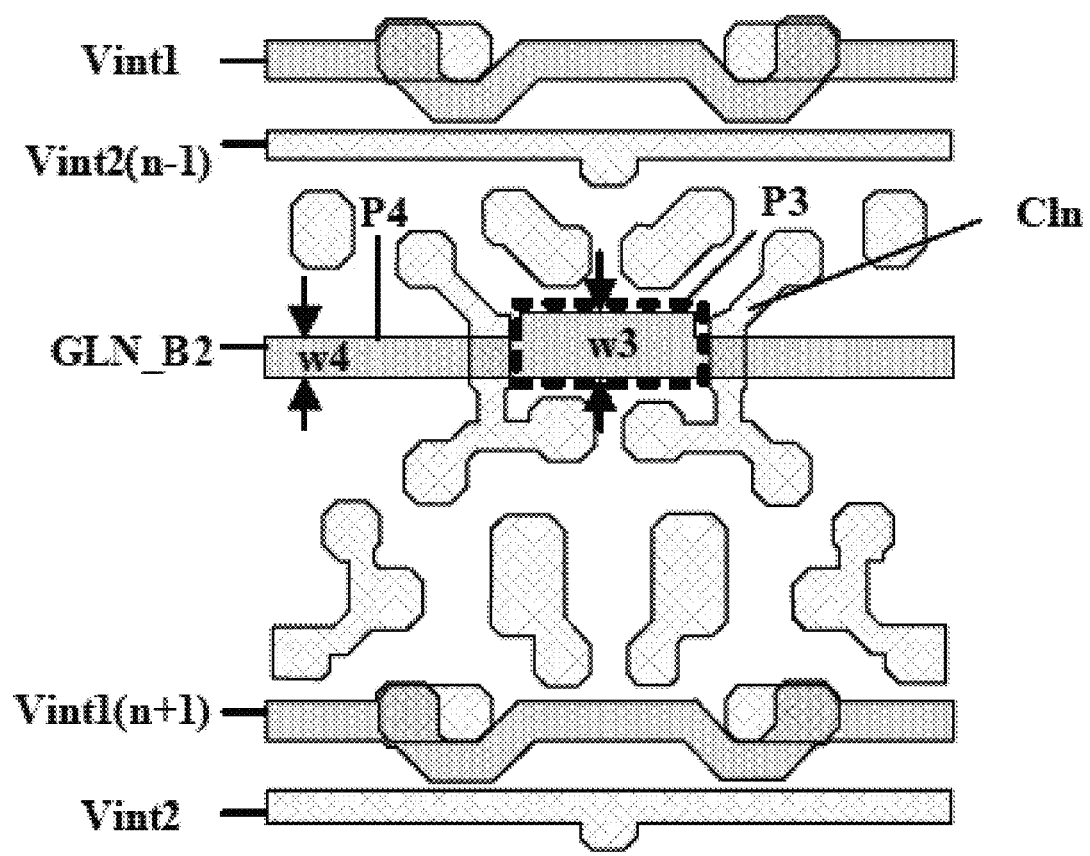
FIG. 5C is a diagram illustrating the structure of a third conductive layer and a first signal line layer of two adjacent pixel driving circuits in an array substrate depicted in FIG. 3A.

FIG. 5C is a diagram illustrating the structure of a third conductive layer and a first signal line layer of two adjacent pixel driving circuits in an array substrate depicted in FIG. 3A. Referring to FIG. 5C, the second branch GLN_B2 includes a third portion P3 in a region surrounded by node connecting lines respectively from two directly adjacent pixel driving circuits and in a same stage (e.g., the present stage) and first converting pads respectively from the two directly adjacent pixel driving circuits and in the same stage (e.g., the present stage), and a fourth portion P4 outside the region surrounded by wade connecting lines respectively from two directly adjacent pixel driving circuits and is a same stage (e.g., the present stage) and first connecting pads respectively from the two directly adjacent pixel driving circuits and in the same stage (e.g., the present stage). Referring to FIG. 3A, FIG. 3F, FIG. 4A, and FIG. 5C, the third portion P3 is a portion of the second branch GLN_B2 that crosses over active layers respectively of leakage preventing transistors respectively from two directly adjacent pixel driving circuits and is a same stage (e.g., the present stage). In some embodiments, the third portion P3 has a third average width w3 along a direction perpendicular to an extension direction of the second branch GLN_B2; the fourth portion P4 has a fourth average width w4 along the direction perpendicular to the extension direction of the second branch GLN_B2; and the third average width w3 is greater than the fourth average width w4.

Referring to FIG. 2, FIG. 3A, FIG. 3M, and FIG. 4A to FIG. 4E, in some embodiments, the second signal line layer SD2 includes a plurality of voltage supply lines (e.g., the respective voltage supply line Vdd), a plurality of data lines (e.g., the respective data line DL), and as anode contact pad ACP. Various appropriate conductive materials and various appropriate fabricating methods may be used to make the second signal line layer SD2. For example, a conductive material may be deposited on the substrate by a plasma-enhanced chemical vapor deposition (PECVD) process and patterned. Examples of appropriate conductive materials for making the second signal line layer SD2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines (e.g., the respective voltage supply line Vdd), the plurality of data lines (e.g., the respective data line DL), and the anode contact pad ACP are is a same layer.

Referring to FIG. 2, FIG. 3A, FIG. 3J, and FIG. 4D, is some embodiments, the relay electrode RE is connected to the second electrode D4 of the fourth transistor 14 and the second electrode Dr2 of the second reset transistor Tr2 through a ninth via v9 extending through the passivation layer PVX, the second inter-layer dielectric layer ILD2, the first inter-layer dielectric layer ILD1, the insulating layer IN, and the gate insulating layer GI. An anode contact pad ACP is connected to the relay electrode RE through a tenth via v10 extending through the first planarization layer PLN1.

Referring to FIG. 2, FIG. 3A, FIG. 3J, and FIG. 4B, in some embodiments, the voltage connecting pad VCP is connected to the third transistor T3 (e.g., to the first electrode S3 of the third transistor T3) through an eleventh via v11 extending through the passivation layer PVX, the second inter-layer dielectric layer ILD2, the first inter-layer dielectric layer ILD1, the insulating layer IN, and the gate insulating layer GI. The respective voltage supply line Vdd of the plurality of voltage supply lines is connected to the voltage converting pad VCP through a twelfth via v12 extending through the first planarization layer PLN1. The voltage connecting pad VCP is connected to the second capacitor electrode Ce2 of the storage capacitor Cst through a fourteenth via v13 extending through the passivation layer PVX, the second inter-layer dielectric layer ILD1, and the first inter-layer dielectric layer ILD1.

Referring to FIG. 2, FIG. 3A, FIG. 3J, and FIG. 4E, in some embodiments, the respective second reset signal line Vint2 of a plurality of second reset signal lines is connected to the second reset transistor Tr2 (e.g., to the first electrode Sr2 of the second reset transistor Tr2) through an eighth via v8 extending through the passivation layer PVX, the second inter-layer dielectric layer ILD2, the fast inter-layer dielectric layer ILD1, the insulating layer IN, and the gate insulating layer GI. The respective second reset signal line Vint2 is connected to a unitary structure comprising the first electrode Sr1 of the second reset transistor Tr2 and a first electrode Sr2' of a second reset transistor in an adjacent pixel driving circuit through an eighth via v8 extending through the passivation layer PVX, the second inter-layer dielectric layer ILD2, the first inter-layer dielectric layer ILD1, the insulating layer IN, and the gate insulating layer GI.

Referring to FIG. 2, FIG. 3A, FIG. 3J, and FIG. 4C, in some embodiments, the second connecting pad cp2 connects the first electrode Sr1 of the first reset transistor Tr1 and a respective first reset signal line Vint1 of a plurality of first reset signal lines. The second connecting pad cp2 is connected to the respective first reset signal line Vint1 through a sixth via v6 extending through the passivation layer PVX, and is connected to a first electrode Sr1 of the first reset transistor Tr1 through a seventh vis v7 extending through the passivation layer PVX, the second inter-layer dielectric layer ILD2, the first inter-layer dielectric layer ILD1, she insulating layer IN, and the gate insulating layer GI.

Referring to FIG. 2, FIG. 3A, FIG. 3J, and FIG. 4A, is some embodiments, the first connecting pad cp1 connects the second electrode D1$p$ of the leakage preventing transistor T1$p$ and the second electrode Dr1 of the first reset transistor Tr1. The first connecting pad cp1 is connected to the second electrode D1$p$ of the leakage preventing transistor T1$p$ through a first via v1 extending through the passivation layer PVX and the second inter-layer dielectric layer ILD2, and is connected to the second electrode Dr1 of the first reset transistor Tr1 and the first electrode S2 of the second transistor T2 through a second via v2 extending through the passivation layer PVX, the second inter-layer dielectric layer ILD2, the first inter-layer dielectric layer ILD1, the insulating layer IN, and the gate insulating layer GI.

Referring to FIG. 2, FIG. 3A, FIG. 3O, and FIG. 4A to FIG. 4E, in some embodiments, the array substrate further includes an anode layer AD.

Referring to FIG. 2, FIG. 3A, FIG. 3P, and FIG. 4A to FIG. 4E, in some embodiments, the array substrate further includes a pixel definition layer PDL. The pixel definition layer PDL defines subpixel apertures SA, through which light emitting layers are respectively connected to anodes in respective pixel driving circuits.

Figure 6:
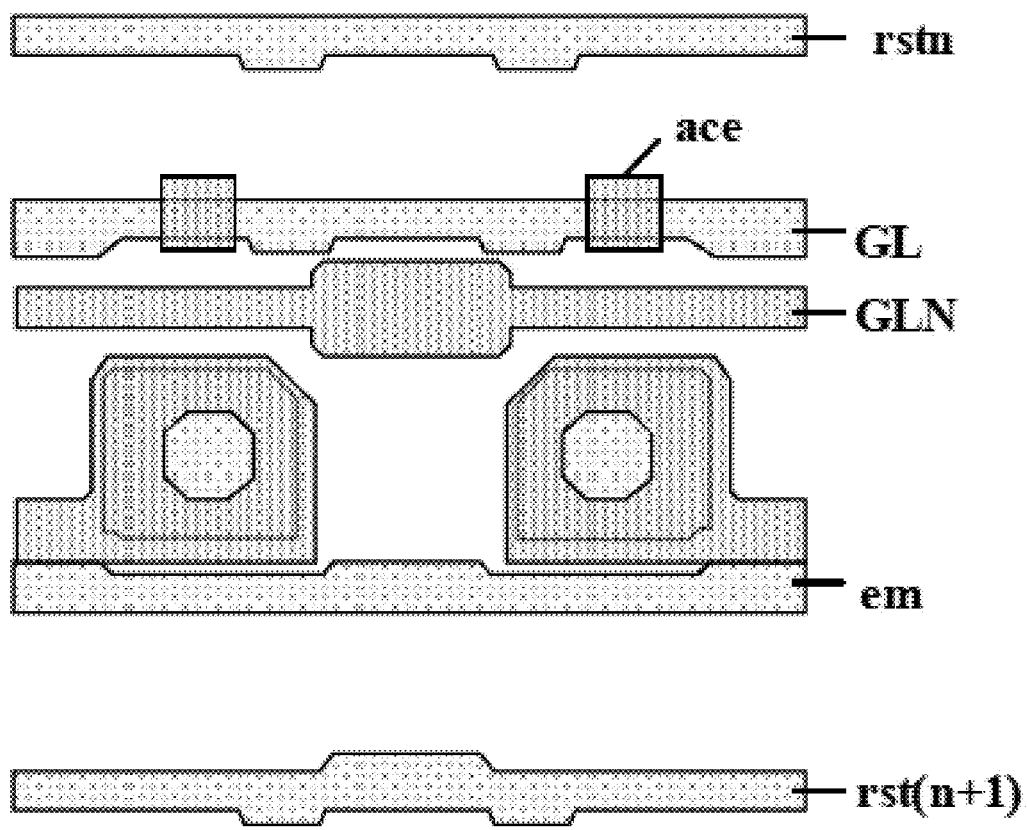
FIG. 6 is a diagram illustrating the structure of a first conductive layer and a second conductive layer of two adjacent pixel driving circuits is an array substrate depicted in FIG. 3A.

FIG. 6 is a diagram illustrating the structure of a first conductive layer and a second conductive layer of two adjacent pixel driving circuits in an array substrate depicted in FIG. 3A. Referring to FIG. 6, an orthographic projection of the auxiliary capacitor electrode ace on a base substrate at least partially overlaps with an orthographic projection of the respective first gate line GL on the base substrate. Referring to FIG. 2, the respective first gate line GL is connected to a gate electrode of a first transistor T1 and a gate electrode of a second transistor T2. Referring to FIG. 6, the array substrate further includes an auxiliary capacitor comprising the auxiliary capacitor electrode ace and a portion of a respective first gate line GL of a plurality of first gate lines. By having this unique structure forming the auxiliary capacitance, the data range of the respective pixel driving circuit can be further optimized. The auxiliary capacitor electrode ace is connected to the N1 mode of the respective pixel driving circuit. A rising edge of a gate driving signal passing through the respective first gate line GL can effectively boost a voltage level at the auxiliary capacitor electrode ace, thereby boosting a voltage level at the N1 node connected to the auxiliary capacitor electrode ace, suppressing a data voltage of a display panel is a dark state. Referring to FIG. 4A, optionally, the auxiliary capacitor further includes a portion of the light shield LS, and the auxiliary capacitance includes a fast auxiliary capacitance between the auxiliary capacitor electrode ace and the portion of the respective first gate line GL and a second auxiliary capacitance between the portion of the respective first gate line GL and the portion of the light shield LS. Optionally, the light shield LS is provided with a same voltage signal as the respective voltage supply line Vdd. In owe example, the light shield LS is electrically connected to a peripheral voltage supply line is a peripheral area of the array substrate, the peripheral voltage supply line being electrically connected to the plurality of voltage supply lines.

Referring to FIG. 44, in some embodiments, the auxiliary capacitor electrode ace and the portion of the respective first gate line GL are spaced apart by the insulating layer IN. The portion of the respective first gate line GL and the portion of the light shield LS are spaced apart by at least the gate insulating layer GI and the buffer layer BUF. A combined thickness of the gate insulating layer GI and the buffer layer BUF is much greater than a duchess of the insulating layer IN. Accordingly, the first auxiliary capacitance is much greater than the second auxiliary capacitance. Optionally, the second auxiliary capacitance is negligible.

Figure 7A:
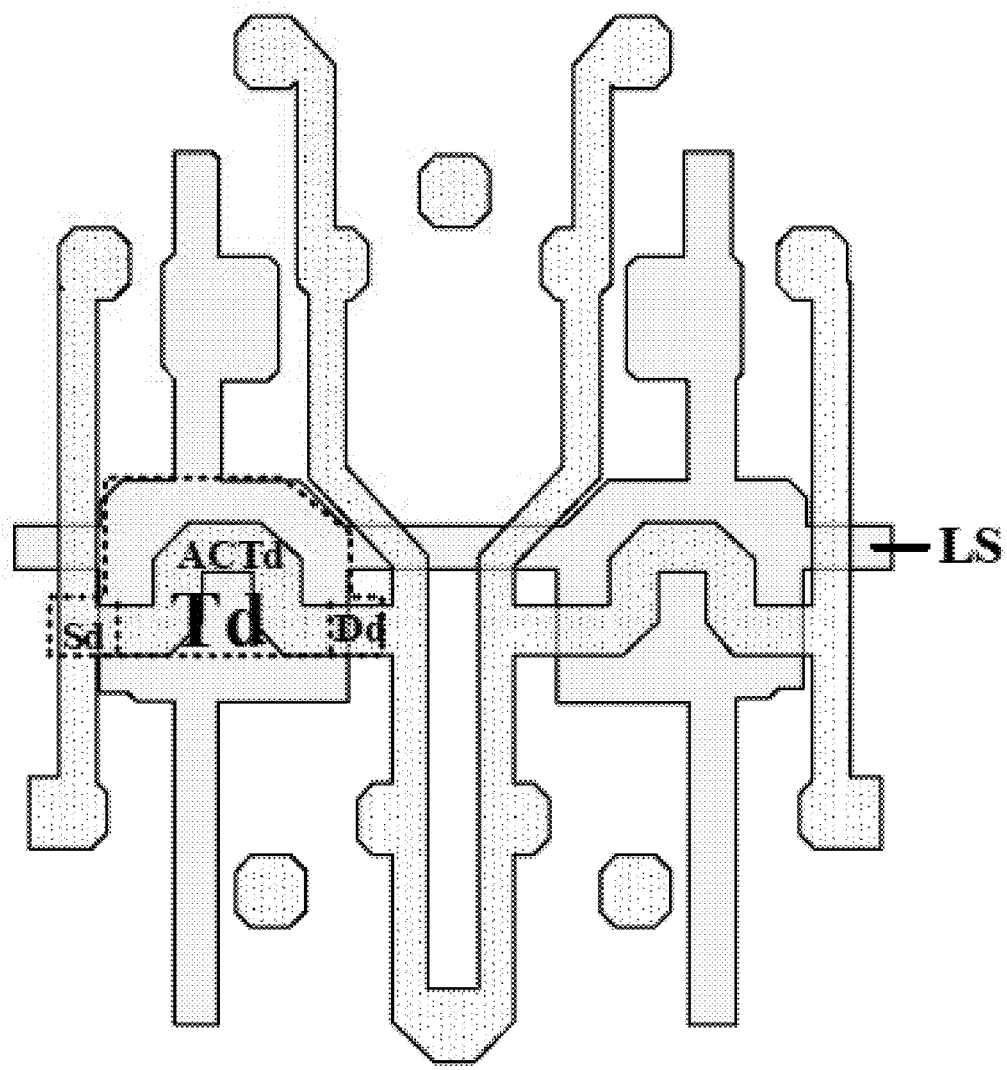
FIG. 7A is s diagram illustrating the structure of a first semiconductor material layer and a light shield layer of two adjacent pixel driving circuits in an array substrate depicted in FIG. 3A.

FIG. 7A is s diagram illustrating the structure of a first semiconductor material layer and a light shield layer of two adjacent pixel driving circuits in as array substrate depicted in FIG. 3A. Referring to FIG. 7A, in some embodiments, as orthographic projection of the light shield LS on a base substrate covers at least 50% (e.g., at least 55%, at least 60%, at least 65% at least 70%, at least 75%, at least 804%, at least 85%, at least 90%, at least 95%, at least 98%, at least 99%, or 100%) of an orthographic projection of an active layer ACTd of the driving transistor Td on the base substrate. By having this unique structure of the light shield LS at least partially covering the driving transistor Td, hysteresis characteristics of the diving transistor Td can be further improved, increasing a recovery rate of pixel brightness.

Figure 7B:
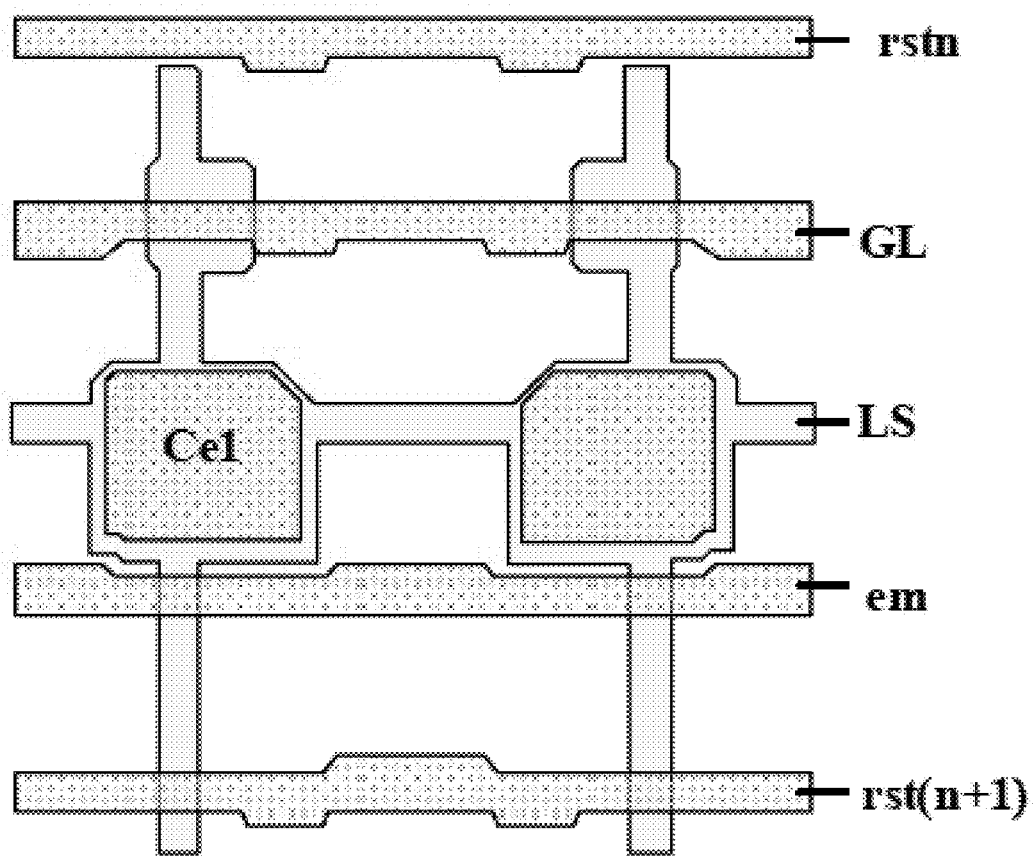
FIG. 7B is a diagram illustrating the structure of a first conductive layer and a light shield layer of two adjacent pixel driving circuits in an array substrate depicted in FIG. 3A.

FIG. 7B is a diagram illustrating the structure of a first conductive layer and a light shield layer of two adjacent pixel driving circuits in an array substrate depicted in FIG. 3A. Referring to FIG. 7B, in some embodiments, an orthographic projection of the light shield LS on a base substrate covers at least 50% (e.g., at least 55%, at least 60%, at least 65%, at least 70%, at least 75%, at least 80%, at least 85%, at least 90%, at least 95%, at least 98%, at least 99%, or 100%) of an orthographic projection of a first capacitor electrode Ce1 of the storage capacitor on the base substrate.

Figure 7C:
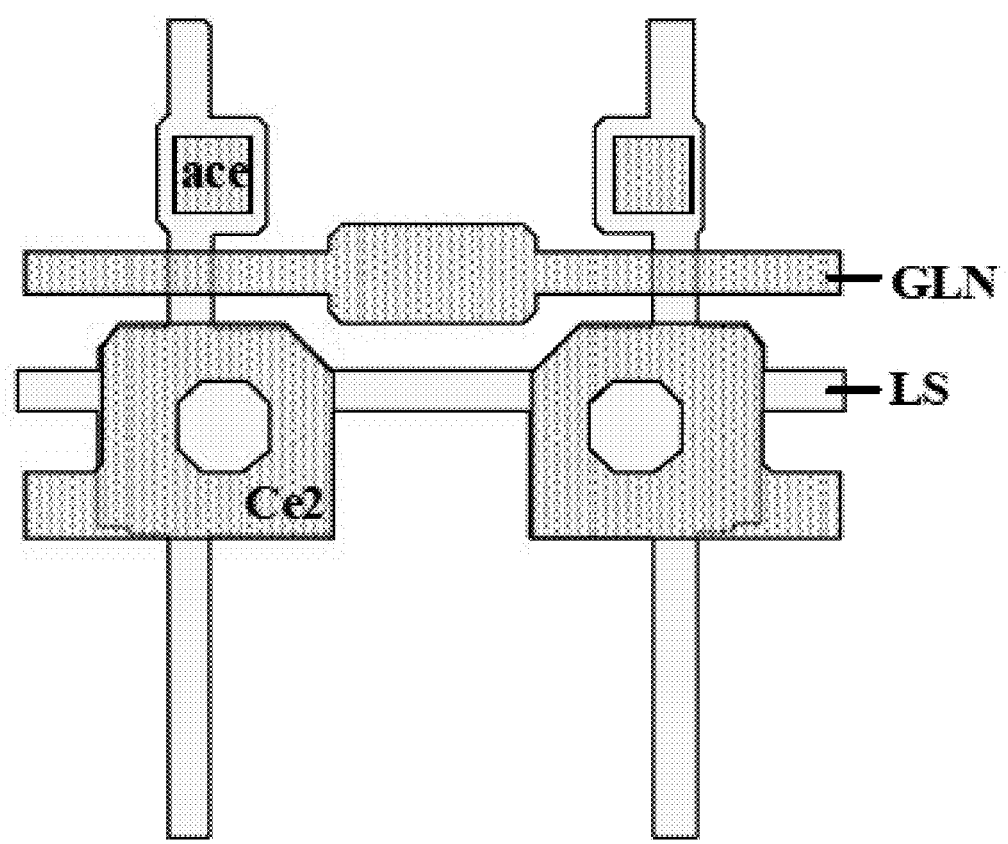
FIG. 7C is a diagram illustrating the structure of a second conductive layer and a light shield layer of two adjacent pixel driving circuits in an array substrate depicted in FIG. 34.

FIG. 7C is a diagram illustrating the structure of a second conductive layer and a light shield layer of two adjacent pixel driving circuits in an array substrate depicted in FIG. 3A. Referring to FIG. 7C, in some embodiments, an orthographic projection of the light shield LS on a base substrate covers at least 50% (e.g., at least 55%, at least 60%, at least 65%, at least 70%, at least 75%, at least 80%, at least $5%, at least 90%, at least 95%, at least 98%, at least 99%, or 100%) of an orthographic projection of a second capacitor electrode Ce2 of the storage capacitor on the base substrate. In some embodiments, she orthographic projection of the light shield LS on the base substrate covers at least 50% (e.g., at least 55%, at least 60%, at least 65%, at least 70%, at least 75%, at least 80%, at least 85%, at least 90%, at least 95%, at least 98%, at least 99%, or 100%) of an orthographic projection of an auxiliary capacitor electrode ace on the base substrate.

Figure 8A:
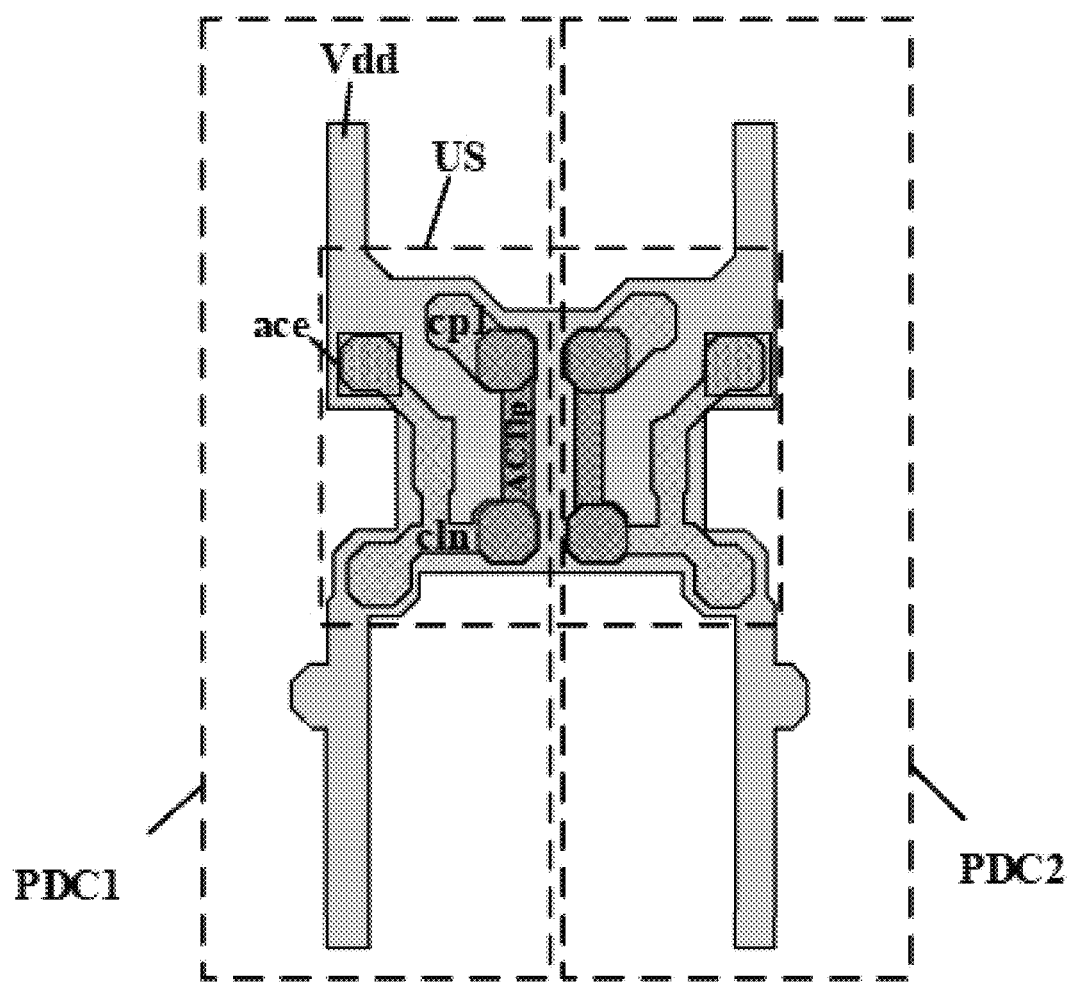
FIG. 8A is a diagram illustrating the structure of a node connecting line, a first connecting pad, an auxiliary capacitor electrode, a respective voltage supply line, and an active layer of a leakage preventing transistor of two adjacent pixel driving circuits in an array substrate depicted in FIG. 3A.

FIG. 8A is a diagram illustrating the structure of a node connecting line, a first connecting pad, an auxiliary capacitor electrode, a respective voltage supply line, and an active layer of a leakage preventing transistor of two adjacent pixel driving circuits in an array substrate depicted in FIG. 3A. Referring to FIG. 8A, in some embodiments, an orthographic projection of the respective voltage supply line Vdd on a base substrate covers at least 50% (e.g., at least 55%, at least 60%, at least 65%, at least 70%, at least 75%, at least 80%, at least 85%, at least 50%, at least 95%, at least 98%, at least 99%, or 100%) of an orthographic projection of the active layer ACT1p of the leakage preventing transistor or the base substrate. By having this unique structure, light irradiation on the active layer ACT1p of the leakage preventing transistor can be prevented.

Figure 9B:
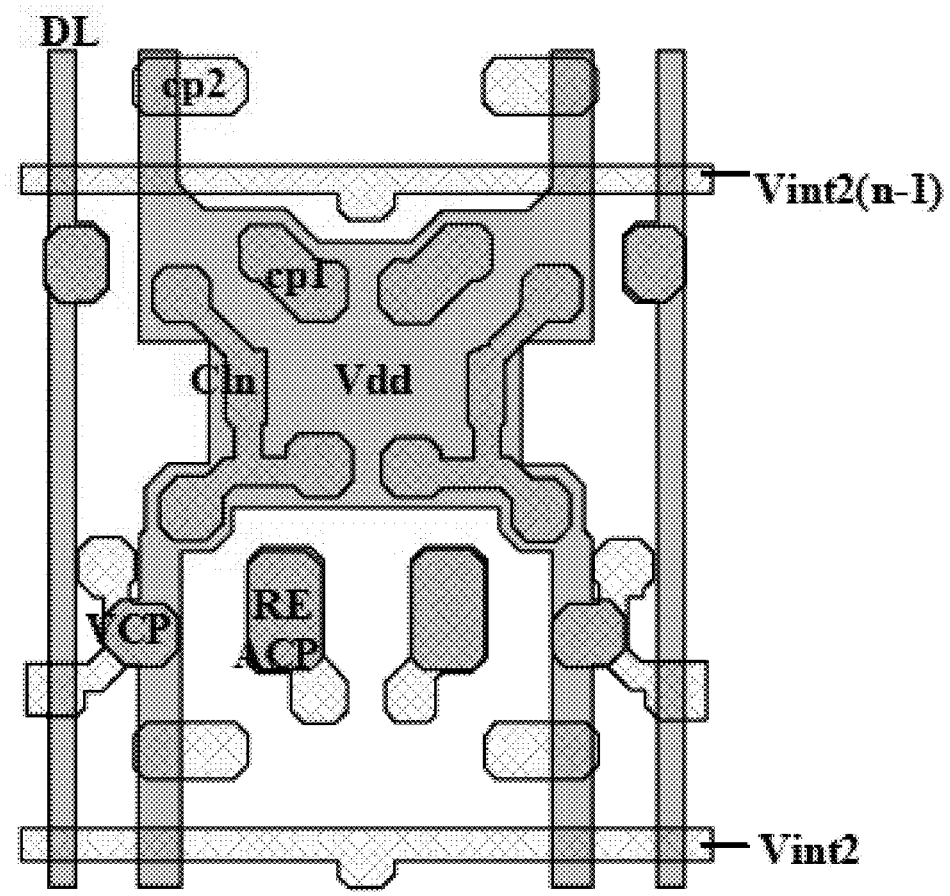
FIG. 9B is a diagram illustrating the structure of a first signal line layer and a second signal line layer of two adjacent pixel diving circuits in an array substrate depicted in FIG. 3A.

In some embodiments, the orthographic projection of the respective voltage supply line Vdd on the base substrate covers at least 50% (e.g., at least 55%%, at least 60%, at least 65%; at least 70%, at least 75%, at least 805%, at least 85%, at least 90%, at least 95%, at least 98%, at least 99%, or 100%) of an orthographic projection of the node connecting line Cln on the base substrate. FIG. 9B is a diagram illustrating the structure of a first signal line layer and a second signal line layer two adjacent pixel driving circuits in an array substrate depicted in FIG. 3A. Referring to FIG. 9B, at least a portion of the respective voltage supply line Vdd and at least a portion of the node connecting line Cln have conforming contours. In regions where they have conforming contours, edges of the respective voltage supply line Vdd and the node connecting line Cln are spaced apart from each other by a distance less than 3 μm.

In some embodiments, the orthographic projection of the respective voltage supply line Vdd on the base substrate covers at least 10% (e.g., at least 559%, at least 60%, at least 65%, at least 70%, at least 75%, at least 80%, at least 85%, at least 90%, at least 95%, at least 98%, at least 99%, or 100%) of an orthographic projection of the first connecting pad cp1 on the base substrate. In some embodiments, the orthographic projection of the respective voltage supply line Vdd on the base substrate covers at least 50% (e.g., at least 55%, at least 60%, at least 65% at least 70%, at least 75%, at least 80%, at least 85%, at least 90%, at least 95%, at least 98% at least 99%, or 100%) of an orthographic projection of the auxiliary capacitor electrode ace on the base substrate. Referring to FIG. 9B, at least a portion of the respective voltage supply line Vdd and at least a portion of the first connecting pad cp1 have conforming contours. In regions where they have conforming contours, edges of the respective voltage supply line Vdd and the first connecting pad cp1 are spaced apart from each other by a distance less than 3 μm.

Referring to FIG. 8A, in some embodiments, a first respective voltage supply line and a second respective voltage supply line respectively connected to a first pixel diving circuit PDC1 and a second pixel diving circuit PDC2 are connected to each other, forming a unitary structure US. In one example, is the unitary structure US, a boundary between the first respective voltage supply line and the second respective voltage supply fine may be a virtual line between active layers of the leakage preventing transistors from the first pixel diving circuit PDC1 and the second pixel driving circuit PDC2, respectively. In another example, in the unitary structure US, the boundary between the first respective voltage supply line and the second respective voltage supply line may be defined by a mirror symmetry plane that defines a mirror symmetry between corresponding layers of the first pixel driving circuit and corresponding layers of the second pixel driving circuit directly adjacent to each other and is the present stage, the mirror symmetry plane being perpendicular to a main surface of the array substrate and substantially parallel to the data lines in FIG. 3A.

The first pixel driving circuit PDC1 and the second pixel driving circuit PDC2 are directly adjacent to each other and in a same stage (e.g., the present stage). In some embodiments, an orthographic projection of the unitary structure US on a base substrate covers at least 50% (e.g., at least 55%, at least 60%, at least 659%, at least 70%, at least 759%, at least 80%, at least 85%, at least 90%, at least 95%, at least 98%, at least 99%, or 100%) of an orthographic projection of active layers of leakage preventing transistors respectively of the first pixel driving circuit PDC1 and the second pixel driving circuit PDC2 on the base substrate, covers at least 50% (e.g., at least 55%, at least 60%, at least 65%, at least 70%, at least 75%, at least 809%, at least 85%, at least 90%, at least 95%, at least 98%, at least 99%, or 100%) of an orthographic projection of node connecting lines respectively of the first pixel diving circuit PDC1 and the second pixel driving circuit PDC2 on the base substrate, covers at least 50% (e.g., at least 551%, at least 60%, at least 65%, at least 70%, at least 75%, at least 80%, at least $5%%, at least 90%, at least 95%, at least 98%, at least 99%, or 100%) of an orthographic projection of first connecting pads respectively of the first pixel driving circuit PDC1 and the second pixel driving circuit PDC2 on the base substrate, and covers at least 50% (e.g., at least 55%, at least 60%, at least 65%, at least 70%, at least 75%, at least 80%, at least 85%, at least 90%, at least 95%, at least 98%, at least 99%, or 100%) of an orthographic projection of auxiliary capacitor electrodes respectively of the first pixel driving circuit PDC1 and the second pixel driving circuit PDC2 on the base substrate.

Figure 8B:
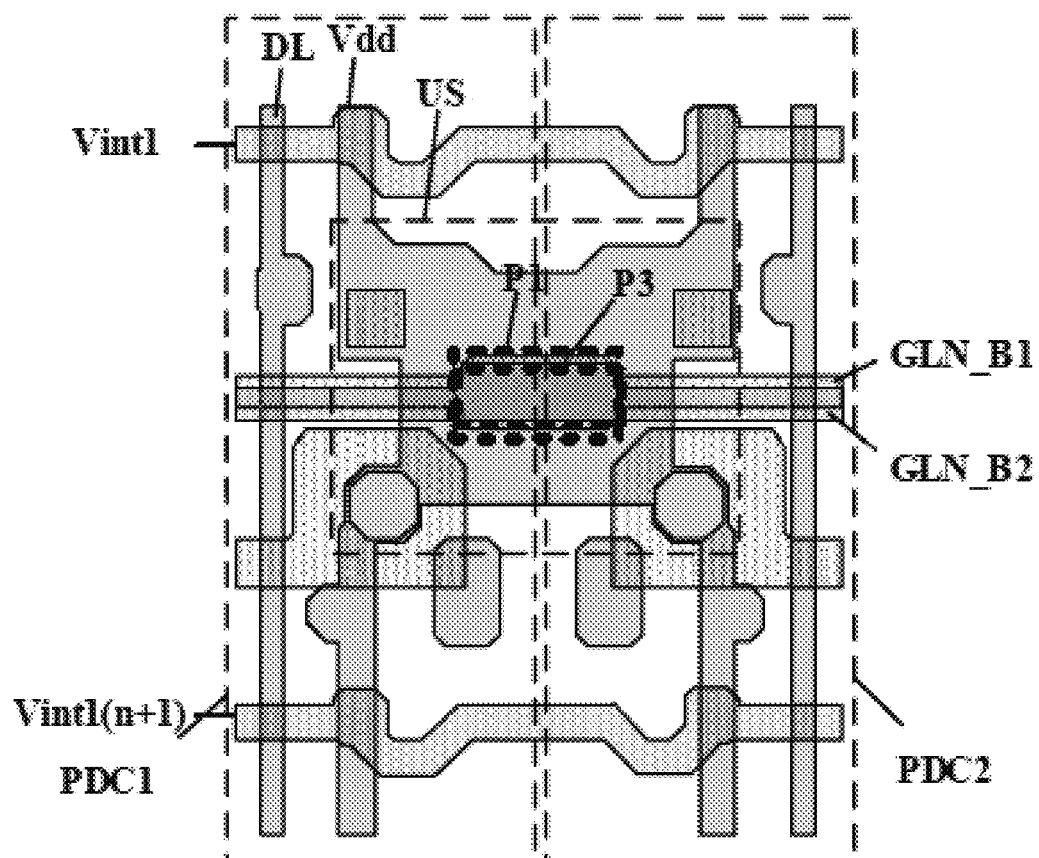
FIG. 8B is a diagram illustrating the structure of a second conductive layer, a third conductive layer, and a respective voltage supply like of two adjacent pixel driving circuits in an array substrate depicted in FIG. 3A.

FIG. 8B is a diagram illustrating the structure of a second conductive layer, a ford conductive layer, and a respective voltage supply line of two adjacent pixel driving circuits in as array substrate depicted in FIG. 3A. Referring to FIG. 8B, in some embodiments, in some embodiments, an orthographic projection of the respective voltage supply line Vdd on a base substrate covers at least 50% (e.g., at least 55%, at least 60%, at least 65%, at least 70%, at least 75%, at least 804 at least 85%, at least 90%, at least 95%, at least 985%, at least 99%, or 100%) of an orthographic projection of the first portion P1 of the first branch GLN_B1 on the base substrate. In some embodiments, the orthographic projection of the respective voltage supply line Vdd on the base substrate covers at least 50% (e.g., at least 55%, at least 60%, at least 65%, at least 70%, at least 75%, at least 80%, at least 85%, at least 90%, at least 95%, at least 98%, at least 99%, or 100%) of as orthographic projection of the third portion P3 of the second branch GLN_B2 on the base substrate.

Referring to FIG. 8B, in some embodiment, a first respective voltage supply line and a second respective voltage supply line respectively connected to a first pixel driving circuit PDC1 and a second pixel diving circuit PDC2 are connected to each other, forming a unitary structure US. The first pixel driving circuit PDC1 and the second pixel driving circuit PDC2 are directly adjacent to each other and in a same stage (e.g., the present stage). In some embodiments, an orthographic projection of the unitary structure US on a base substrate covers at least 50% (e.g., at least 55%, at least 60%, at least 65%, at least 70%, at least 75%, at least 80%, at least 85° %, at least 90%, at least 95%, at least 98%, at least 995%, or 100%) of the first portion P1 of the first branch GLN_B1 on the base substrate, and covers at least 50% (e.g., at least 55%, at least 60%, at least 65%, at least 70%, at least 75%, at least 80%, at least $5%, at least 901%, at least 95%, at least 98%, at least 99%%, or 100%) of as orthographic projection of the third portion P3 of the second branch GLN_B2 on the base substrate.

Referring to FIG. 8B, in some embodiments, orthographic projections of the first branch GLN_B1 and the second branch GLN_B2 on the base substrate at least partially overlap with each other. In some embodiments, at least a portion (e.g., the first portion P1) of the first branch GLN_B1 and at least a portion (e.g., the third portion P3) the second branch GLN_B2 have conforming contours. In regions where they have conforming contours, edges of the first branch GLN_B1 and the second branch GLN_B2 are spaced apart from each other by a distance less than 3 μm.

Referring to FIG. 8A and FIG. 8B, in some embodiments, the orthographic projection of the unitary structure US on the base substrate covers at least 50% (e.g., at least 55%, at least 60%, at least 65%, at least 70%, at least 75%, at least 80%, at least 85%, at least 90%, at least 95%, at least 98%, at least 99%, or 100%) of an orthographic projection of active layers of leakage preventing transistors respectively of the first pixel driving circuit PDC1 and the second pixel driving circuit PDC2 on the base substrate, covers at least 50% (e.g., at least 55%, at least 60%, at least 65%, at least 70%, at least 75%, at least 80%, at least 85%, at least 90%; at least 95%, at least 98%, at least 99%, or 100%) of an orthographic projection of node connecting lines respectively of the first pixel driving circuit PDC1 and the second pixel driving circuit PDC2 on the base substrate, covers at least 50% (e.g., at least 35%, at least 60%, at least 65%, at least 70%, at least 751%, at least 80%, at least 857%, at least 90%, at least 95%, at least 98%, at least 99%, or 1.00%) of au orthographic projection of first connecting pads respectively of the first pixel driving circuit PDC1 and the second pixel driving circuit PDC2 on the base substrate, covers at least 50% (e.g., at least 55%, at least 60%, at least 65%, at least 70%, at least 75% at least 801%, at least 85%, at least 90%, at least 95%, at least 98%, at least 99%, or 100%) of an orthographic projection of auxiliary capacitor electrodes respectively of the first pixel driving circuit PDC1 and the second pixel driving circuit PDC2 on the base substrate, covers at least 50% (e.g., at least 55%, at least 60%, at least 65%, at least 70%, at least 75%, at least 80%, at least 85%, at least 90%, at least 95%, at least 98%, at least 99%, or 100%) of the first portion P1 of the first branch GLN_B1 on the base substrate, and covers at least 50% (e.g., at least 55%, at least 60%, at least 65%, at least 70%, at least 75%, at least 80%, at least 85%, at least 90%, at least 95%, at least 98%, at least 99%, or 100%) of an orthographic projection of the third portion P3 of the second branch GLN_B2 on the base substrate.

Referring to FIG. 8B, is some embodiments, the first respective voltage supply line and the second respective voltage supply line are between a first respective data line and a second respective data line respectively connected to the first pixel driving circuit PDC1 and the second pixel driving circuit PDC2.

In some embodiments, the array substrate includes a novel pixel driving circuit. The pixel driving circuit is some embodiments includes a driving transistor Td, and a storage capacitor Cst, and a leakage preventing transistor T1p having a gate electrode connected to a respective second gate line GLN of a plurality of second gate lines, a first electrode connected to the first capacitor electrode Ce1 and the gate electrode of the driving transistor Td, and a second electrode connected to the second electrode of the first reset transistor Tr1 and the first electrode of the second transistor T2. An active layer of the driving transistor Td and an active layer of the leakage preventing transistor lip are spaced apart from each other by at least an insulating layer IN. The active layer of the diving transistor Td includes a first semiconductor material. The active layer of the leakage preventing transistor T1p includes a second semiconductor material different from the first semiconductor material. For example, the first semiconductor material layer includes a polycrystalline silicon material; and the second semiconductor material layer includes a metal oxide semiconductor material.

Human eyes are sensitive to panel flicker. The inventors of the present disclosure surprisingly and unexpectedly discover that panel flicker, particularly in low frequency display panels, can be significantly reduced by having the active layer of the leakage preventing transistor T1p made of a metal oxide semiconductor material, which is discovered to have excellent hysteresis characteristics, low leakage current (e.g., below $1 \times e^{-14}$ Amp), and low mobility. By having the present pixel driving circuit with the unique structure and layouts, the gate voltage of the driving transistor can be maintained, achieving low leakage in the display panel.

Figure 10A:
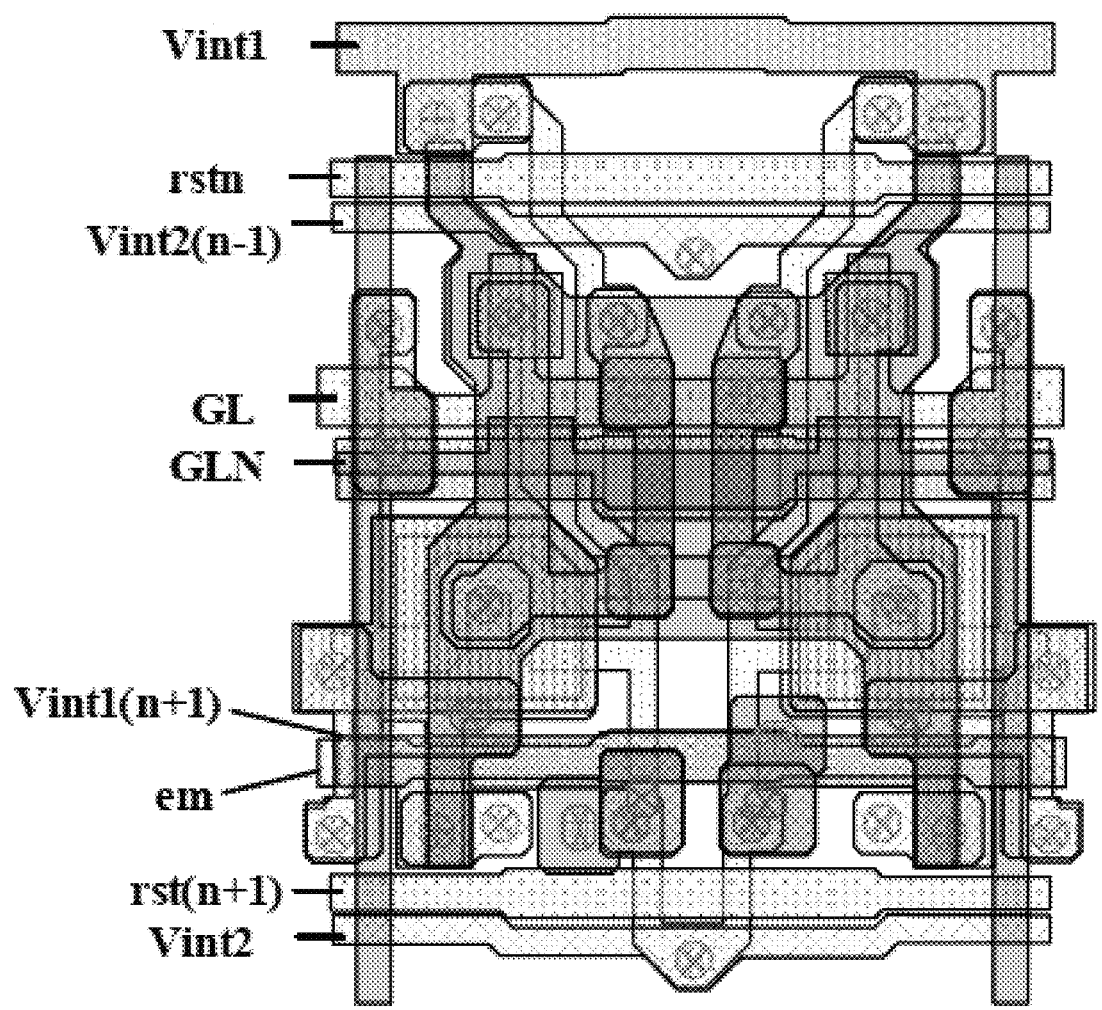
FIG. 10A is a diagram illustrating the structure of two adjacent pixel diving circuits in a same stage in an array substrate in some embodiments according to the present disclosure.
Figure 10B:
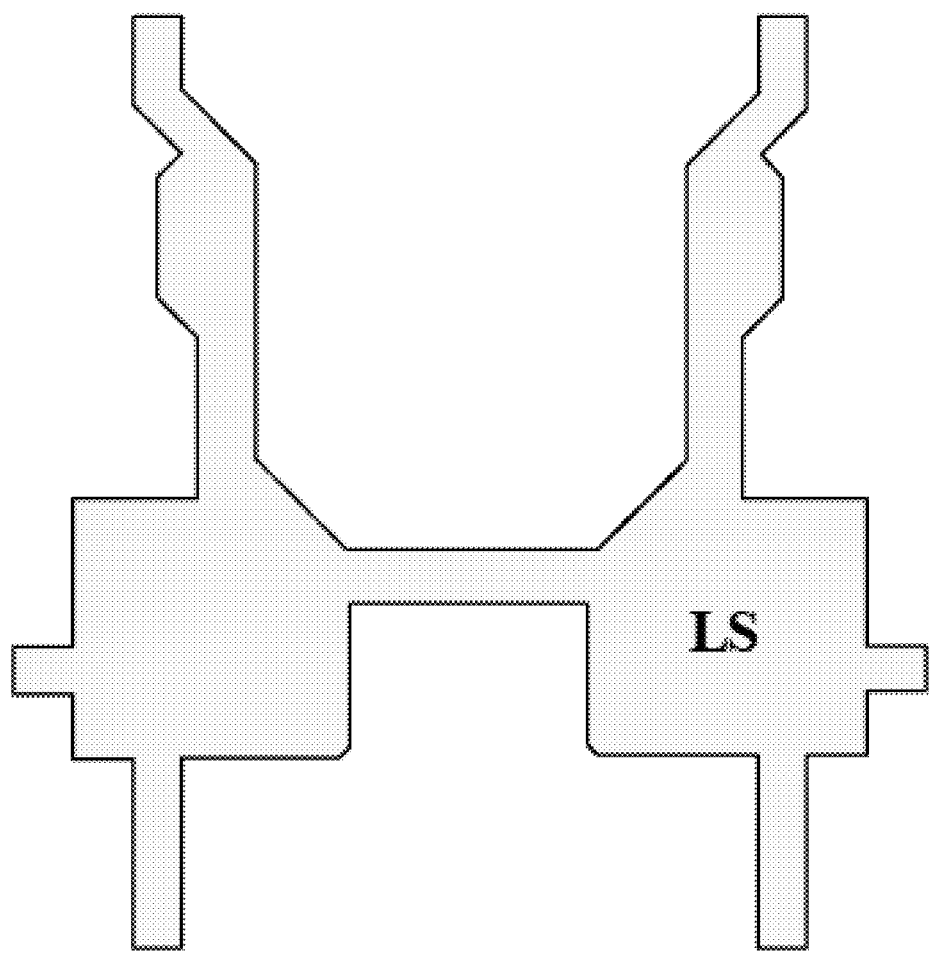
FIG. 10B is a diagram illustrating the structure of a light shield layer of two adjacent pixel driving circuits in an array substrate depicted in FIG. 10A.
Figure 10C:
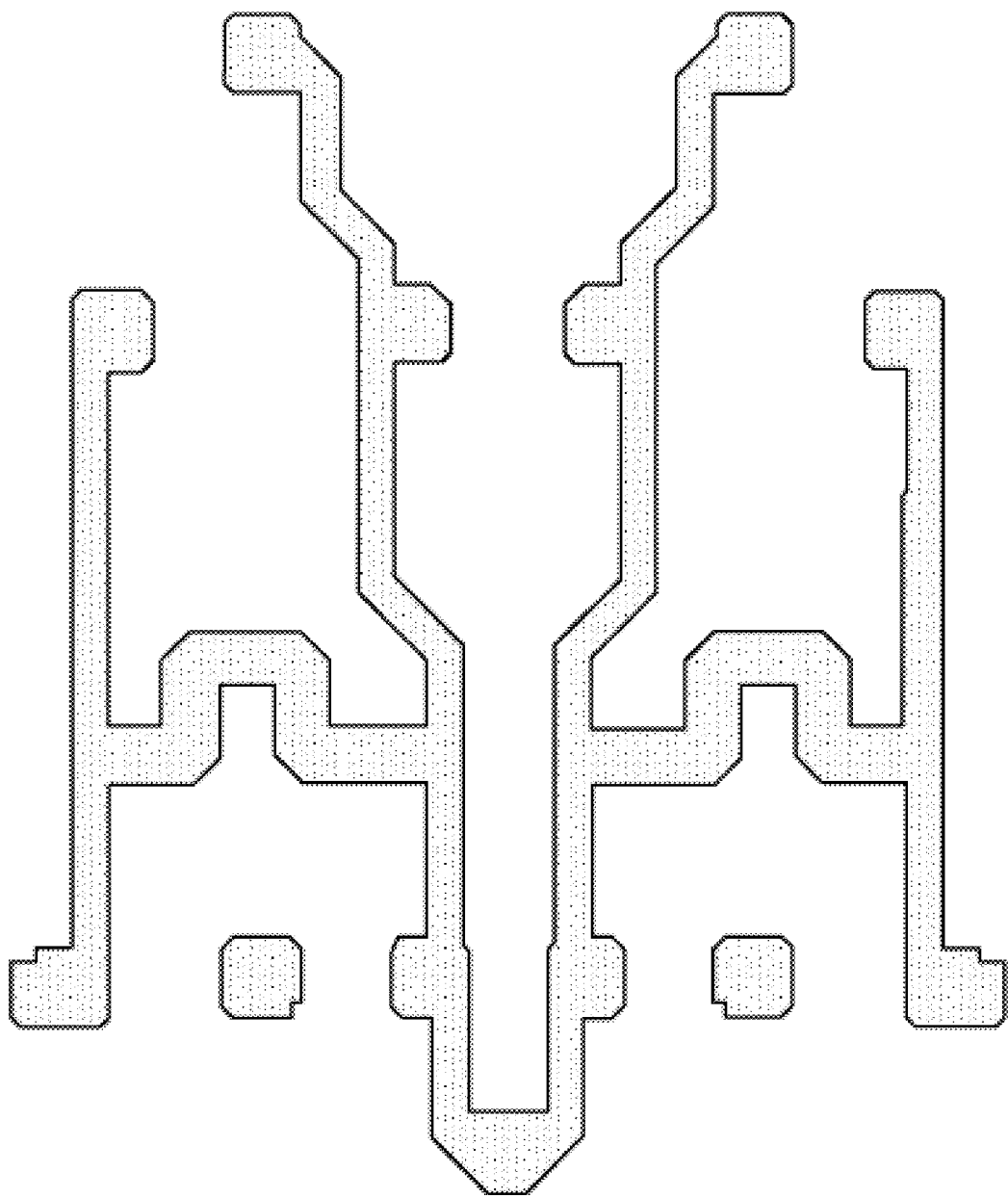
FIG. 10C is a diagram illustrating the structure of a fast semiconductor material layer of two adjacent pixel driving circuits in an array substrate depicted in FIG. 10A.
Figure 10D:
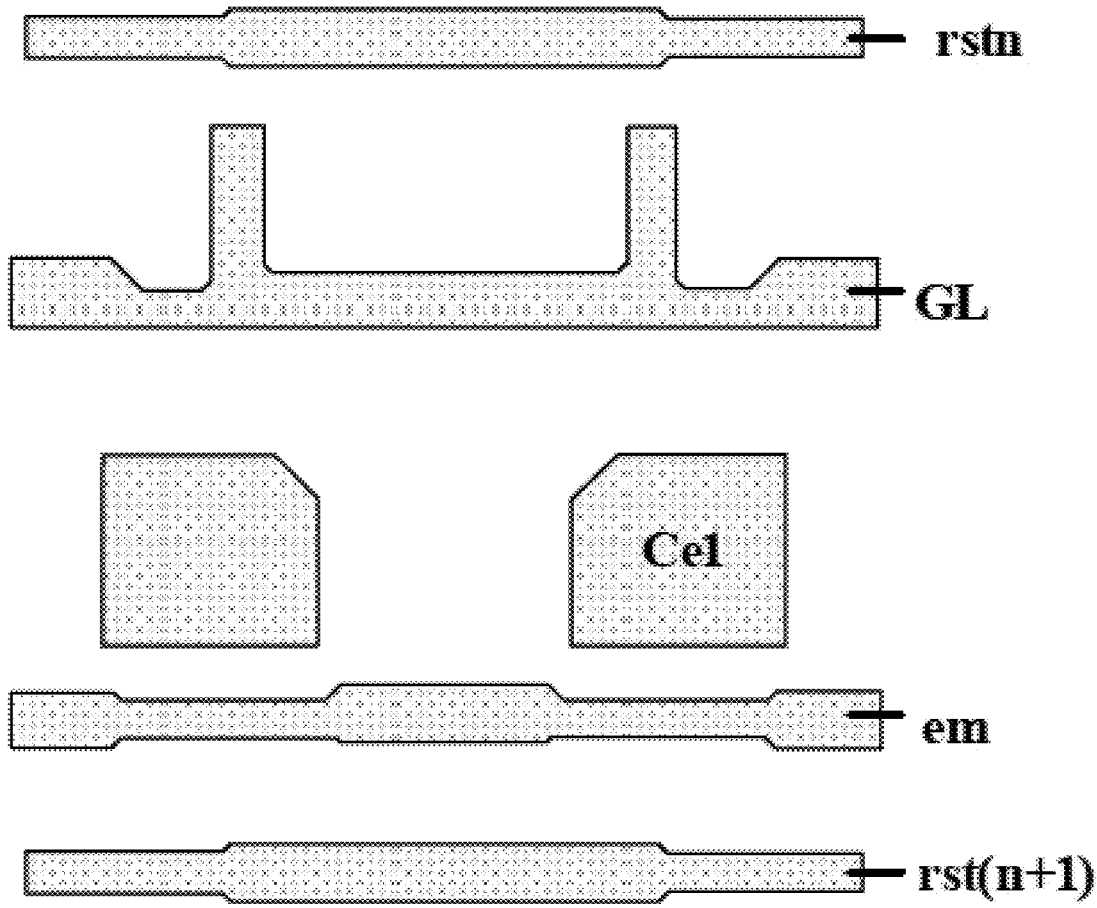
FIG. 10D is a diagram illustrating the structure of a first conductive layer of two adjacent pixel diving circuits in an array substrate depicted in FIG. 10A.
Figure 10E:
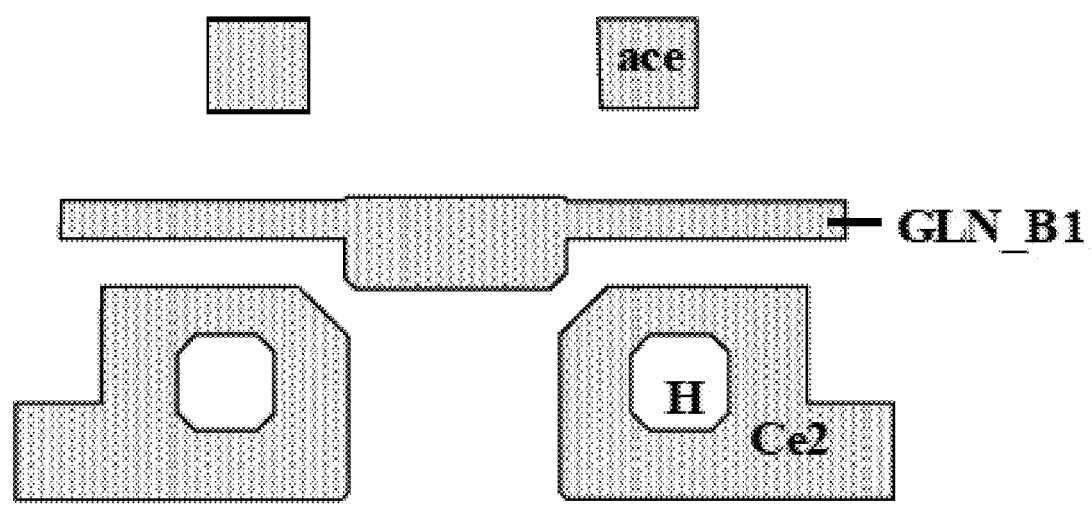
FIG. 10E is a diagram illustrating the structure of a second conductive layer of two adjacent pixel driving circuits is an array substrate depicted in FIG. 10A.
Figure 10F:
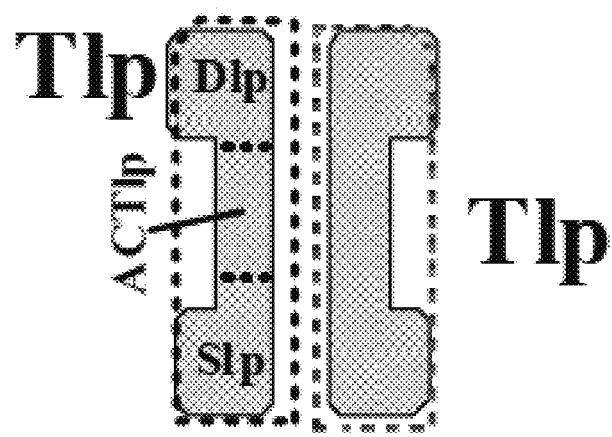
FIG. 10F is a diagram illustrating the structure of a second semiconductor material layer of two adjacent pixel driving circuits is an array substrate depicted in FIG. 10A.
Figure 10G:
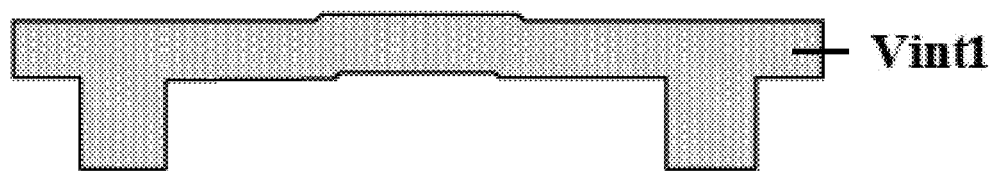
FIG. 10G is a diagram illustrating the structure of a third conductive layer of two adjacent pixel driving circuits is an array substrate depicted in FIG. 10A.
Figure 10G:
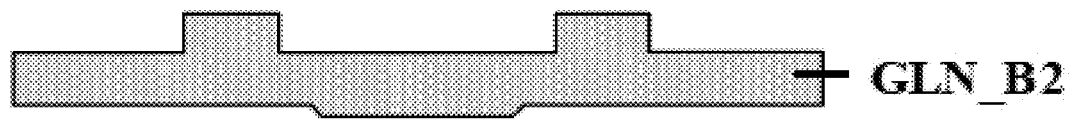
Figure 10G:
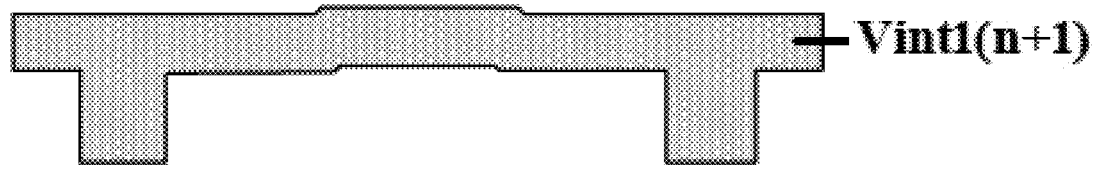
Figure 10H:
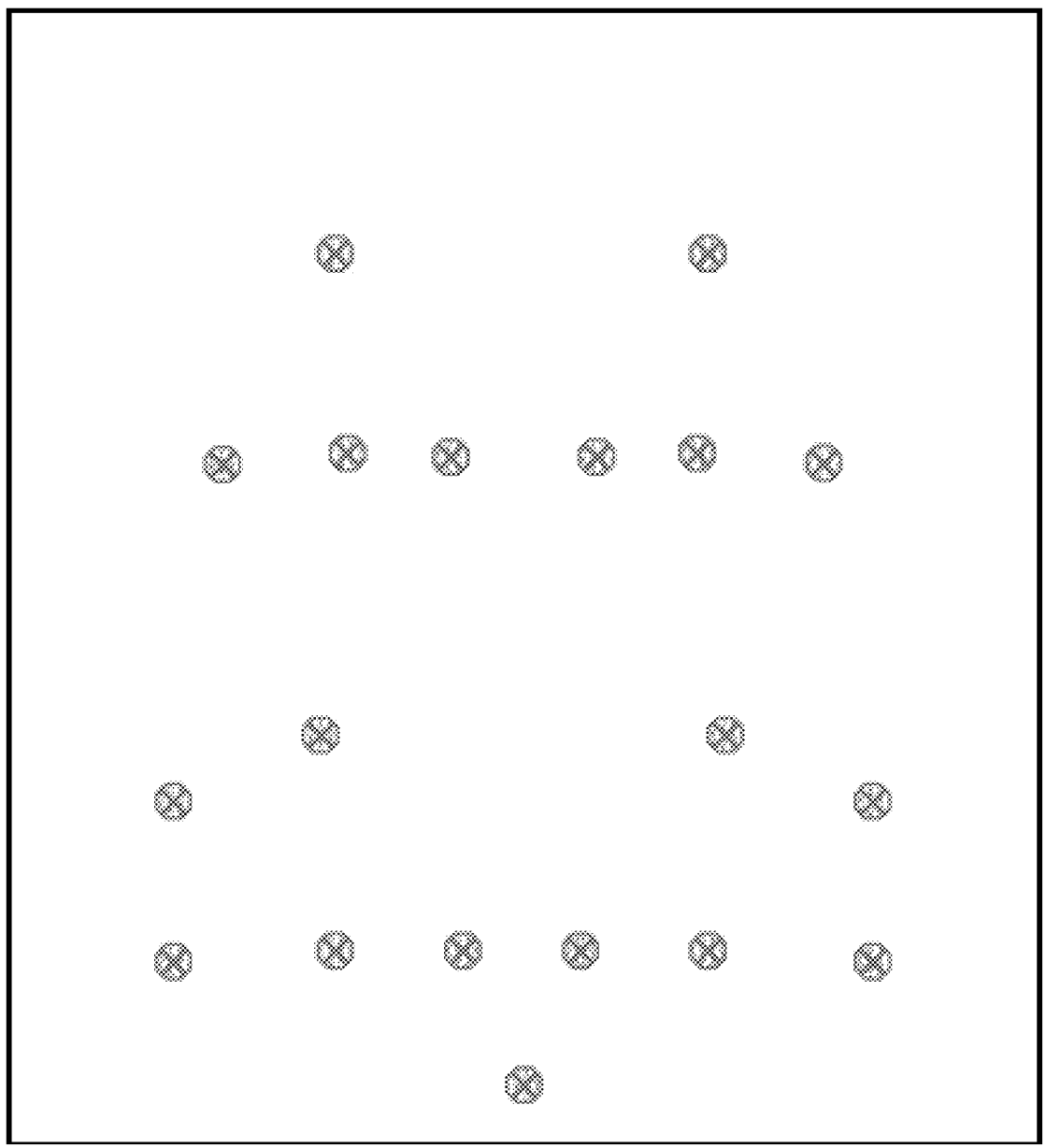
FIG. 10H is a diagram illustrating vias extending through a passivation layer, a second inter-layer dielectric layer, a first inter-layer dielectric layer, an insulating layer and a gate insulating layer in an array substrate depicted in FIG. 10A.
Figure 10I:
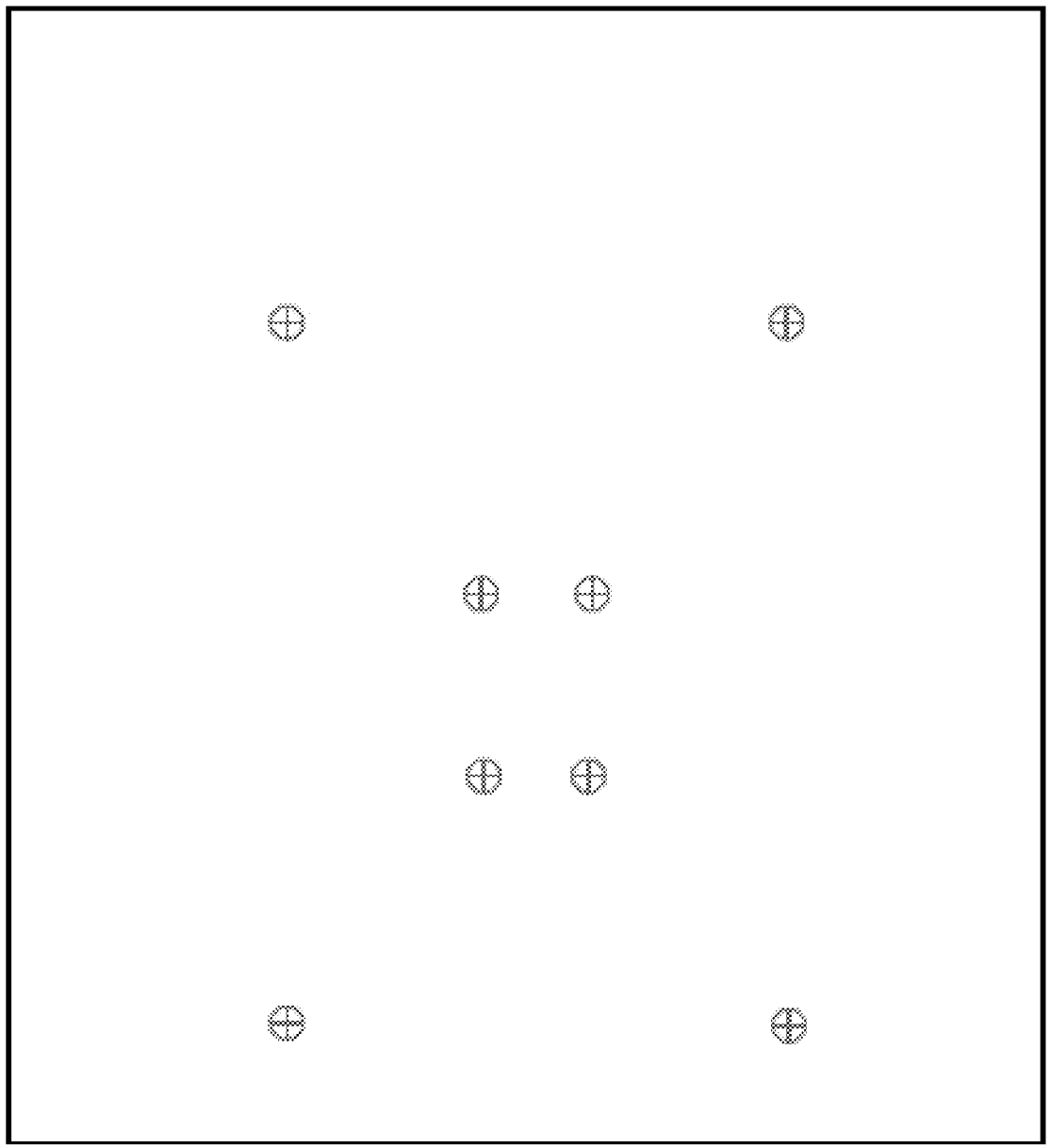
FIG. 10I is a diagrams illustrating vias extending through a passivation layer and a second inter-layer dielectric layer in an array substrate depicted is FIG. 10A.
Figure 10J:
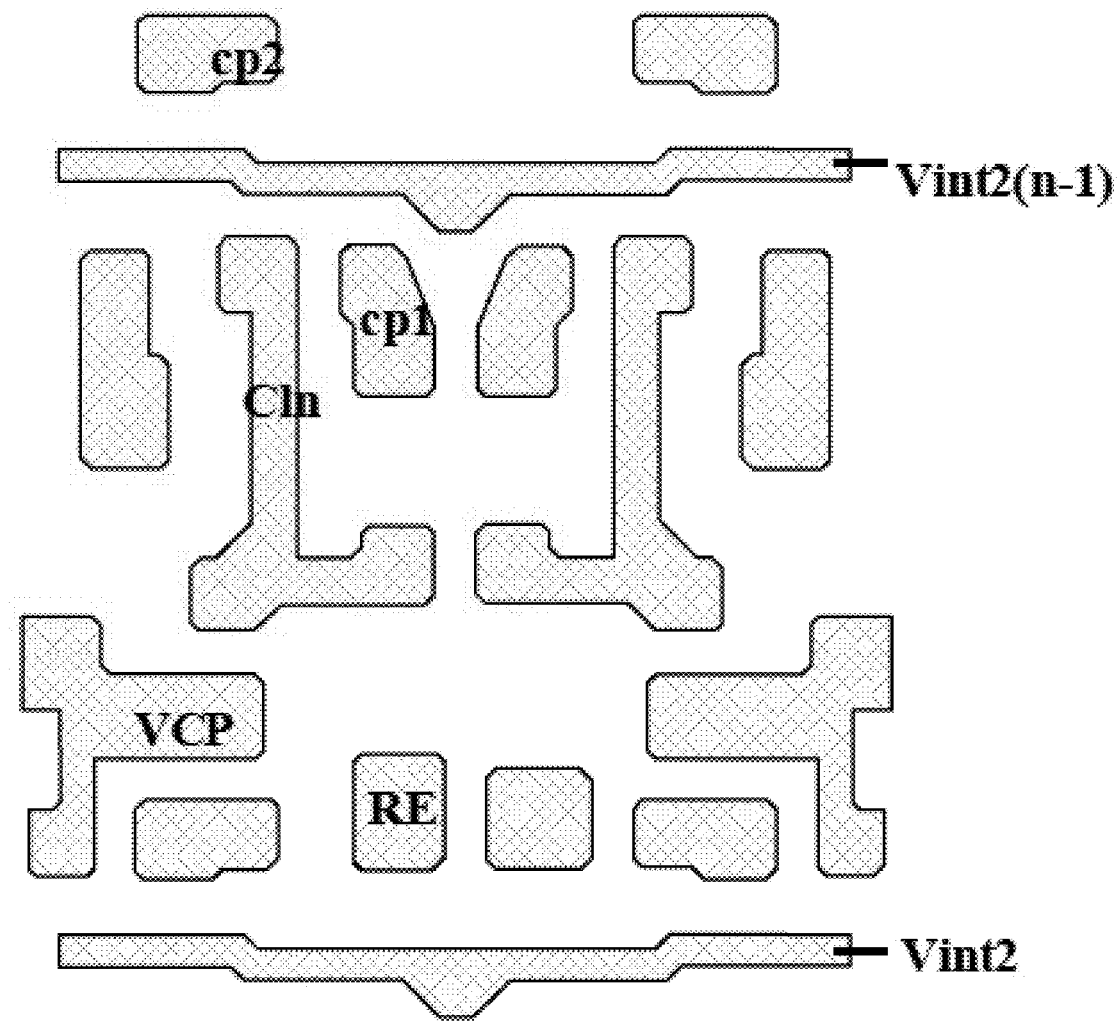
FIG. 10J is a diagram illustrating the structure of a first signal line layer of two adjacent pixel driving circuits in an array substrate depicted in FIG. 10A.
Figure 10K:
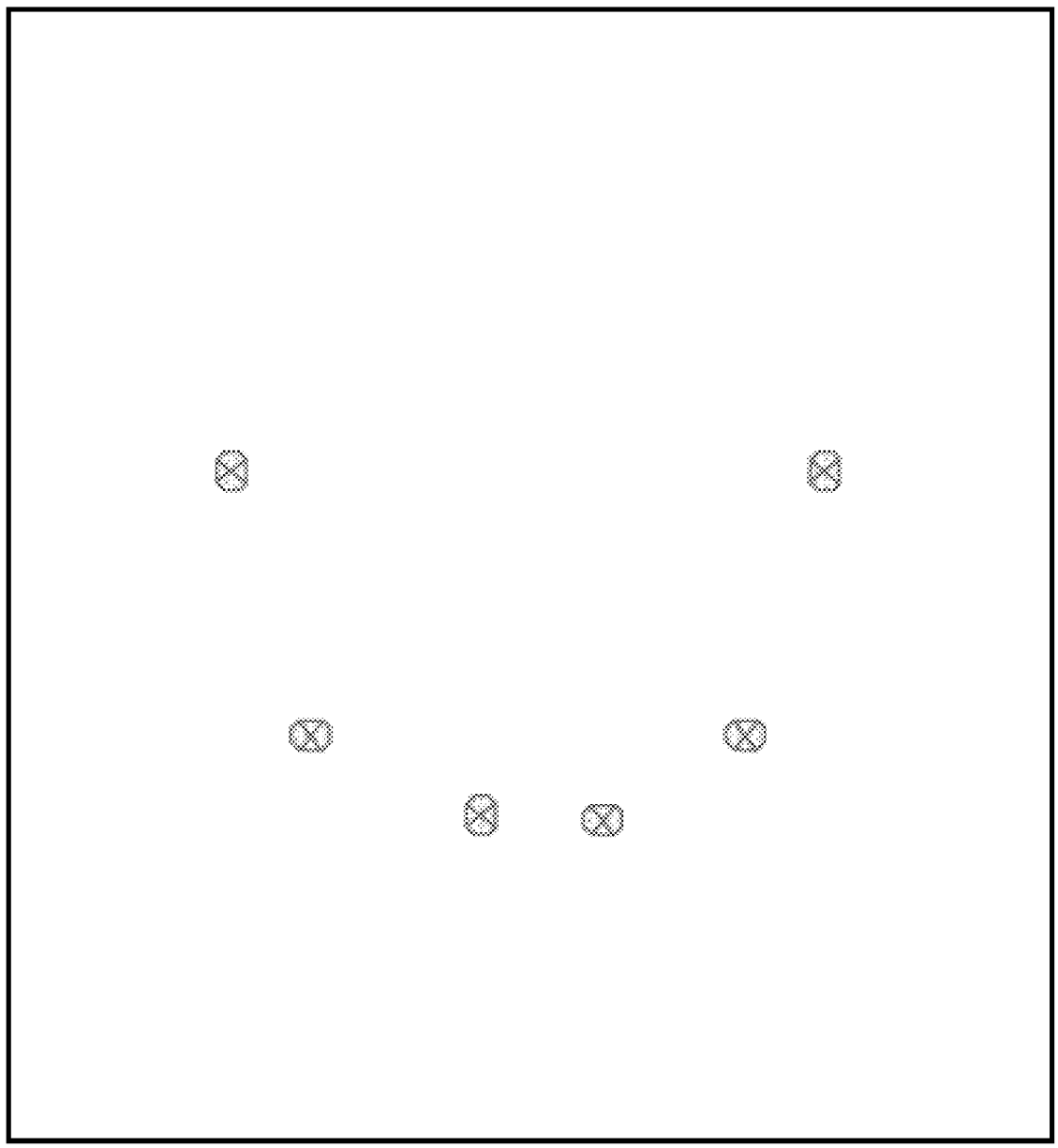
FIG. 10K is a diagram illustrating vias extending through a first planarization layer in as array substrate depicted in FIG. 10A.
Figure 10L:
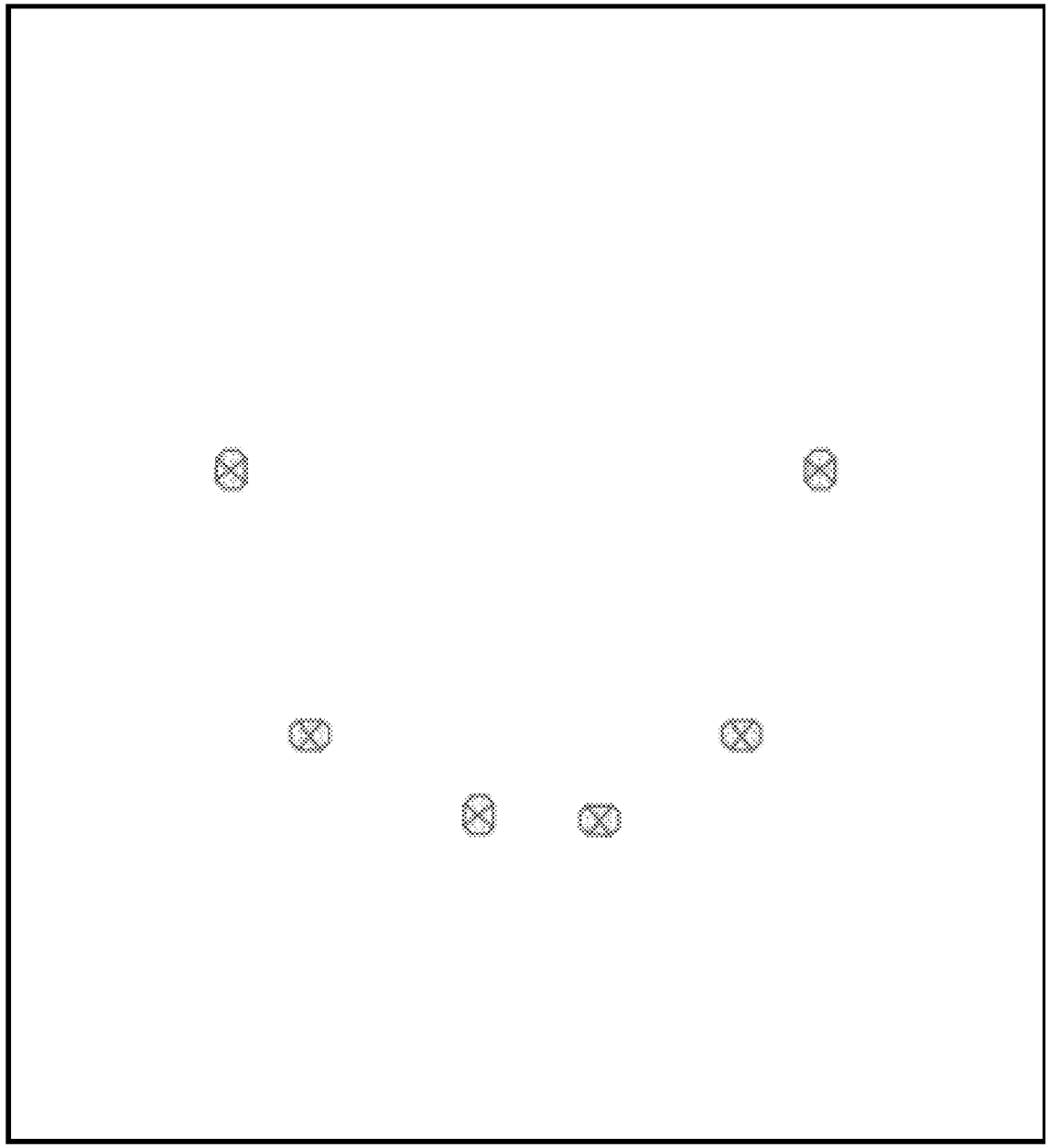
FIG. 10L is a diagram illustrating vias extending through a passivation layer, a second inter-layer dielectric layer, a first inter-layer dielectric layer, an insulating layer and a gate illustrating layer in an array substrate depicted in FIG. 10A.
Figure 10M:
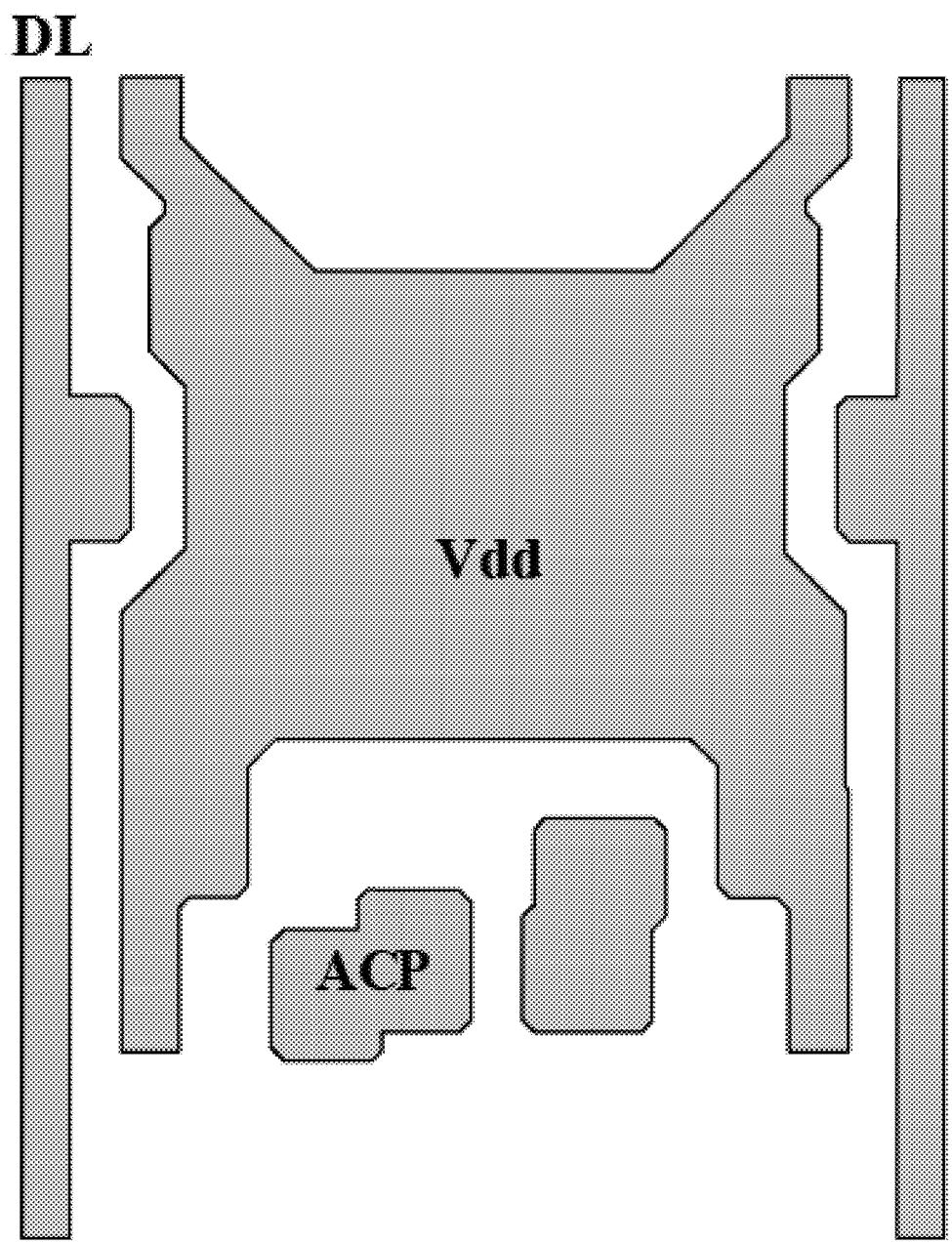
FIG. 10M is a diagram illustrating the structure of a second signal line layer of two adjacent pixel driving circuits is an array substrate depicted in FIG. 10A.
Figure 10N:
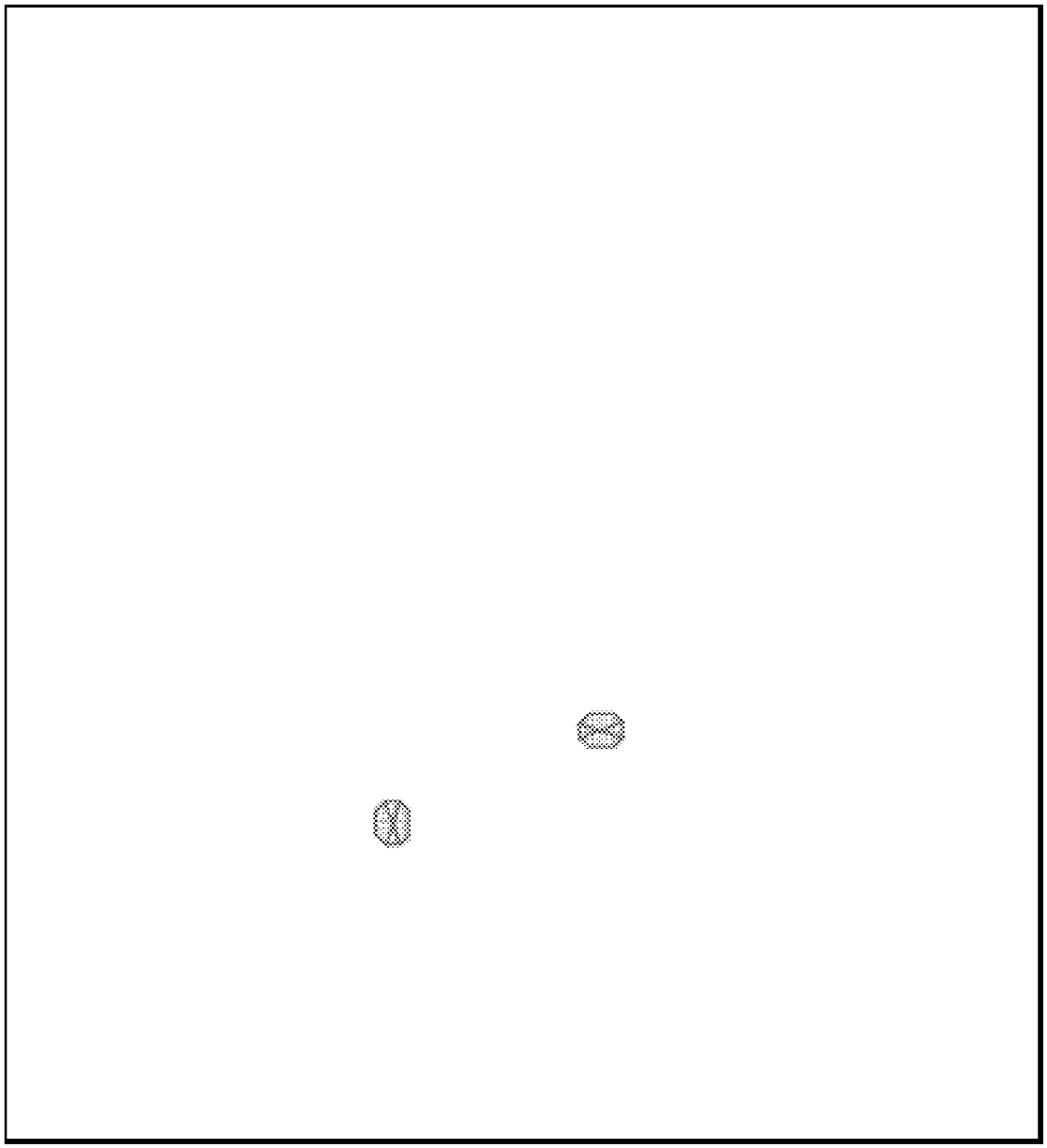
FIG. 10N is a diagram illustrating vias extending through a second planarisation layer in an array substrate depicted in FIG. 10A.

FIG. 10A is a diagram illustrating the structure of two adjacent pixel driving circuits in a same stage in an array substrate in some embodiments according to the present disclosure. FIG. 10B is a diagram illustrating the structure of a light shield layer of two adjacent pixel driving circuits in an array substrate depicted in FIG. 10A. FIG. 10C is a diagram illustrating the structure of a first semiconductor material layer of two adjacent pixel diving circuits in an array substrate depicted in FIG. 10A. FIG. 10D is a diagram illustrating the structure of a first conductive layer of two adjacent pixel driving circuits in an array substrate depicted in FIG. 10A. FIG. 10E is a diagram illustrating the structure of a second conductive layer of two adjacent pixel driving circuits is an array substrate depicted in FIG. 10A. FIG. 10F is a diagram illustrating the structure of a second semiconductor material layer of two adjacent pixel driving circuits in an array substrate depicted in FIG. 10A. FIG. 10G is a diagram illustrating the structure of a third conductive layer of two adjacent pixel driving circuits in an array substrate depicted in FIG. 10A. FIG. 10H is a diagram illustrating vias extending through a passivation layer, a second inter-layer dielectric layer, a first inter-layer dielectric layer, an insulating layer and a gate insulating layer in an array substrate depicted in FIG. 10A. FIG. 10I is a diagram illustrating vias extending through a passivation layer and a second inter-layer dielectric layer is an array substrate depicted in FIG. 10A. FIG. 10J is a diagram illustrating the structure of a first signal line layer of two adjacent pixel driving circuits in an array substrate depicted in FIG. 10A. FIG. 10K is a diagram illustrating vias extending through a first planarization layer in an array substrate depicted in FIG. 10A. FIG. 10L is a diagram illustrating vias extending through a passivation layer, a second inter-layer dielectric layer, a first inter-layer dielectric layer, an insulating layer and a gate insulating layer is an array substrate depicted in FIG. 10A. FIG. 10M is a diagram illustrating the structure of a second signal line layer of two adjacent pixel driving circuits is an array substrate depicted in FIG. 10A. FIG. 10N is a diagram illustrating vias extending through a second planarization layer in an array substrate depicted in FIG. 10A. FIG. 10A to FIG. 10N illustrate an array substrate in an embodiment having a structure similar to that depicted in FIG. 3A to FIG. 3N.

Figure 10O:
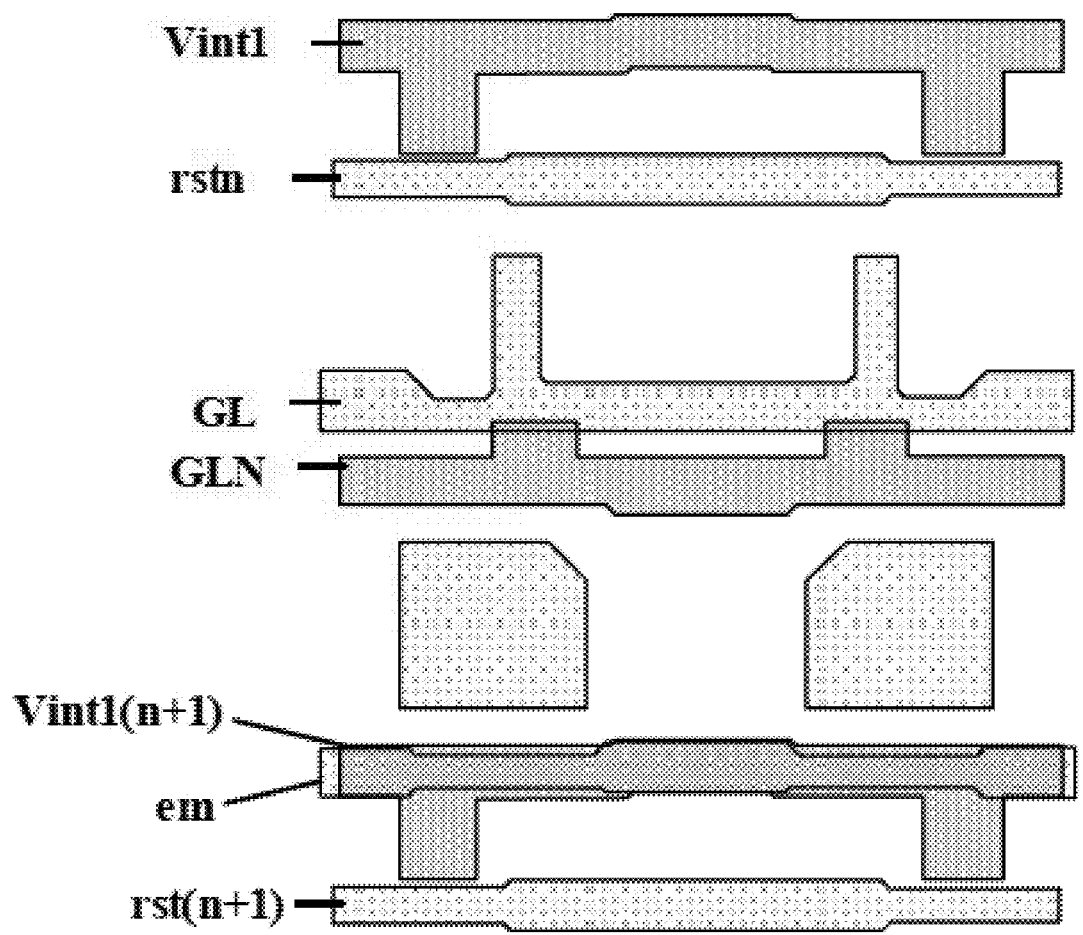
FIG. 10O is a diagram illustrating the structure of a first conductive layer and a third conductive layer of two adjacent pixel driving circuits in an array substrate depicted in FIG. 10A.

The array substrate depicted in FIG. 10A to FIG. HON differs from the array substrate depicted in FIG. 3A to FIG. 3N, inter alia, in that an orthographic projection of the respective light emitting control signal line em of a plurality of light emitting control signal lines on the base substrate at least partially overlaps with an orthographic projection of the respective first reset signal line Vint1 of a plurality of first reset signal lines on the base substrate. FIG. 10O is a diagram illustrating the structure of a first conductive layer and a third conductive layer of two adjacent pixel driving circuits in an array substrate depicted in FIG. 10A. Referring to FIG. 10A, FIG. 10D, FIG. 10G, and FIG. 10O, an orthographic projection of the respective first reset signal line Vint1 (n+1) in a next stage on the base substrate at least partially overlaps with the orthographic projection of the respective light emitting control signal line em of a plurality of light emitting control signal lines on the base substrate.

Figure 11A:
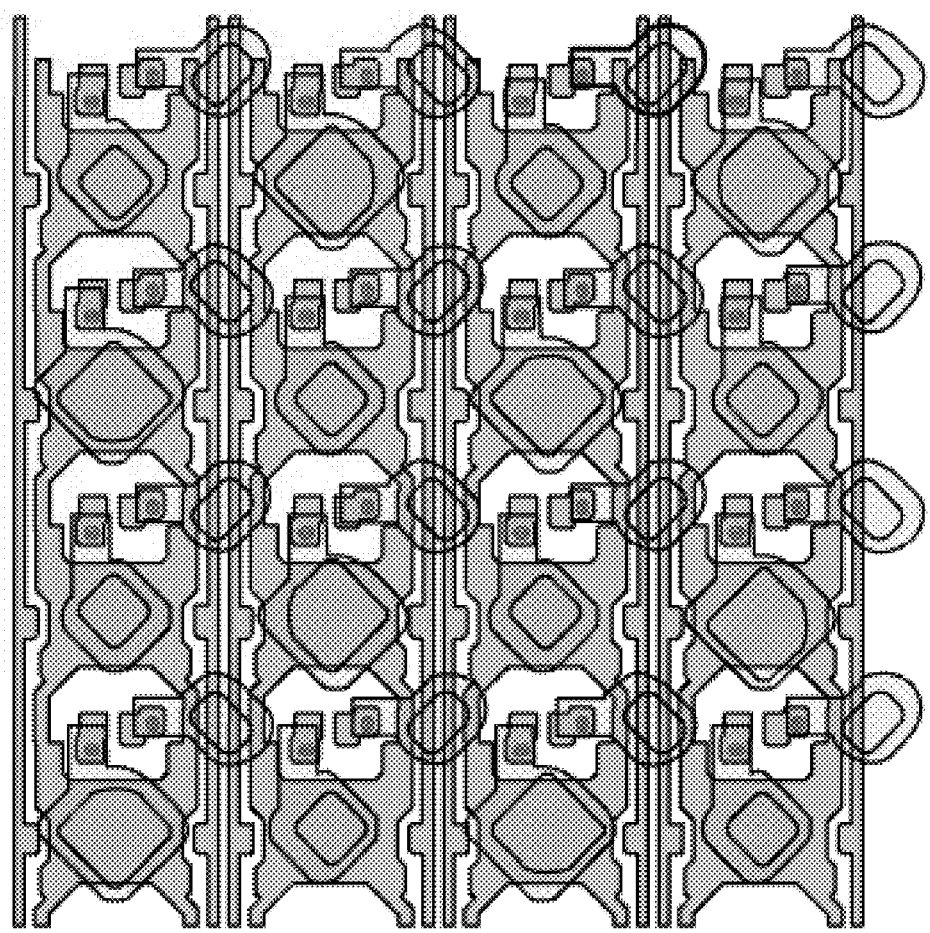
FIG. 11A is a diagram illustrating the structure of a second signal line layer, a second planarization layer, an anode layer, and a pixel definition layer in an array substrate in some embodiments according to the present disclosure.
Figure 11B:
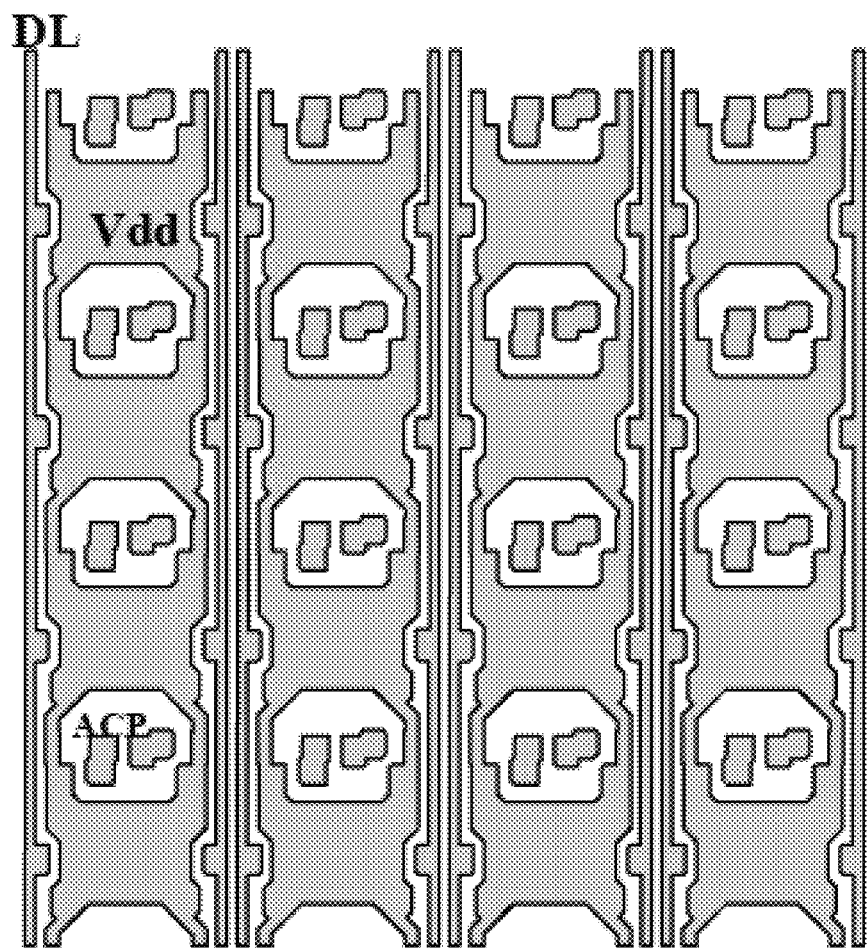
FIG. 11B is a diagram illustrating the structure of a second signal line layer in an array substrate in some embodiments according to the present disclosure.
Figure 11C:
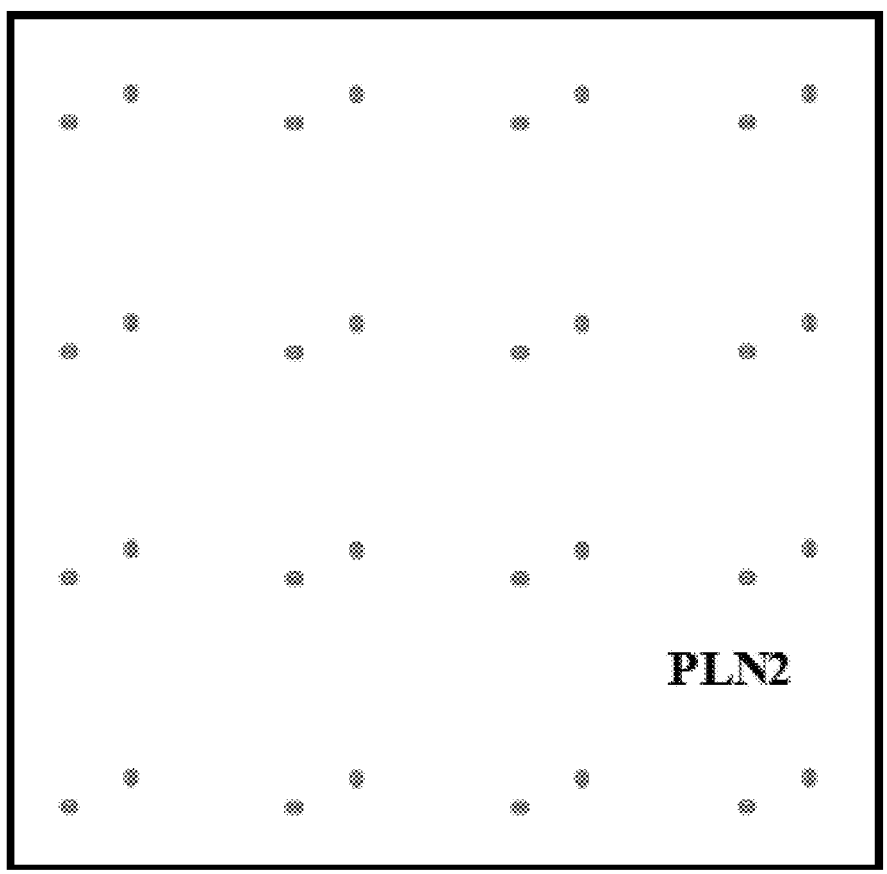
FIG. 11C is a diagram illustrating the structure of a second planarization layer in au array substrate as some embodiments according to the present disclosure.
Figure 11D:
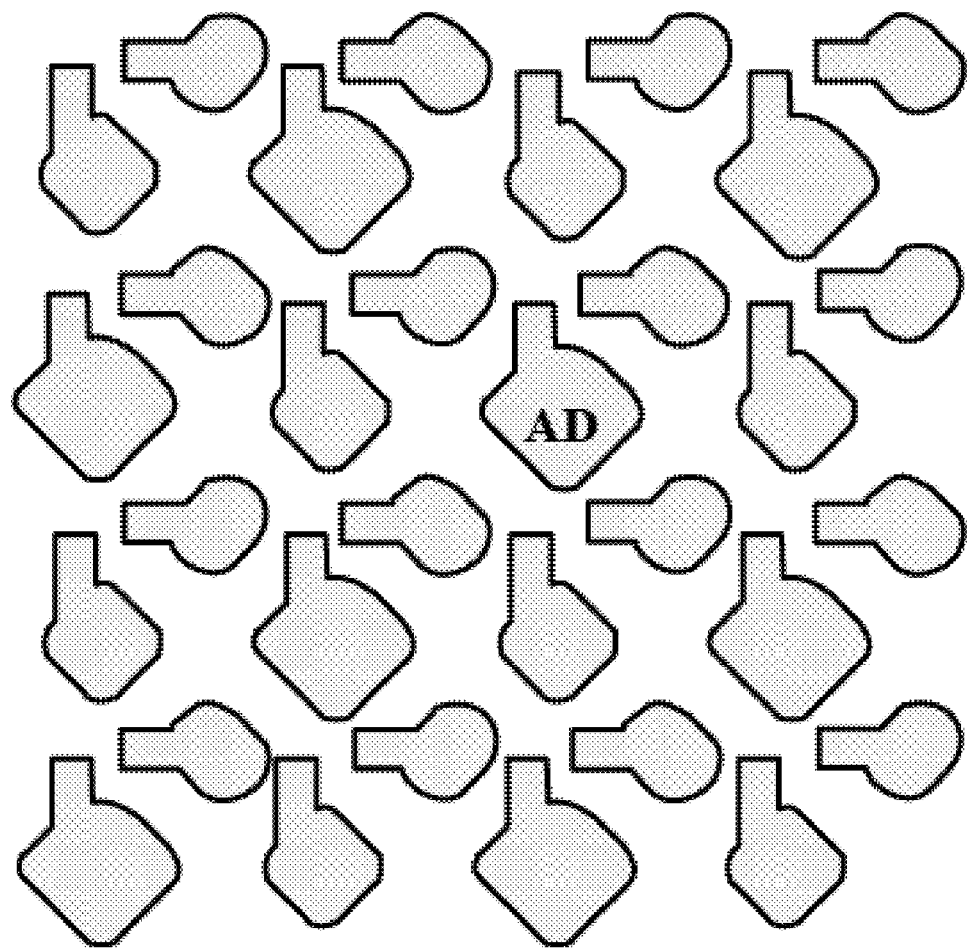
FIG. 11D is a diagram illustrating the structure of an anode layer in an array substrate in some embodiments according to the present disclosure.
Figure 11E:
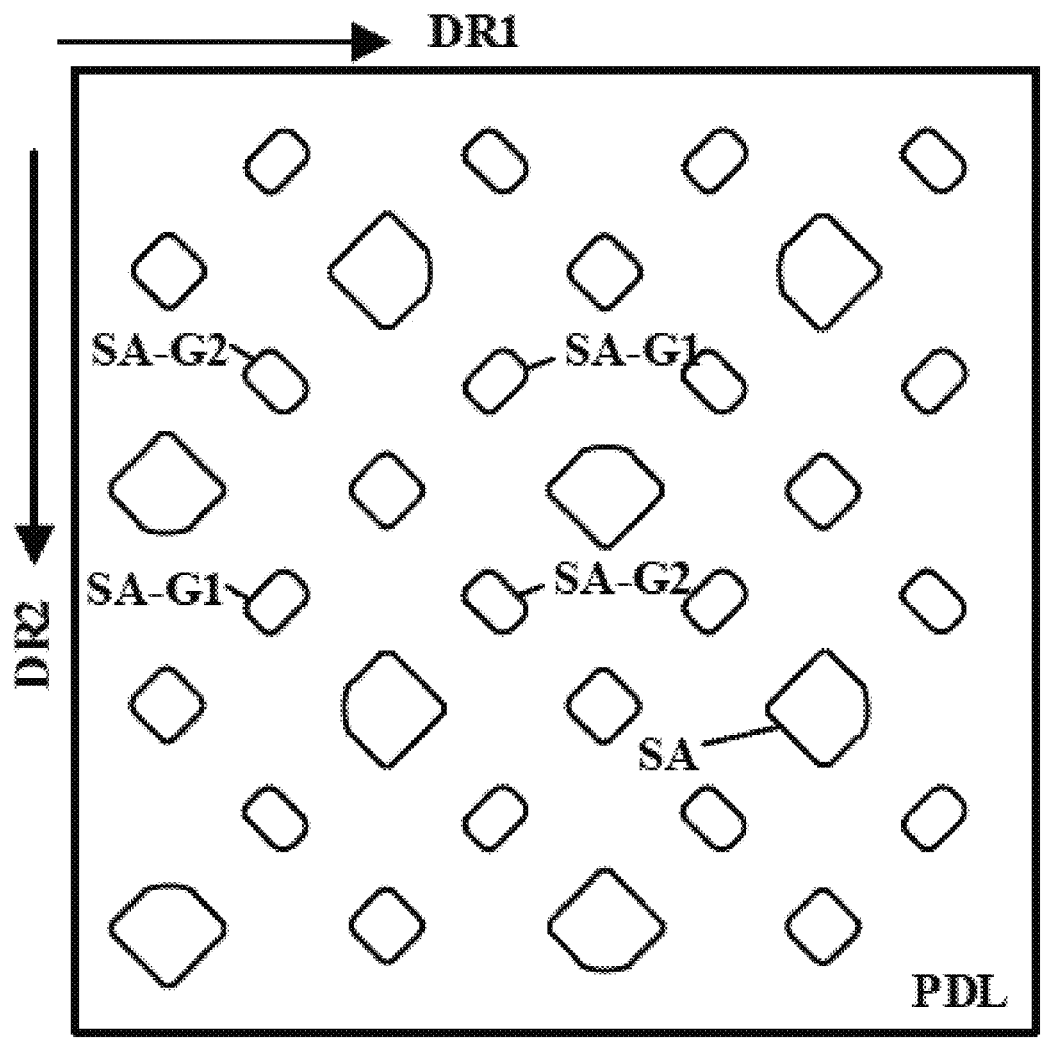
FIG. 11E is a diagram illustrating the structure of a pixel definition layer in an array substrate in some embodiments according to the present disclosure.

FIG. 11A is a diagram illustrating the structure of a second signal line layer, a second planarization layer, an anode layer, and a pixel definition layer in an array substrate in souse embodiments according to the present disclosure. FIG. 11B is a diagram illustrating the structure of a second signal line layer in an array substrate in some embodiments according to the present disclosure. FIG. 11C is a diagram illustrating the structure of a second planarization layer in an array substrate in some embodiments according to the present disclose. FIG. 11D is a diagram illustrating the structure of an anode layer in an array substrate in some embodiments according to the present disclosure. FIG. 11E is a diagram illustrating the structure of a pixel definition layer is an array substrate in some embodiments according to the present disclosure. The array substrate illustrated in FIG. 11A to FIG. 11E has a different anode arrangement and a different subpixel aperture arrangement.

In one example, the array of the plurality of subpixels includes a R-G-B-G format repeating array, in which the respective first subpixel is a red subpixel, the respective second subpixel is a green subpixel, the respective third subpixel is a blue subpixel, and the respective fourth subpixel is a green subpixel. FIG. 11E denotes subpixel apertures for the green subpixels as SA-G1 and SA-G2. In some embodiments, the subpixel apertures for the green subpixels have a mirror symmetry with respect to a plane perpendicular to the array substrate have parallel to a first direction DR1 (e.g., an extension direction of the respective first gate line GL). Moreover, in some embodiments, the subpixel apertures for the green subpixels have a mirror symmetry with respect to a plane perpendicular to the array substrate have parallel to a secondi direction DR2 (e.g., an extension direction of the respective data line DL).

As compared to the array substrate illustrated in FIG. 3A to FIG. 3P, vias extending through the second planarization layer PLN2 (see, e.g., FIG. 11C) is the array substrate illustrated in FIG. 11A to FIG. 11E are at different positions from those depicted in FIG. 3A to FIG. 3P, as order to accommodate a different anode arrangement and a different subpixel aperture arrangement.

In another aspect, the present invention provides a display apparatus, including the array substrate described herein or fabricated by a method described herein, and one or more integrated circuits connected to the array substrate. Examples of appropriate display apparatuses include, but are not limited to, as electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

Figure 12:
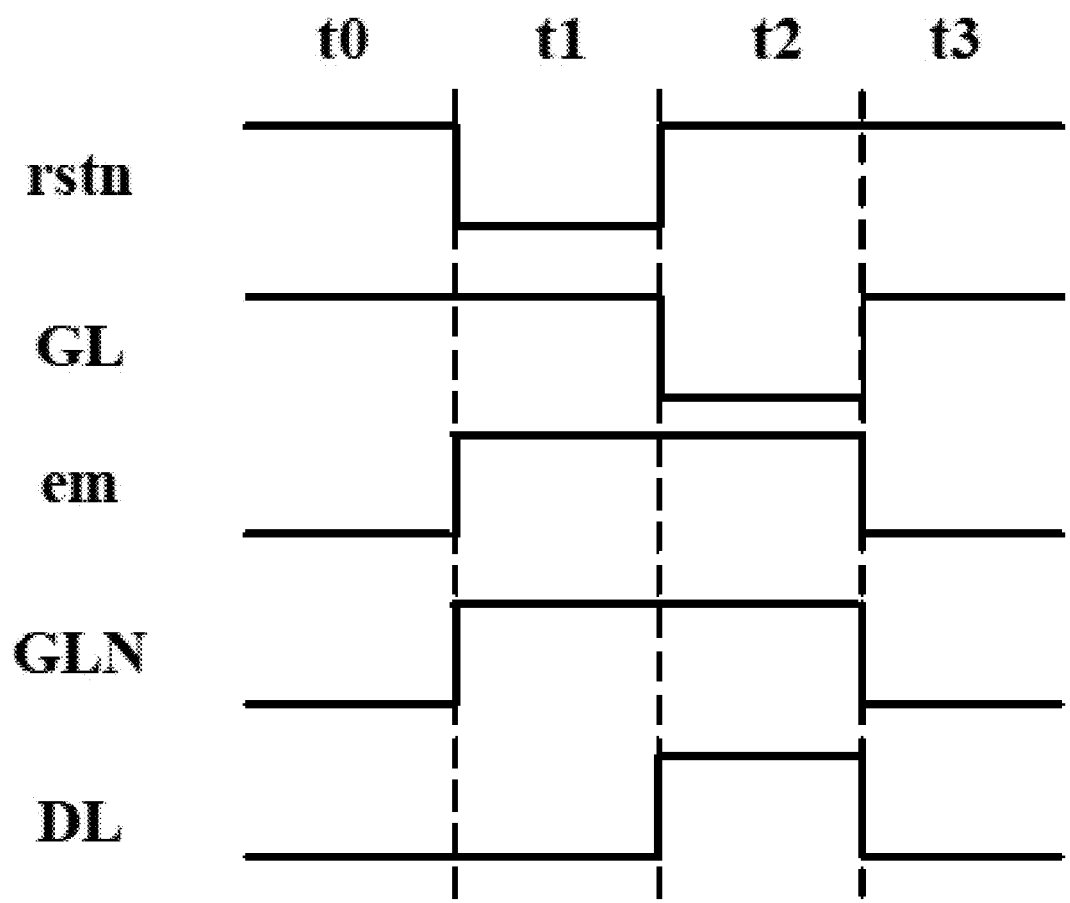
FIG. 12 is a timing diagram of operating a display apparatus in an image display phase in some embodiments according to the present disclosure.

FIG. 12 is a timing diagram of operating a display apparatus in ax mange display phase in some embodiments according to the present disclosure. Referring to FIG. 2 and FIG. 12, the image display phase in some embodiments includes an initial sub phase 10, a reset sub-phase t1, a data white sub-phase 12, and a light emitting sub-phase 13. In the initial sub-phase t0, a towing-off reset control signal is provided through the respective reset control signal line rstm in the present stage to the gate electrode of the first reset transistor Tr1 to turn off the first reset transistor Tr1. In the initial sub-phase to, the gate line GL is provided with a turning off signal, thus the first transistor T1 and the second transistor T1 are turned off. In the initial sub-phase t0, a turning-off signal is provided through the respective second gate line GLN to the gate electrode of the leakage preventing transistor T1$p$ to turn off the leakage preventing transistor T1$p$.

In the reset sub-phase t1, a turning-on reset control signal is provided through the respective reset control signal line rain in the present stage to the gate electrode of the first reset transistor Tr1 to turn on the first reset transistor Tr1; allowing an initialization voltage signal to pass from a first electrode of the first reset transistor Tr1 to a second electrode of the first reset transistor Tr1, and in turn to a second electrode of the leakage preventing transistor T1$p$. A turning-on signal is provided through the respective second gate lice GLN to the gate electrode of the leakage preventing transistor T1$p$ to turn on the leakage preventing transistor T1$p$; allowing the initialization voltage signal to pass from the second electrode of the leakage preventing transistor T1$p$ to a first electrode of the leakage preventing transistor T1p, and is turn to the first capacitor electrode Ce1 and the gate electrode of the driving transistor Td. The gate electrode of the driving transistor Td is initialized. The second capacitor electrode Ce2 receives a high voltage signal from the respective voltage supply line Vdd. The first capacitor electrode Ce1 is charged in the reset sub-phase t1 due to an increasing voltage difference between the first capacitor electrode Ce1 and the second capacitor electrode Ce2. Is the reset sub-phase t1, the gate line GL is provided with a tuning-off signal, thus the first transistor T1 and the second transistor T2 are turned off. The light emitting control signal line em is provided with a high voltage signal to www off the third transistor T3 and the fourth transistor T4.

In the data write sub-phase t2, the turning-off reset control signal is again provided through the respective reset control signal line rstn in the present stage to the gate electrode of the first reset transistor Tr1 to turn off the first reset transistor Tr1. The gate line GL is provided with a turning-on signal, thus the first transistor T1 and the second transistor T2 are turned on. A second electrode of the driving transistor Td is connected with the second electrode of the second transistor T2. A turning-on signal is provided through the respective second gate line GLN to the gate electrode of the leakage preventing transistor T1p to turn on the leakage preventing transistor T1p. Accordingly, a gate electrode of the driving transistor Td is electrically connected with the first electrode of the second transistor T2 (e.g., through the leakage preventing transistor T1p). Because the second transistor T2 and the leakage preventing transistor T1p are turned on in the data write sub-phase 12, the gate electrode and the second electrode of the driving transistor Td are connected and short circuited, and only the PN junction between the gate electrode and a first electrode of the driving transistor Td is effective, thus rendering the diving transistor Td in a diode connecting mode. The first transistor T1 is turned on is the data write sub-place t2. The data voltage signal transmitted through the data line DL is received by a first electrode of the Best transistor T1, and in turn transmitted to the first electrode of the driving transistor Td, which is connected to the second electrode of the fest transistor T1. A node N2 connecting to the first electrode of the driving transistor Td has a voltage level of the data voltage signal. Because only the PN junction between the gate electrode and a first electrode of the driving transistor Td is effective, the voltage level at the node N1 is the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The light emitting control signal line em is provided with a high voltage signal to turn off the third transistor T3 and the fourth transistor T4.

In the light emitting sub-phase t3, the turning-off reset control signal is again provided through the respective reset control signal line rstn in the present stage to the gate electrode of the first reset transistor Tr1 to turn off the first reset transistor Tr1. The respective first gate line GL is provided with a turning off signal, the first transistor T1 and the second transistor T2 are turned off. The light emitting control signal line em is provided with a low voltage signal to fan on the third transistor T3 and the fourth transistor T4. The voltage level at the node N1 in the light emitting sub-phase t3 is maintained at (Vdata+Vth), the driving transistor Td is turned on by the voltage level, and working in the saturation area. A paw is formed through the third transistor T3, the driving transistor Td, the fourth transistor T4, to the light emitting element LE. The driving transistor Td generates a diving current for driving the light emitting element LE to emit light. A voltage level at a node N3 connected to the second electrode of the driving transistor Td equals to a light emitting voltage of the light emitting element LE.

In the light emitting sub-phase t3, the leakage pathway, if any, for the gate electrode of the diving transistor Td includes a path going from the leakage preventing transistor T1p through the first reset transistor Tr1, and a path going from the leakage preventing transistor T1p through the second transistor T2. In the light emitting sub phase 13, a turning-off signal is provided through the respective second gate line GLN to the gate electrode of the leakage preventing transistor T1p to turn off the leakage preventing transistor Tip, a turning-off signal is provided through the respective first gate line GL to the gate electrode of the second transistor T2 to turn off the second transistor T2, and a turning off reset control signal is provided through the respective reset control signal line rstn in the present stage to the gate electrode of the first reset transistor Tr1 to turn off the first reset transistor Tr1. Due to the presence of the leakage preventing transistor T1p is a turned-off state, a leakage current, if any, of the gate electrode of the driving transistor Td can be further reduced.

The foregoing description of the embodiments of the invention has been presented for purposes of illustration and description. It is not intended to be exhaustive ox to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chores and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in the broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with nous or element. Such terms should be understood as a nomenclature and should not be construed as giving the limitations on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of pixel driving circuits, a plurality of light emitting elements respectively connected to the plurality of pixel driving circuits, and a first connecting pad in a first signal line layer, the first connecting pad connecting the second electrode of the transistor and the second electrode of the first reset transistor;
- wherein a respective pixel driving circuit comprises a driving transistor, a storage capacitor, and a transistor having a gate electrode connected to a respective second gate line of a plurality of second gate lines, a first electrode connected to a first capacitor electrode of the storage capacitor, and a second electrode connected to a second electrode of a first reset transistor, the transistor being configured to receive a reset signal through the first reset transistor;
- an active layer of the driving transistor and an active layer of the transistor are spaced apart from each other by at least an insulating layer;
- the active layer of the driving transistor comprises a first semiconductor material; and
- the active layer of the transistor comprises a second semiconductor material different from the first semiconductor material;
- wherein the first connecting pad is connected to the second electrode of the transistor through a first via extending through at least a passivation layer, and is connected to the second electrode of the first reset transistor through a second via extending through at least the passivation layer and the insulating layer.

2. The array substrate of claim 1, wherein gate electrodes of the transistor and the first reset transistor are connected to different control signal lines in different layers, respectively.

3. The array substrate of claim 1, wherein the respective pixel driving circuit further comprises the first reset transistor comprising a gate electrode connected to a respective reset control signal line in a present stage of a plurality of reset control signal lines, a first electrode connected to a respective first reset signal line of a plurality of first reset signal lines, and a second electrode connected to the second electrode of the transistor.

4. The array substrate of claim 1, further comprising a node connecting line in the first signal line layer;
- wherein the node connecting line connects the first electrode of the transistor to the first capacitor electrode, which functions as a gate electrode of the driving transistor.

5. An array substrate, comprising a plurality of pixel driving circuits, a plurality of light emitting elements respectively connected to the plurality of pixel driving circuits, a node connecting line in the first signal line layer, and an auxiliary capacitor electrode;
- wherein a respective pixel driving circuit comprises a driving transistor, a storage capacitor, and a transistor having a gate electrode connected to a respective second gate line of a plurality of second gate lines, a first electrode connected to a first capacitor electrode of the storage capacitor, and a second electrode connected to a second electrode of a first reset transistor, the transistor being configured to receive a reset signal through the first reset transistor;
- an active layer of the driving transistor and an active layer of the transistor are spaced apart from each other by at least an insulating layer;
- the active layer of the driving transistor comprises a first semiconductor material; and
- the active layer of the transistor comprises a second semiconductor material different from the first semiconductor material;
- wherein the node connecting line connects the first electrode of the transistor to the first capacitor electrode, which functions as a gate electrode of the driving transistor;
- wherein the node connecting line is connected to the auxiliary capacitor electrode through a fifth via extending through at least a passivation layer; and
- wherein the array substrate further comprises an auxiliary capacitor comprising the auxiliary capacitor electrode and a portion of a respective first gate line of a plurality of first gate lines, the respective first gate line being connected to a gate electrode of a first transistor and a gate electrode of a second transistor.

6. The array substrate of claim 4, wherein the node connecting line crosses over the respective second gate line in a present stage.

7. An array substrate, comprising a plurality of pixel driving circuits, a plurality of light emitting elements respectively connected to the plurality of pixel driving circuits, and a node connecting line in a first signal line layer;
- wherein a respective pixel driving circuit comprises a driving transistor, a storage capacitor, and a transistor having a gate electrode connected to a respective second gate line of a plurality of second gate lines, a first electrode connected to a first capacitor electrode of the storage capacitor, and a second electrode connected to a second electrode of a first reset transistor, the transistor being configured to receive a reset signal through the first reset transistor;
- an active layer of the driving transistor and an active layer of the transistor are spaced apart from each other by at least an insulating layer;
- the active layer of the driving transistor comprises a first semiconductor material; and
- the active layer of the transistor comprises a second semiconductor material different from the first semiconductor material;
- wherein the respective second gate line comprises a first branch and a second branch respectively in two different layers;
- the first branch is in a same layer as a second capacitor electrode of the storage capacitor;
- the second branch is in a same layer as a plurality of first reset signal lines, a respective first reset signal line of the plurality of first reset signal lines is configured to provide a reset signal to the first electrode of the transistor; and
- the node connecting line crosses over the first branch and the second branch in a present stage.

8. The array substrate of claim 1, wherein the respective pixel driving circuit further comprises a second transistor comprising a gate electrode connected to a respective first gate line of a plurality of first gate lines, a first electrode connected to the second electrode of the transistor and the second electrode of the first reset transistor, and a second electrode connected to a second electrode of a driving transistor.

9. The array substrate of claim 8, wherein the respective first gate line is in a layer different from the respective second gate line; and
- the respective first gate line is in a same layer as a plurality of reset control signal lines, a respective reset control signal line in a present stage of a plurality of reset control signal lines being connected to a gate electrode of the first reset transistor.

10. The array substrate of claim 1, wherein the respective pixel driving circuit further comprises:

the first reset transistor comprising a gate electrode connected to a respective reset control signal line in a present stage of a plurality of reset control signal lines, a first electrode connected to a respective first reset signal line of a plurality of first reset signal lines, and a second electrode connected to the second electrode of the transistor; and a second reset transistor comprising a gate electrode connected to a respective reset control signal line in a next stage of a plurality of reset control signal lines, a first electrode connected to a respective second reset signal line of a plurality of second reset signal lines, and a second electrode connected to an anode of a respective light emitting element of the plurality of light emitting elements.

11. The array substrate of claim 10, wherein the plurality of first reset signal lines are in a same layer as a second branch of the respective second gate line; and the plurality of second reset signal lines are in a same layer as a first connecting pad in a first signal line layer.

12. The array substrate of claim 1, further comprising a second connecting pad in a first signal line layer, the second connecting pad connecting the first electrode of the first reset transistor and a respective first reset signal line of a plurality of first reset signal lines.

13. The array substrate of claim 1, wherein the respective pixel driving circuit further comprises a second reset transistor comprising a gate electrode connected to a respective reset control signal line in a next stage of a plurality of reset control signal lines, a first electrode connected to a respective second reset signal line of a plurality of second reset signal lines, and a second electrode connected to an anode of a respective light emitting element of the plurality of light emitting elements; and wherein the first electrode of the second reset transistor and a first electrode of a second reset transistor in an adjacent pixel driving circuit are connected to each other, forming a unitary structure, the respective pixel driving circuit and the adjacent pixel driving circuit being directly adjacent to each other and in the present stage.

14. The array substrate of claim 1, further comprising a light shield in a light shield layer and an auxiliary capacitor electrode;

wherein an orthographic projection of the light shield on a base substrate covers at least 50% of an orthographic projection of an active layer of the driving transistor on the base substrate;

the orthographic projection of the light shield on the base substrate covers at least 50% of an orthographic projection of the first capacitor electrode on the base substrate;

the storage capacitor comprises the first capacitor electrode and a second capacitor electrode;

the orthographic projection of the light shield on the base substrate covers at least 50% of an orthographic projection of the second capacitor electrode on the base substrate;

the auxiliary capacitor electrode and a portion of a respective first gate line of a plurality of first gate lines are configured to form an auxiliary capacitor, the respective first gate line being connected to a gate electrode of a first transistor and a gate electrode of a second transistor; and the orthographic projection of the light shield on the base substrate covers at least 50% of an orthographic projection of the auxiliary capacitor electrode on the base substrate.

15. The array substrate of claim 1, further comprising:
a first connecting pad in a first signal line layer, the first connecting pad connecting the second electrode of the transistor and the second electrode of the first reset transistor; and
a plurality of voltage supply lines;
wherein an orthographic projection of a respective voltage supply line of the plurality of voltage supply lines on a base substrate covers at least 50% of an orthographic projection of the first connecting pad on the base substrate.

16. The array substrate of claim 1, further comprising:
an auxiliary capacitor electrode;
a node connecting line in a first signal line layer; and
a plurality of voltage supply lines;
wherein the node connecting line is connected to the auxiliary capacitor electrode through a fifth via extending through at least the passivation layer;
the auxiliary capacitor electrode and a portion of a respective first gate line of a plurality of first gate lines are configured to form an auxiliary capacitor, the respective first gate line being connected to a gate electrode of a first transistor and a gate electrode of a second transistor; and
an orthographic projection of a respective voltage supply line of the plurality of voltage supply lines on a base substrate covers at least 50% of an orthographic projection of the auxiliary capacitor electrode on the base substrate.

17. The array substrate of claim 1, further comprising:
a plurality of voltage supply lines;
an auxiliary capacitor electrode;
a node connecting line in a first signal line layer;
a plurality of voltage supply lines; and
a first connecting pad in the first signal line layer;
wherein a first respective voltage supply line and a second respective voltage supply line respectively connected to a first pixel driving circuit and a second pixel driving circuit are connected to each other, forming a unitary structure, the first pixel driving circuit and the second pixel driving circuit being directly adjacent to each other and in the present stage;
the node connecting line connects the first electrode of the transistor to the first capacitor electrode, which functions as a gate electrode of the driving transistor;
the first connecting pad connects the second electrode of the transistor and the second electrode of the first reset transistor;
the node connecting line is connected to the auxiliary capacitor electrode through a fifth via extending through at least a passivation layer;
the auxiliary capacitor electrode and a portion of a respective first gate line of a plurality of first gate lines are configured to form an auxiliary capacitor, the respective first gate line being connected to a gate electrode of a first transistor and a gate electrode of a second transistor; and
an orthographic projection of the unitary structure on a base substrate covers at least 50% of an orthographic projection of active layers of transistors respectively of the first pixel driving circuit and the second pixel driving circuit on the base substrate, covers at least 50% of an orthographic projection of node connecting lines respectively of the first pixel driving circuit and the second pixel driving circuit on the base substrate, covers at least 50% of an orthographic projection of first connecting pads respectively of the first pixel driving circuit and the second pixel driving circuit on the base substrate, and covers at least 50% of an orthographic projection of auxiliary capacitor electrodes respectively of the first pixel driving circuit and the second pixel driving circuit on the base substrate.

18. A display apparatus, comprising the array substrate of claim 1, and an integrated circuit connected to the array substrate.

* * * * *